US007558934B2

(12) United States Patent
Kondo et al.

(10) Patent No.: US 7,558,934 B2
(45) Date of Patent: Jul. 7, 2009

(54) DATA STORAGE UNIT, DATA STORAGE CONTROLLING APPARATUS AND METHOD, AND DATA STORAGE CONTROLLING PROGRAM

(75) Inventors: Tetsujiro Kondo, Tokyo (JP); Kenji Takahashi, Kanagawa (JP); Hiroshi Sato, Tokyo (JP); Tsutomu Ichikawa, Kanagawa (JP); Hiroki Tetsukawa, Kanagawa (JP); Masaki Handa, Kanagawa (JP)

(73) Assignee: Sony Corporation, Tokyo (JP)

( * ) Notice: Subject to any disclaimer, the term of this patent is extended or adjusted under 35 U.S.C. 154(b) by 485 days.

(21) Appl. No.: 11/029,226

(22) Filed: Jan. 4, 2005

(65) Prior Publication Data

US 2005/0180221 A1    Aug. 18, 2005

(30) Foreign Application Priority Data

| Jan. 5, 2004 | (JP) | ............................. 2004-000571 |
| Jan. 5, 2004 | (JP) | ............................. 2004-000572 |
| Mar. 15, 2004 | (JP) | ............................. 2004-073407 |

(51) Int. Cl.
G06F 12/00    (2006.01)
G06F 12/02    (2006.01)

(52) U.S. Cl. ........................... 711/168; 711/5; 711/150; 711/163; 711/167

(58) Field of Classification Search ........................ None
See application file for complete search history.

(56) References Cited

U.S. PATENT DOCUMENTS 6,181,632 B1* 1/2001 Kondo et al. ........... 365/230.03
6,311,258 B1* 10/2001 Gibson et al. ................ 711/200
6,636,951 B1* 10/2003 Tachikawa .................. 711/154

OTHER PUBLICATIONS

Patent Abstracts of Japan, Publication No. 08-331363, Publication Date Dec. 13, 1996.
Patent Abstracts of Japan, Publication No. 09-069155, Publication Date Mar. 11, 1997.
Patent Abstracts of Japan, Publication No. 2003-203236, Publication Date Jul. 18, 2003.

* cited by examiner

*Primary Examiner*—Sanjiv Shah
*Assistant Examiner*—Midys Rojas
(74) *Attorney, Agent, or Firm*—Frommer Lawrence & Haug LLP; William S. Frommer

(57) ABSTRACT

A data storage unit is provided in which all data are stored into a memory including a plurality of memory banks and a plurality of desired data is read simultaneously, without any load to the hardware. It includes a memory controlling means including a data storage controller (20), data read controller 30 and data move controller (40), for judging, based on an access pattern representing a plurality of desired data to be read simultaneously when storing data sequentially into the memory with the data being divided among the plurality of memory banks of the memory, whether the data going to be stored are ones at locations corresponding to the access pattern, and storing all data at the locations corresponding to the access pattern into different memory banks by skipping a memory bank in which the data is to be stored, by incrementing its address, when the data to be read simultaneously are ones at the locations corresponding to the access pattern, and storing data at the locations corresponding to the access pattern into the memory bank having the bank address thereof incremented. The memory controlling means provides a control to read a plurality of desired data simultaneously from a memory (10).

5 Claims, 57 Drawing Sheets

FIG.4B Memory bank 0

FIG.4C Memory bank 1

FIG.4D Memory bank 2

FIG.4E Memory bank 3

FIG.4F Memory bank 4

FIG.5B Memory bank 0

FIG.5C Memory bank 1

FIG.5D Memory bank 2

FIG.5E Memory bank 3

FIG.5F Memory bank 4

Pixels to be saved doubly

Read, and write at other addresses

Pixels to be saved doubly

Read, and write at other addresses
Memory bank 0

1 2 3 4 5 6 7 8 9 10 11 12

Memory bank 1

1 2 3 4 5 6 7 8 9 10 11 12

Memory bank 2

1 2 3 4 5 6 7 8 9 10 11 12

Memory bank 3

1 2 3 4 5 6 7 8 9 10 11 12

Memory bank 4

1 2 3 4 5 6 7 8 9 10 11 12

Read pixels to be saved doubly and write them into same double-save area

Read pixels to be saved doubly
and write them into same double-save area

Memory bank 0

Memory bank 1

Memory bank 2

Memory bank 3

Memory bank 4

After access of pixels at double-save destination, return them to original word line { Ref. area: 8
No. of ref. data: 3
No. of memory banks: 4 }

Example of ref. data distribution

↓ Step 1: Quarter, and position vertically

↓ Step 2: Measure number of data

↓ Step 3: Judge (which one?)

NO ──────► To next judge

YES ↓
Storage pattern A

{ Ref. area: 8
No. of ref. data: 3
No. of memory banks: 4 }

Example of ref. data distribution

Step 1: Bisect, and position vertically

Step 2: Measure number of data

Step 3: Judge (in any two successive?)

NO → Storage pattern D

YES ▼

Storage pattern C

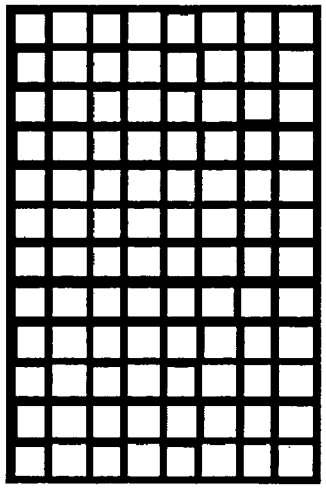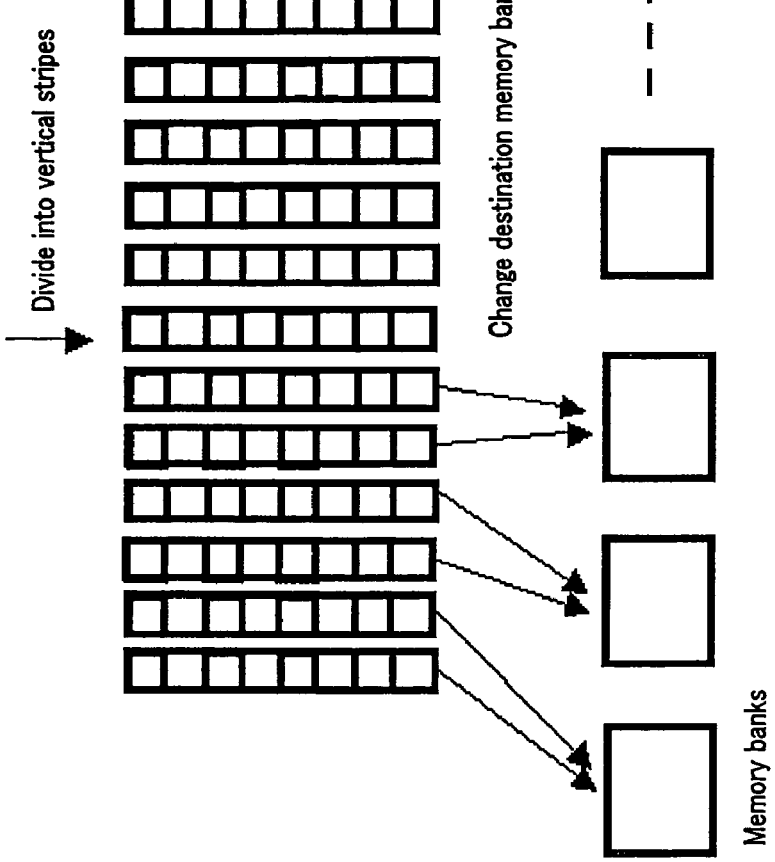
FIG.57A FIG.57B FIG.57C

DATA STORAGE UNIT, DATA STORAGE CONTROLLING APPARATUS AND METHOD, AND DATA STORAGE CONTROLLING PROGRAM

BACKGROUND OF THE INVENTION

1. Field of the Invention

The present invention relates to a data storage unit, data storage controlling apparatus and method, and a data storage controlling program, capable of storing all data into a memory including a plurality of memory banks and reading a plurality of desired data simultaneously from the memory.

2. Description of the Related Art

FIG. 1 shows a conventional semiconductor memory MY including memory cells MC, word lines WL and bit lines BL and configured so that a memory cell MC will be accessed by specifying a word line WL and bit line BL defining together the memory cell MC and data be read from a memory cell MC in a position where one word line and one bit line, both activated, intersect each other.

In the semiconductor memory configured as above, the same bit line is shared by data on a plurality of word lines. Therefore, since data appearing on the bit line when different word lines WL1 and WL2 are specified will be destroyed as shown in FIG. 2, data on different word lines cannot be accessed simultaneously.

Also, data can be read simultaneously from independent memory banks. By dividing a memory into banks BK1 to BKn as shown in FIGS. 3A and 3B and assigning different addresses to the respective banks, data on a plurality of word lines can be accessed simultaneously. However, data on different word lines in a bank cannot be accessed simultaneously. That is, it is data having been stored from each bank onto the same word line, not any data having been stored on different word lines in the same bank, that can be read simultaneously.

Note that the "bank" referred to herein means a memory unit included in a memory including a plurality of word lines and a plurality of bit lines and whose word line address can be controlled independently.

Conventionally, pattern recognition or the like, for example, is made of image data by recognizing a specific data array included in input data.

The semiconductor memory includes, for example, a buffer memory capable of storing several lines of image data and outputting data in units of a pixel, a data processor including a plurality of processor elements capable of processing data having a width of several bits and which can process data in parallel by the plurality of processor elements, and a control information memory to store matching reference data and control data. Each of the processor elements in the data processor converts a group of image data having the form of a matrix of mainly self-assigned pixels of interest in image data output from the buffer memory, by binarizing the image data group with a threshold, into object data each having a serial-array bit width the processor element can process, and judges if the object data coincides with reference data existent in the same form in the control information memory (cf. Japanese Patent Application Laid Open No. 2003-203236).

It is assumed for example that for raster scan of patterns included in an image and which are to be accessed simultaneously starting at the upper left, a memory is divided into five banks correspondingly to the number of simultaneous accesses, thereby positioning the data as shown in FIGS. 4A to 4F. In this case, the data can initially be accessed simultaneously about five times. However, when the patterns to simultaneously be accessed are positioned as shown in FIGS. 5A to 5F, a plurality of word lines will be accessed in a bank 0 so that no simultaneous access will be possible. For simultaneous access to the data, the latter has to be stored either into another bank or onto the same word line. Some patterns can be accessed simultaneously by selection of appropriate storage locations. For simultaneous access to such patterns, however, the memory has to be divided into so many banks that one of the banks is formed from only one word line.

Also, extraction of a character or pattern from image data will be described as an example of the image data pattern recognition. The character extraction can be made in various manners, but detection of a "T" pattern as shown in FIG. 6 will be explained herebelow as a simple example.

It is assumed here that the image data are stored in a semiconductor memory. To detect the "T" pattern shown in FIG. 6, six data D1 to D6 assigned thereto are read from a semiconductor memory MY. When the read data D1, D2, D3 and D5 are in black while data D4 and D6 are in white, it can be determined that the image data include a hollow "T" pattern. On the contrary, when the data D1, D2, D3 and D5 are in white while the data D4 and D6 are in black, it can be determined that the image data includes a hollow "T" pattern.

If it is unknown where a desired character or pattern exists in the image data, it is necessary to scan over the entire image data, namely, read necessary data sequentially from the semiconductor memory, as shown in FIG. 7, in order to extract the desired character.

Also, for extraction of different characters, it is necessary to select another set of pixel data simultaneously for reading and comparison.

Thus, for extraction of a character or pattern, it is necessary to simultaneously read a plurality of desired data meeting a purpose from image data stored in the semiconductor memory.

Because of the mechanism of the semiconductor memory, however, data recorded on different word lines in the same bank cannot be read simultaneously from the semiconductor memory.

In case necessary data D1 to D3 and data D4 to D6 are stored on the different lines WL1 and WL2, respectively, in the same bank as shown in FIG. 8 for example, the data D1 to D6 cannot be read simultaneously.

FIGS. 9A and 9B show data distribution in an image and in a memory, respectively. As will be known from FIGS. 9A and 9B, a character or pattern can be read simultaneously from the semiconductor memory in one case but cannot in any other case, which depends upon the position of a reference area.

Therefore, even a conventional semiconductor memory has to be divided into a larger number of banks.

However, when the reference area has a size of five by five pixels, for example, as shown in FIG. 10, the required number of memory banks is twenty five (25). The larger the number of banks, the more difficult it is to manage so large a number of banks, which will add to the number of address lines and to the chip area, and lead to an increased power consumption or any other problems.

That is to say, since different addresses have to be assigned to such banks, the semiconductor memory will need a larger-capacity address bus.

Also, the chip area will be larger since as many decoders and selectors are required as the banks.

Further, simultaneous operation of the plurality of banks will lead to a larger power consumption.

Furthermore, the larger the number of data on one word line, the longer the word line will have to be and the longer time access to data on the one word line will take.

In the conventional semiconductor memory, configuration with one word line in one bank will allow simultaneous reading of data. However, this configuration is not practical because the hardware will be applied with a larger load when an extremely larger amount of data has to be stored.

On this account, in the conventional semiconductor memory, a buffer memory and cache memory to provisionally store data read from the semiconductor memory are provided to time-share a plurality of desired data a plurality of times, provisionally store them in the buffer memory and cache memory, and then read the data from the latter.

However, when the number of desired data is larger and data input/output speed is higher, data will be read more slowly. To solve this problem, it has been proposed to provide a buffer memory and cache memory in order to provisionally hold the data. Even with this technique, however, a larger area occupied by such buffer and cache memories will lead to a larger load to the hardware.

OBJECT AND SUMMARY OF THE INVENTION

It is therefore an object of the present invention to overcome the above-mentioned drawbacks of the related art by providing a data storage unit, data storage controlling apparatus and method, and a data storage controlling program, for storing all data in a memory including a plurality of memory banks and reading a plurality of desired data simultaneously without any load to the hardware.

It is another object of the present invention to provide a data storage unit, data storage controlling apparatus and method, and a data storage controlling program, in which an appropriate data storage method is selected correspondingly to distribution of data to be read simultaneously to permit reading of a plurality of data at arbitrary locations simultaneously from a group of one- or two-dimensionally arrayed data without any increased number of banks as well as with prevention of conflict between data accesses, that is, simultaneous accesses to different word lines in the same bank.

These objects and other objects, features and advantages of the present invention will become more apparent from the following detailed description of the embodiments of the present invention.

The above object can be attained by providing a data storage unit including according to the present invention:

a memory including a plurality of memory banks;

a judging means for judging, based on an access pattern representing a plurality of desired data to be read simultaneously when storing data sequentially into the memory with the data being divided among the plurality of memory banks of the memory, whether the data going to be stored are ones at locations corresponding to the access patterns; and a memory controlling means for storing all data at the locations corresponding to the access pattern into different memory banks by skipping a memory bank in which the data are to be stored, by incrementing its address, when the data to be read simultaneously are ones at the locations corresponding to the access pattern, and storing data at the locations corresponding to the access pattern into the memory bank having the bank address thereof incremented.

Also the above object can be attained by providing a data storage controller which stores data into a memory including a plurality of memory banks and reads a plurality of desired data simultaneously from the memory, the apparatus including according to the present invention including:

a judging means for judging, based on an access pattern representing a plurality of desired data to be read simultaneously when storing data sequentially into the memory with the data being divided among the plurality of memory banks of the memory, whether the data going to be stored are ones at locations corresponding to the access pattern; and a memory controlling means for storing all data at the locations corresponding to the access pattern into different memory banks by skipping a memory bank in which the data are to be stored, by incrementing its address, when the data to be read simultaneously are ones at the locations corresponding to the access pattern, and storing data at the locations corresponding to the access pattern into the memory bank having the bank address thereof incremented.

Also the above object can be attained by providing a data storage controlling method in which data are stored into a memory including a plurality of memory banks and a plurality of desired data is read simultaneously from the memory, the method including, according to the present invention, the steps of:

judging, based on an access pattern representing a plurality of desired data to be read simultaneously when storing data sequentially into the memory with the data being divided among the plurality of memory banks of the memory, whether the data going to be stored are ones at locations corresponding to the access pattern; and storing all data at the locations corresponding to the access pattern into different memory banks by skipping a memory bank in which the data is to be stored, by incrementing its address, when the data to be read simultaneously are ones at the locations corresponding to the access pattern, and storing data at the locations corresponding to the access pattern into the memory bank having the bank address thereof incremented.

Also the above object can be attained by providing a data storage controlling program executable by a computer to store data into a memory including a plurality of memory banks and read a plurality of desired data simultaneously from the memory, the program including, according to the present invention, the steps of:

judging, based on an access pattern representing a plurality of desired data to be read simultaneously when storing data sequentially into the memory with the data being divided among the plurality of memory banks of the memory, whether the data going to be stored are ones at locations corresponding to the access pattern; and storing all data at the locations corresponding to the access pattern into different memory banks by skipping a memory bank in which the data is to be stored, by incrementing its address, when the data to be read simultaneously are ones at the locations corresponding to the access pattern, and storing data at the locations corresponding to the access pattern into the memory bank having the bank address thereof incremented.

Also the above object can be attained by providing a data storage unit including according to he present invention:

a memory including a plurality of memory banks;

a judging unit configured to judge, based on an access pattern representing a plurality of desired data to be read simultaneously when storing data sequentially into the memory with the data being divided among the plurality of memory banks of the memory, whether the data going to be stored are ones at locations corresponding to the access pattern; and a memory controlling unit configured to store all data at the locations corresponding to the access pattern into different memory banks by skipping a memory bank in which the data is to be stored, by incrementing its address, when the data to be read simultaneously are ones at the locations corresponding to the access pattern, and store data at the locations corresponding to the access pattern into the memory bank having the bank address thereof incremented.

Also the above object can be attained by providing a data storage unit including according to the present invention:

a memory including a plurality of memory banks;

a data storage controlling means for sequentially dividing, when storing data into the memory, the data among word lines in the memory banks included in the memory on the basis of a storing range for a smaller number of data than the number of data storable on one word line; and a data read controlling means for identifying, based on an access pattern representing a plurality of desired data to be read simultaneously, data on different word lines, not simultaneously accessible, in the same memory bank of the memory and which are to be read simultaneously, reading the data thus identified and which are to be read simultaneously from the memory bank, storing the read data doubly at locations in the same memory bank, which are accessible simultaneously, and reading a plurality of desired data simultaneously from the memory.

Also the above object can be attained by providing a data storage controller which stores data into a memory including a plurality of memory banks and reads a plurality of desired data simultaneously from the memory, the apparatus including according to the present invention:

a data storage controlling means for sequentially dividing, when storing data into a memory including the plurality of memory banks, the data among word lines in the memory banks included in the memory on the basis of a storing range for a smaller number of data than the number of data storable on one word line; and a data read controlling means for identifying, based on an access pattern representing a plurality of desired data to be read simultaneously, data on different word lines, not simultaneously accessible, in the same memory bank of the memory and which are to be read simultaneously, reading the data thus identified and which are to be read simultaneously from the memory bank, and storing the read data doubly at locations in the same memory bank, which are accessible simultaneously, and reading a plurality of desired data simultaneously from the memory.

Also the above object can be attained by providing a data storage controlling method in which data are stored into a memory including a plurality of memory banks and a plurality of desired data is read simultaneously from the memory, the method including, according to the present invention, the steps of:

sequentially dividing, when storing data into a memory including the plurality of memory banks, the data among word lines in the memory banks included in the memory on the basis of a storing range for a smaller number of data than the number of data storable on one word line; and identifying, based on an access pattern representing a plurality of desired data to be read simultaneously, data on different word lines, not simultaneously accessible, in the same memory bank of the memory and which are to be read simultaneously, reading the data thus identified and which are to be read simultaneously from the memory bank, and storing the read data doubly at locations in the same memory bank, which are accessible simultaneously; and reading a plurality of desired data simultaneously from the memory.

Also the above object can be attained by providing a data storage controlling program executable by a computer to store data into a memory including a plurality of memory banks and read a plurality of desired data simultaneously from the memory, the program including, according to the present invention, the steps of:

sequentially dividing, when storing data into a memory including the plurality of memory banks, the data among word lines in the memory banks included in the memory on the basis of a storing range for a smaller number of data than the number of data storable on one word line; and identifying, based on an access pattern representing a plurality of desired data to be read simultaneously, data on different word lines, not simultaneously accessible, in the same memory bank of the memory and which are to be read simultaneously;

reading the data thus identified and which are to be read simultaneously from the memory bank, and storing the read data doubly at locations in the same memory bank, which are accessible simultaneously; and reading a plurality of desired data simultaneously from the memory.

Also the above object can be attained by providing a data storage unit including according to the present invention:

a memory including a plurality of memory banks;

a data storage control unit configured to sequentially divide, when storing data into the memory, the data among word lines in the memory banks included in the memory on the basis of a storing range for a smaller number of data than the number of data storable on one word line; and a data read control unit configured to identify, based on an access pattern representing a plurality of desired data to be read simultaneously, data on different word lines, not simultaneously accessible, in the same memory bank of the memory and which are to be read simultaneously, read the data thus identified and which are to be read simultaneously from the memory bank, store the read data doubly at locations in the same memory bank, which are accessible simultaneously, and read a plurality of desired data simultaneously from the memory.

Also the above object can be attained by providing a data storage unit including according to the present invention:

a memory including a plurality of memory banks;

a reordering judging means for judging, based on a detection pattern, a reorder rule for a plurality of desired data to be read simultaneously; and a memory controlling means for controlling data write/read to/from the memory, the memory controlling means determining, when storing data into the memory including the plurality of memory banks, a storage pattern according to a reorder rule judged by the reordering judging means under a judging condition that a reference area should have a size $\underline{n}$ and division, by 2x (x is a positive integer) smaller and n/2, of the relative position of data to be read simultaneously should result in successive (x−1) kinds of remainders, and changing the sequence of storage into each bank of the memory according to a storage pattern corresponding to the distribution of the data to be read simultaneously, thereby storing the data to be read simultaneously into different banks, respectively.

Also the above object can be attained by providing a data storage controller including according to the present invention:

a memory controlling means for controlling data write/read to/from a memory including a plurality of memory banks; and a reordering judging means for judging, based on a detection pattern, a reorder rule for a plurality of desired data to be read simultaneously, the memory controlling means determining, when storing data into the memory including the plurality of memory banks, a storage pattern according to a reorder rule judged by the reordering judging means under a judging condition that a reference area should have a size n and division, by 2x (x is a positive integer) smaller and n/2, of the relative position of data to be read simultaneously should result in successive (x−1) kinds of remainders, and changing the sequence of storage into each bank of the memory according to a storage pattern corresponding to the distribution of the data to be read simultaneously, thereby storing the data to be read simultaneously into different banks, respectively.

Also the above object can be attained by providing a data storage controlling method including, according to the present invention, the steps of:

determining, when storing data into the memory including the plurality of memory banks, a storage pattern according to a reorder rule judged by the reordering judging means under a judging condition that a reference area should have a size n and division, by 2x (x is a positive integer) smaller and n/2, of the relative position of data to be read simultaneously should result in successive (x−1) kinds of remainders; and changing the sequence of storage into each bank of the memory according to a storage pattern corresponding to the distribution of the data to be read simultaneously, thereby storing the data to be read simultaneously into different banks, respectively.

Also the above object can be attained by providing a data storage controlling program executable by a computer to store data into a memory including a plurality of memory banks by reordering the data into a state in which a plurality of desired data can be read simultaneously from the memory, the program including, according to the present invention, the steps of:

determining, when storing data into the memory including the plurality of memory banks, a storage pattern according to a reorder rule judged by the reordering judging means under a judging condition that a reference area should have a size n and division, by 2x (x is a positive integer) smaller and n/2, of the relative position of data to be read simultaneously should result in successive (x−1) kinds of remainders; and changing the sequence of storage into each bank of the memory according to a storage pattern corresponding to the distribution of the data to be read simultaneously, thereby storing the data to be read simultaneously into different banks, respectively.

Also the above object can be attained by providing a data storage unit including according to the present invention:

a memory including a plurality of memory banks;

a reordering judging unit configured to judge, based on a detection pattern, a reorder rule for a plurality of desired data to be read simultaneously; and a memory control unit configured to control data write/read to/from the memory, the memory control unit determining, when storing data into the memory including the plurality of memory banks, a storage pattern according to a reorder rule judged by the reordering judging means under a judging condition that a reference area should have a size n and division, by 2x (x is a positive integer) smaller and n/2, of the relative position of data to be read simultaneously should result in successive (x−1) kinds of remainders, and changing the sequence of storage into each bank of the memory according to a storage pattern corresponding to the distribution of the data to be read simultaneously, thereby storing the data to be read simultaneously into different banks, respectively.

BRIEF DESCRIPTION OF THE DRAWINGS

FIGS. 4A to 4F schematically illustrate a state of data storage in the semiconductor memory, in which an image includes patterns corresponding to a plurality of pixels to simultaneously be accessed and raster scan is made of the patterns starting at the upper left;

FIGS. 5A to 5F schematically illustrate states of the semiconductor memory, in which no simultaneous access is possible;

FIGS. 57A to 57C schematically illustrate a method of storing data distributed two-dimensionally.

DETAILED DESCRIPTION OF THE PREFERRED EMBODIMENTS

In the following, the present invention will be described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

Figure 1:
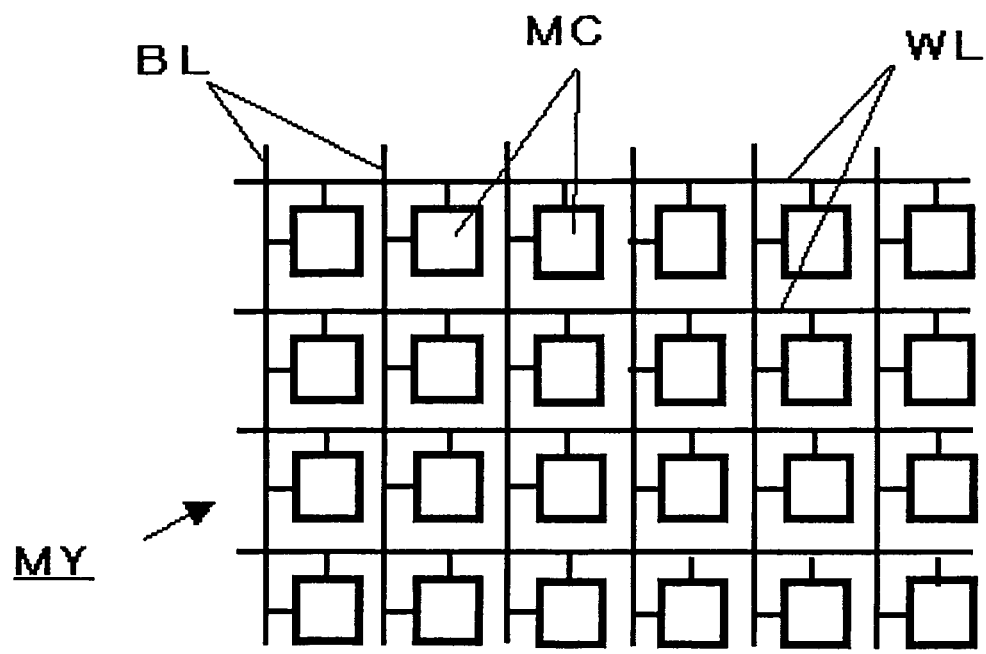
FIG. 1 is a schematic illustration of the configuration of a conventional semiconductor memory.
Figure 2:
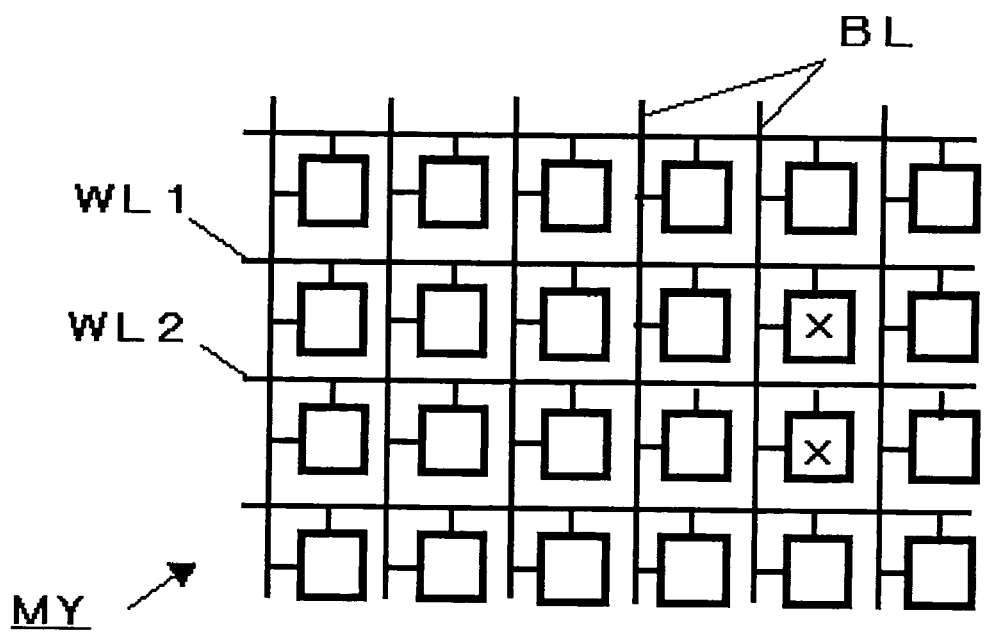
FIG. 2 is a schematic illustration of a state of the semiconductor memory, in which data cannot be accessed simultaneously.
Figures 3A, 3B:
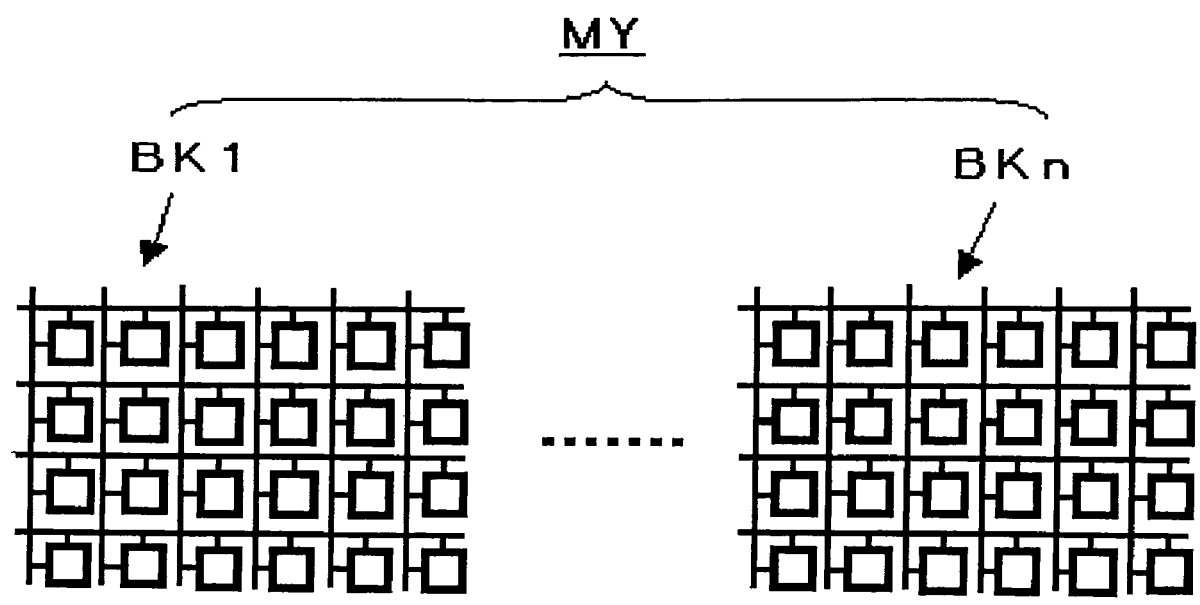
FIGS. 3A and 3B show a memory configuration including a plurality of memory banks.
Figure 4A:
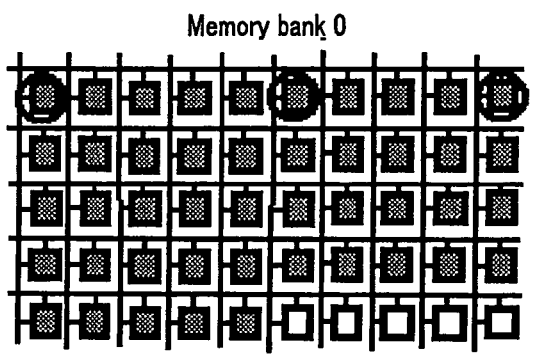
Figure 4A:
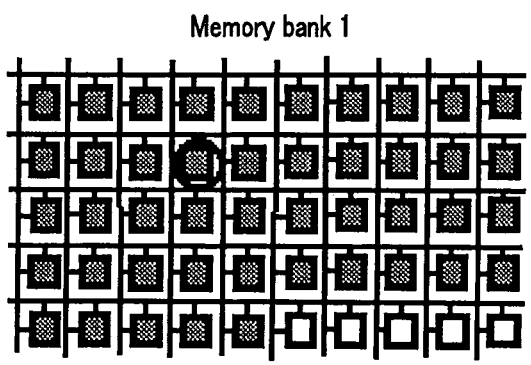
Figure 4A:
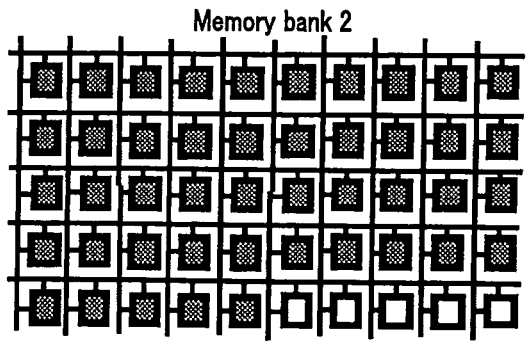
Figure 4A:
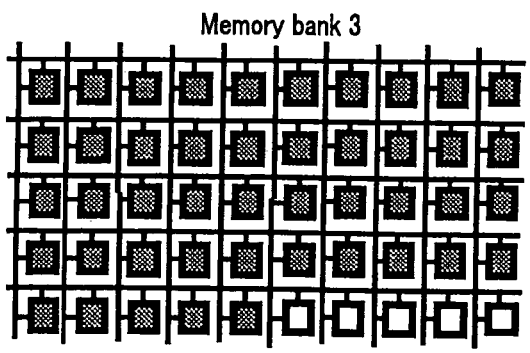
Figure 4A:
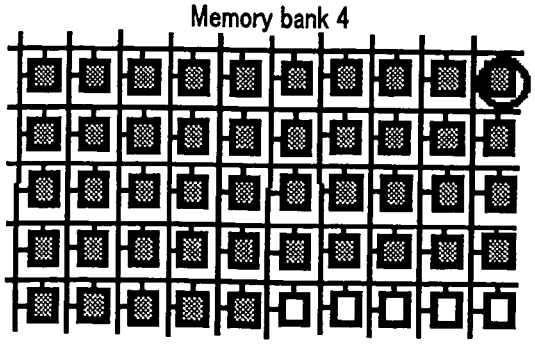
Figure 5A:
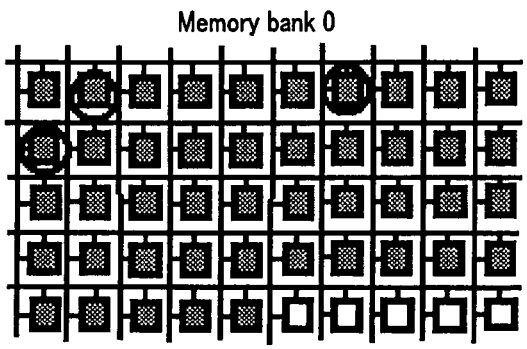
Figure 5A:
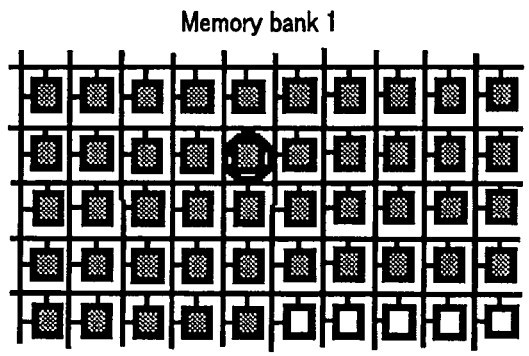
Figure 5A:
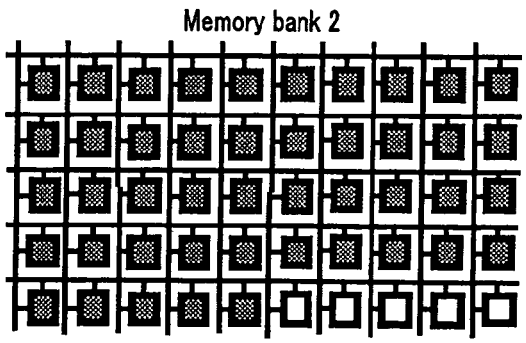
Figure 5A:
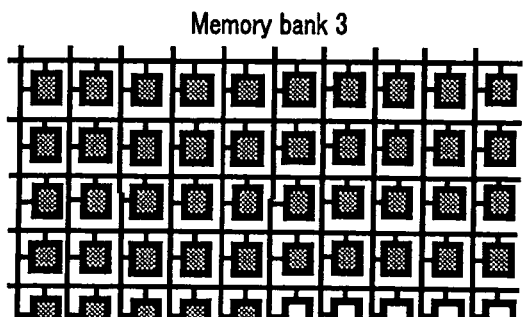
Figure 5A:
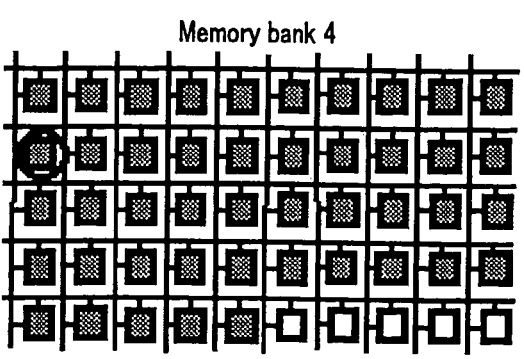
Figure 6:
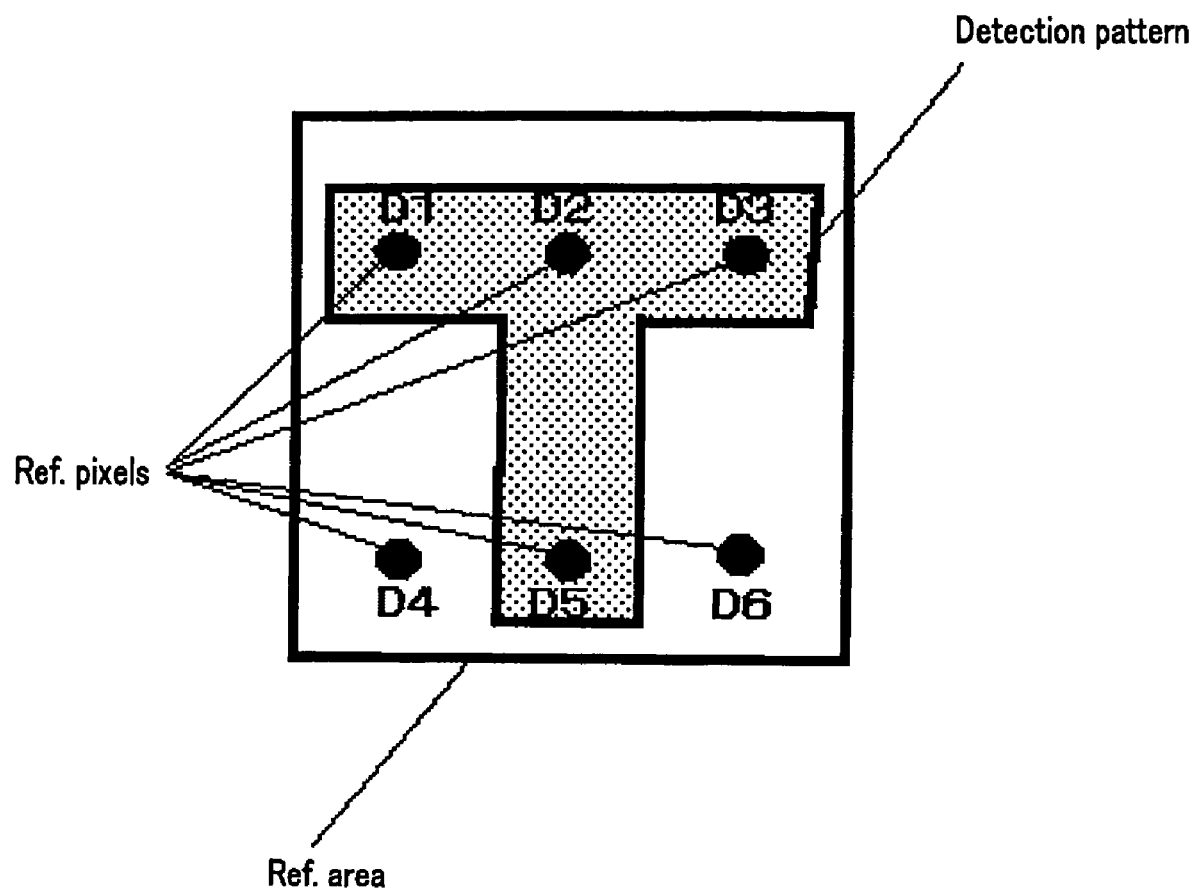
FIG. 6 is a schematic illustration of a "T" pattern detected in image data, as an example of pattern recognition of the image data.
Figure 7:
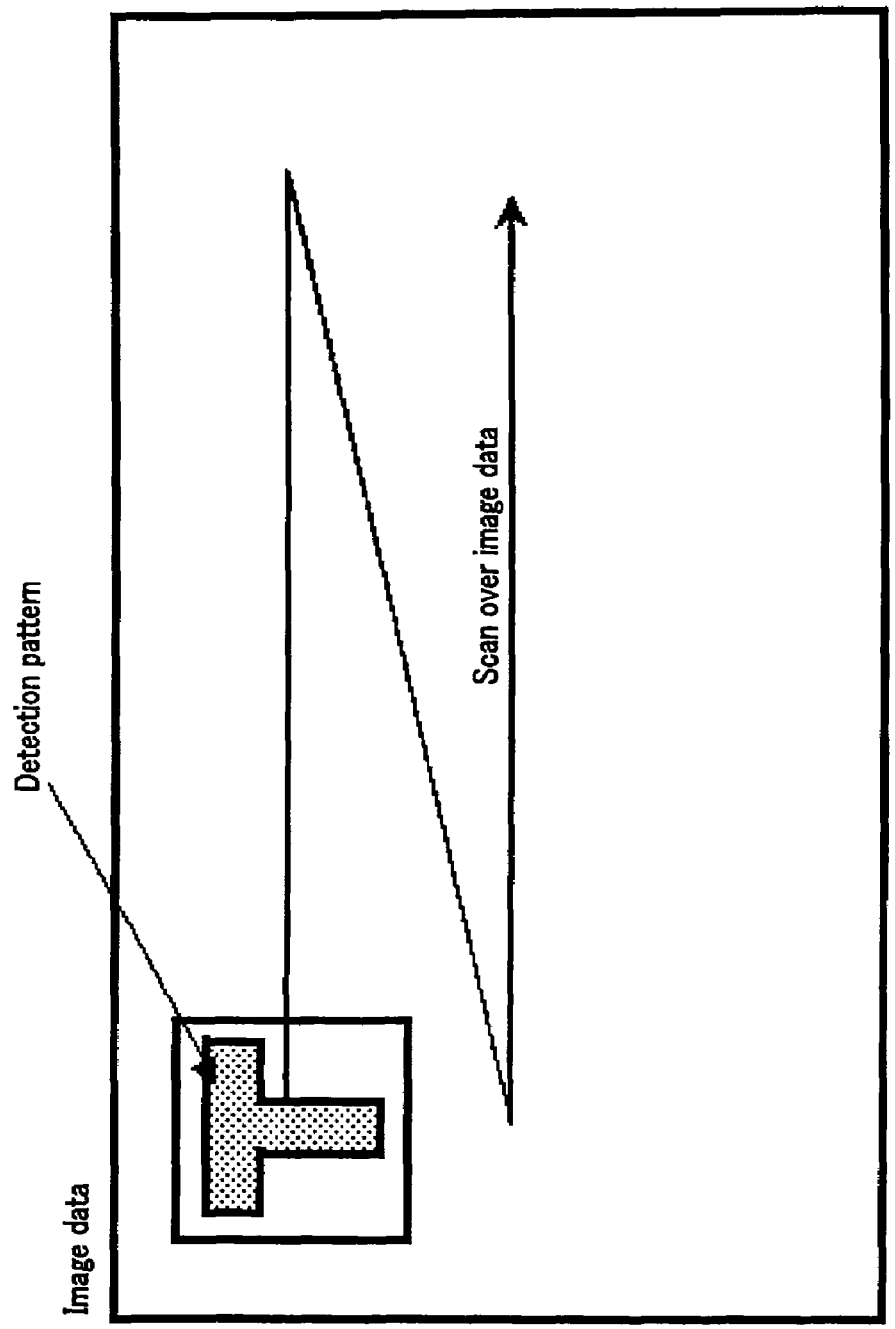
FIG. 7 is a schematic illustration of a state of the semiconductor memory, in which scan is being made over all image data to extract a desired character or pattern in case it is unknown where the object character or pattern exists in the image data.
Figure 8:
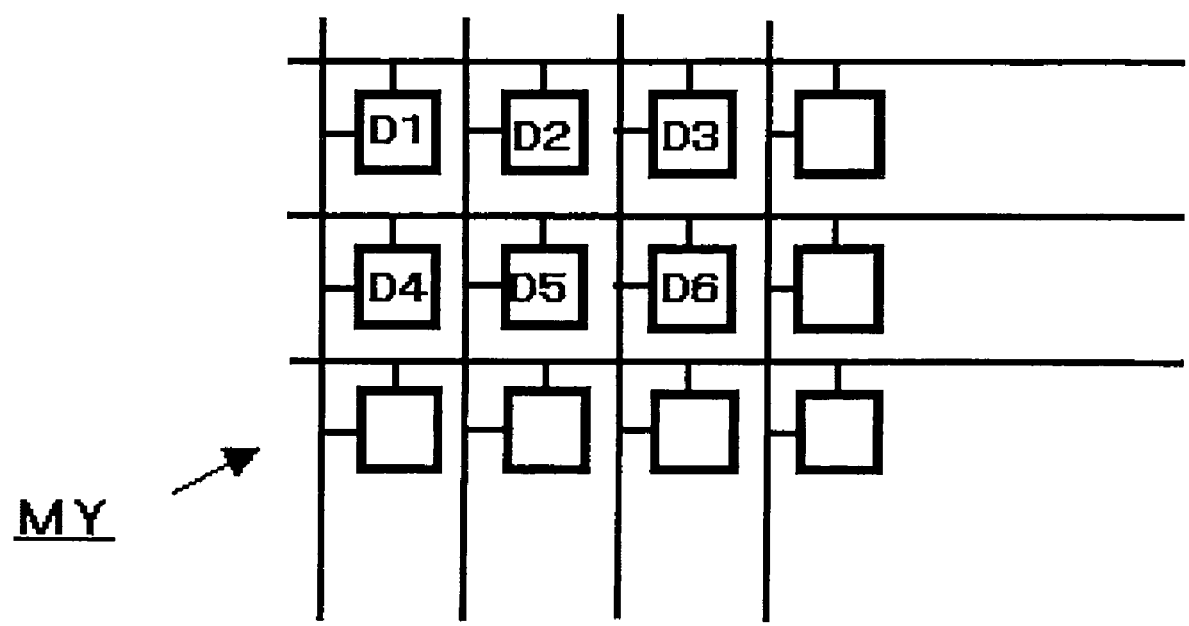
FIG. 8 is a schematic illustration of a state of the semiconductor memory, in which data are stored on different word lines included in the same memory bank and from which the data cannot be read simultaneously.
Figure 9A:
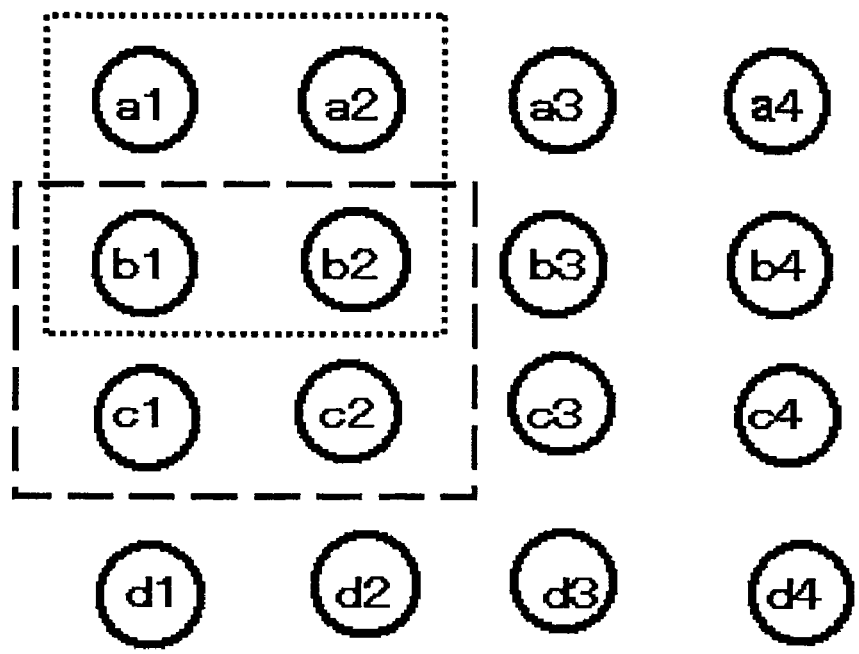
FIGS. 9A and 9B schematically illustrate data distribution in an image and memory, respectively, in which even the same character or pattern to be extracted cannot be read simultaneously from the semiconductor memory depending upon its location in a reference area.
Figure 9B:
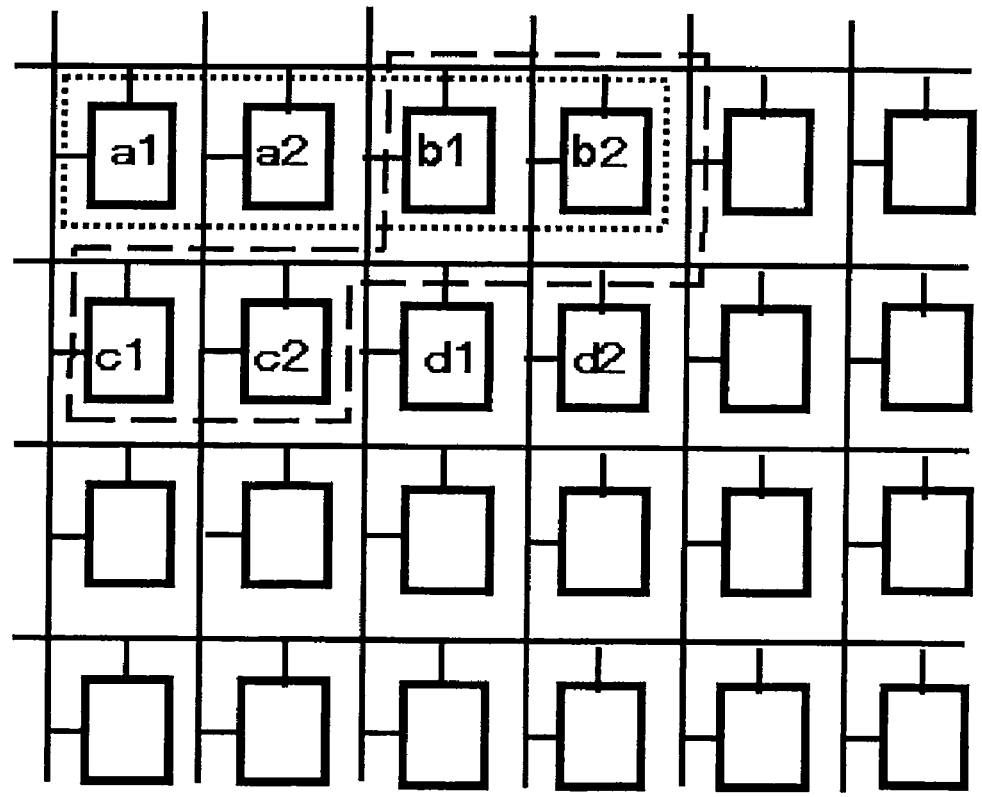
Figure 10:
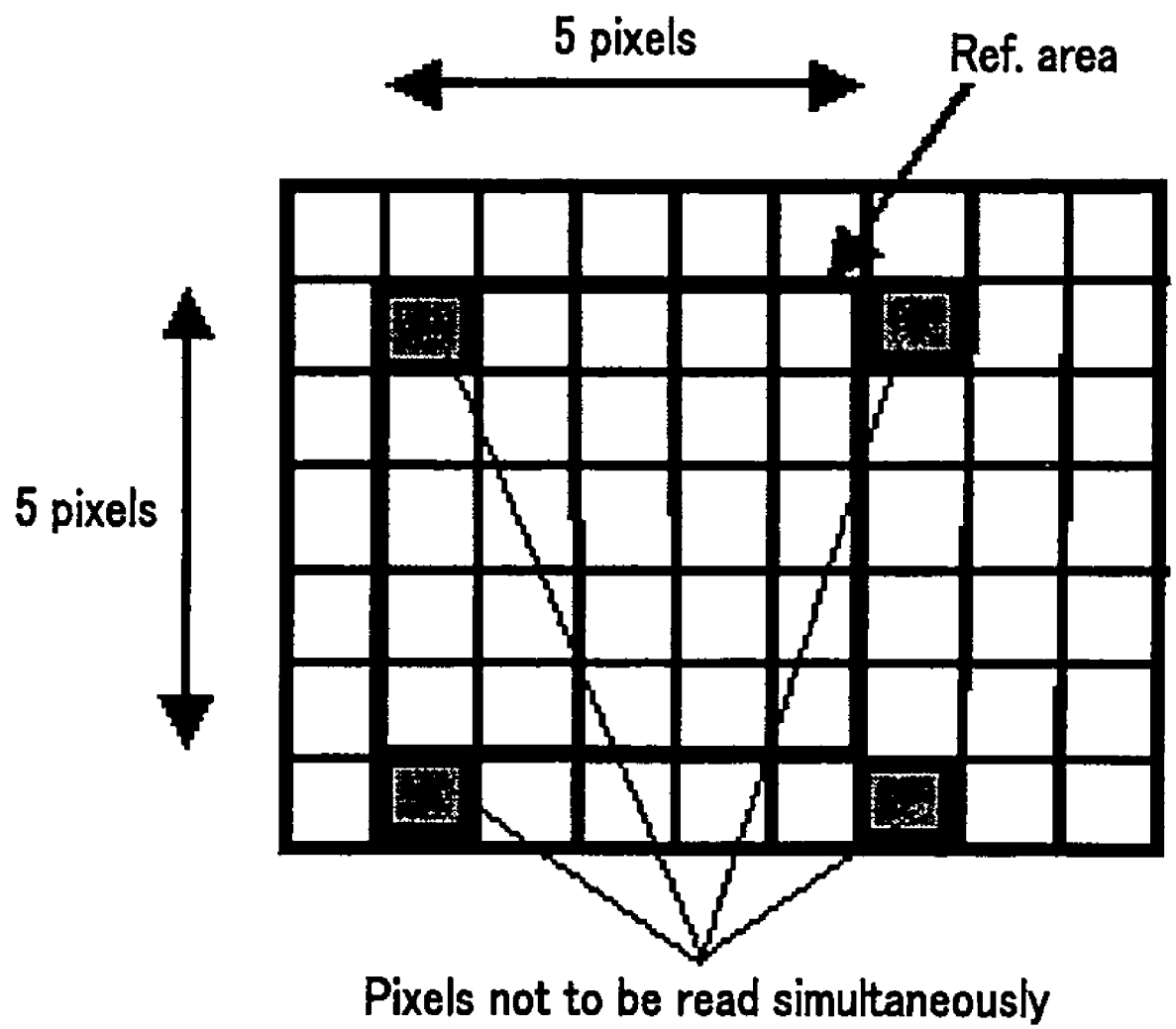
FIG. 10 is a schematic illustration of a state of the semiconductor memory, in which simultaneous access is made possible by increasing the number of memory banks so that simultaneous access is possible to inside the reference area.
Figure 11:
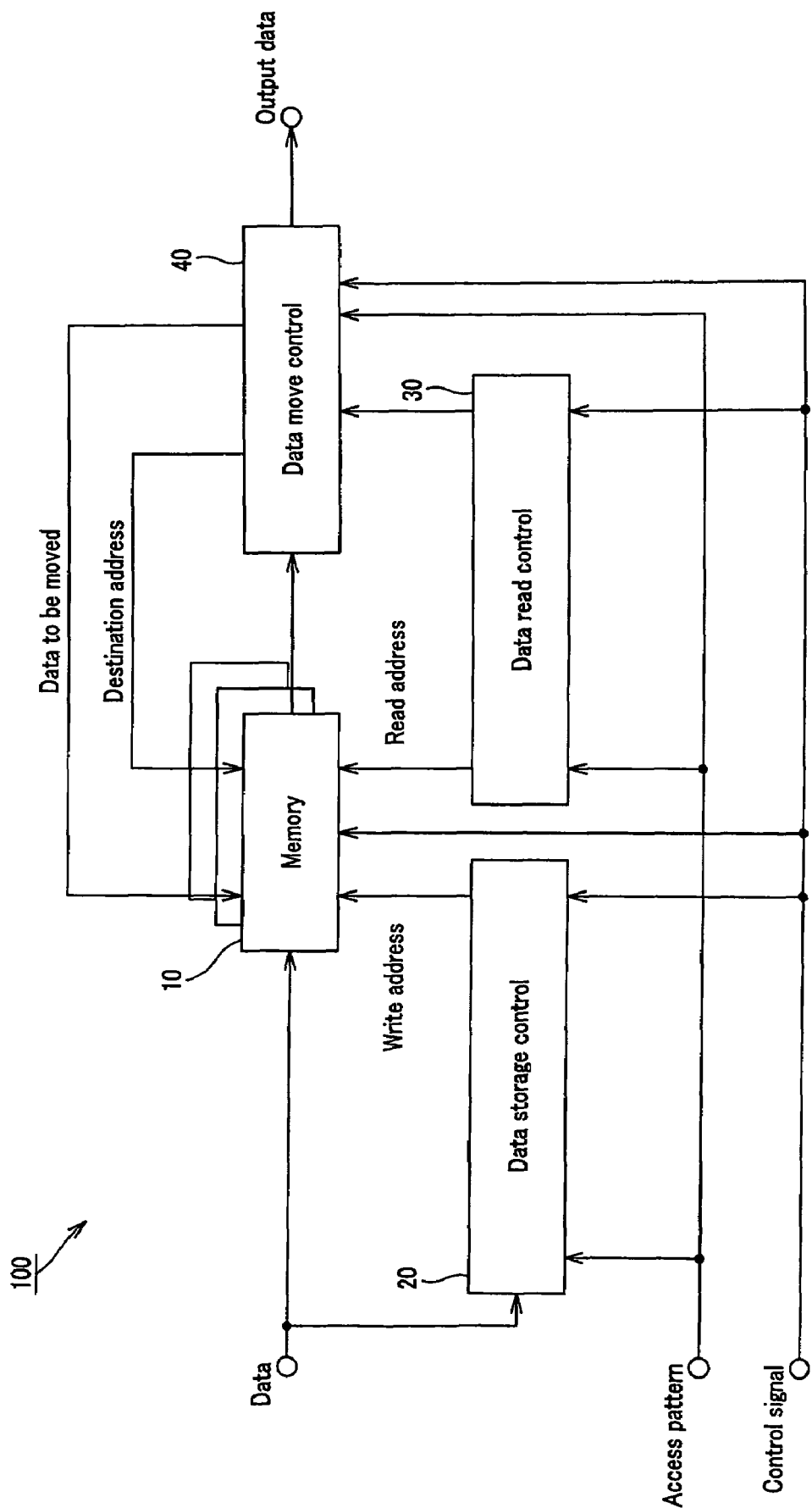
FIG. 11 is a block diagram of one embodiment of the data storage unit according to the present invention.

The present invention will be described in detail below concerning one embodiment of the data storage unit, generally indicated with a reference numeral 100 as shown in FIG. 11 for example.

The data storage unit 100 includes a memory 10 consisting of a plurality of banks, a data storage controller 20 to store data into the memory 10, a data read controller 30 to read data from the memory 10, and a data move controller 40 to control the movement of the data in the memory 10. Data to be stored is supplied to the memory 10 and data storage controller 20, while an access pattern representing a plurality of data to simultaneously be read is supplied to the data storage controller 20, data read controller 30 and data move controller 40.

Figure 12:
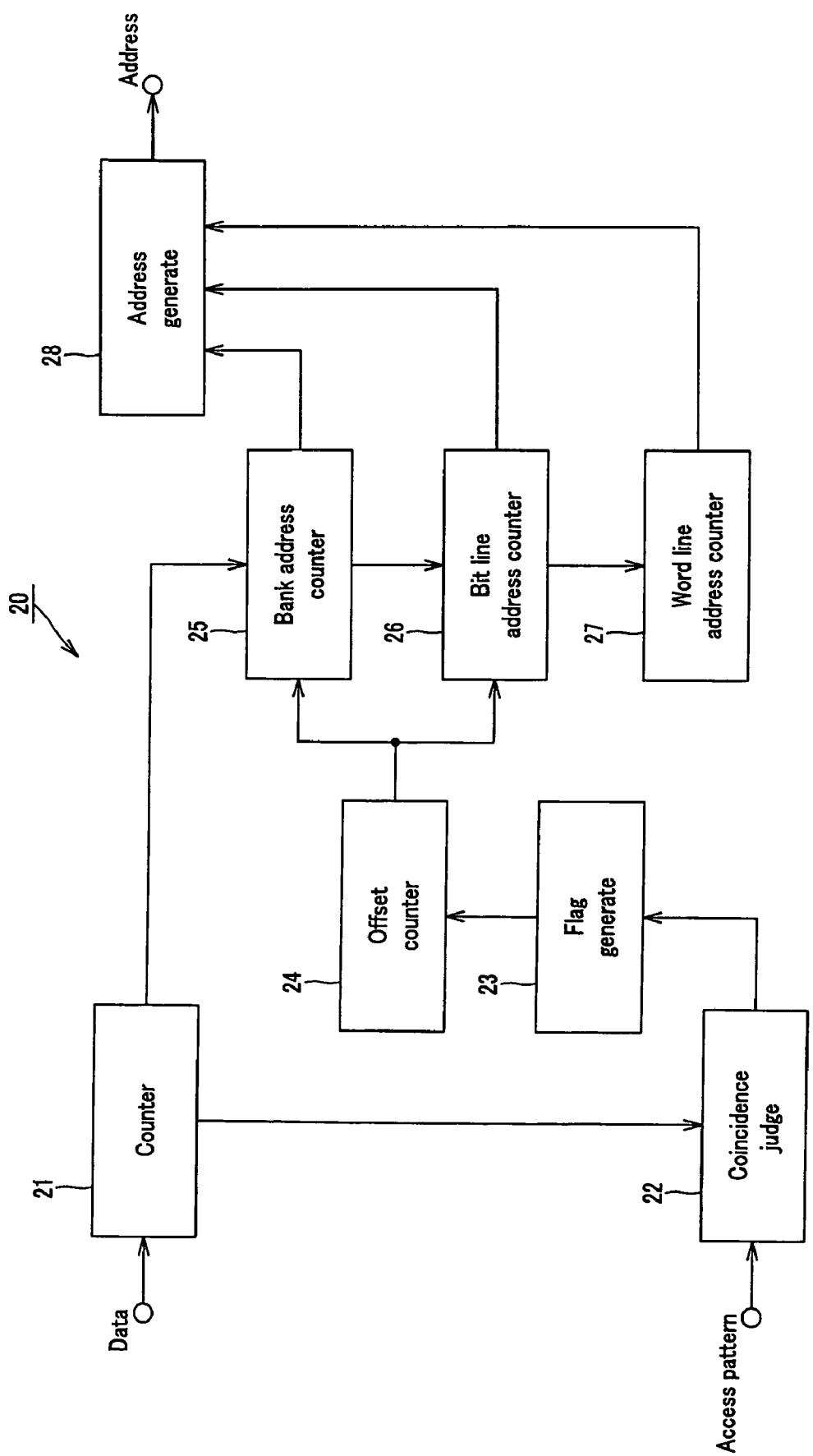
FIG. 12 is also a block diagram of a data storage controller included in the data storage unit in FIG. 11.

As shown in FIG. 12, the data storage controller 20 in the data storage unit 100 includes a counter 21 to count input data, a coincidence judgment unit 22 to judge whether a count output from the counter 21 and the access pattern are coincident with each other, a flag generator 23 to generate a flag correspondingly to a judgment output from the coincidence judgment unit 22, an offset counter 24 to count flags generated by the flag generator 23, a bank address counter 25 which is incremented with an output from the counter 21, a bit line address counter 26 which is incremented with an output from the bank address counter 25, a word line address counter 27 which is incremented with an output from the bit line address counter 26, and an address generator 28 to generate a storage address on the basis of outputs from the counters 25, 26 and 27. An output from the offset counter 24 is supplied as an offset value to the bank address counter 25 and bit line address counter 26.

Figure 13:
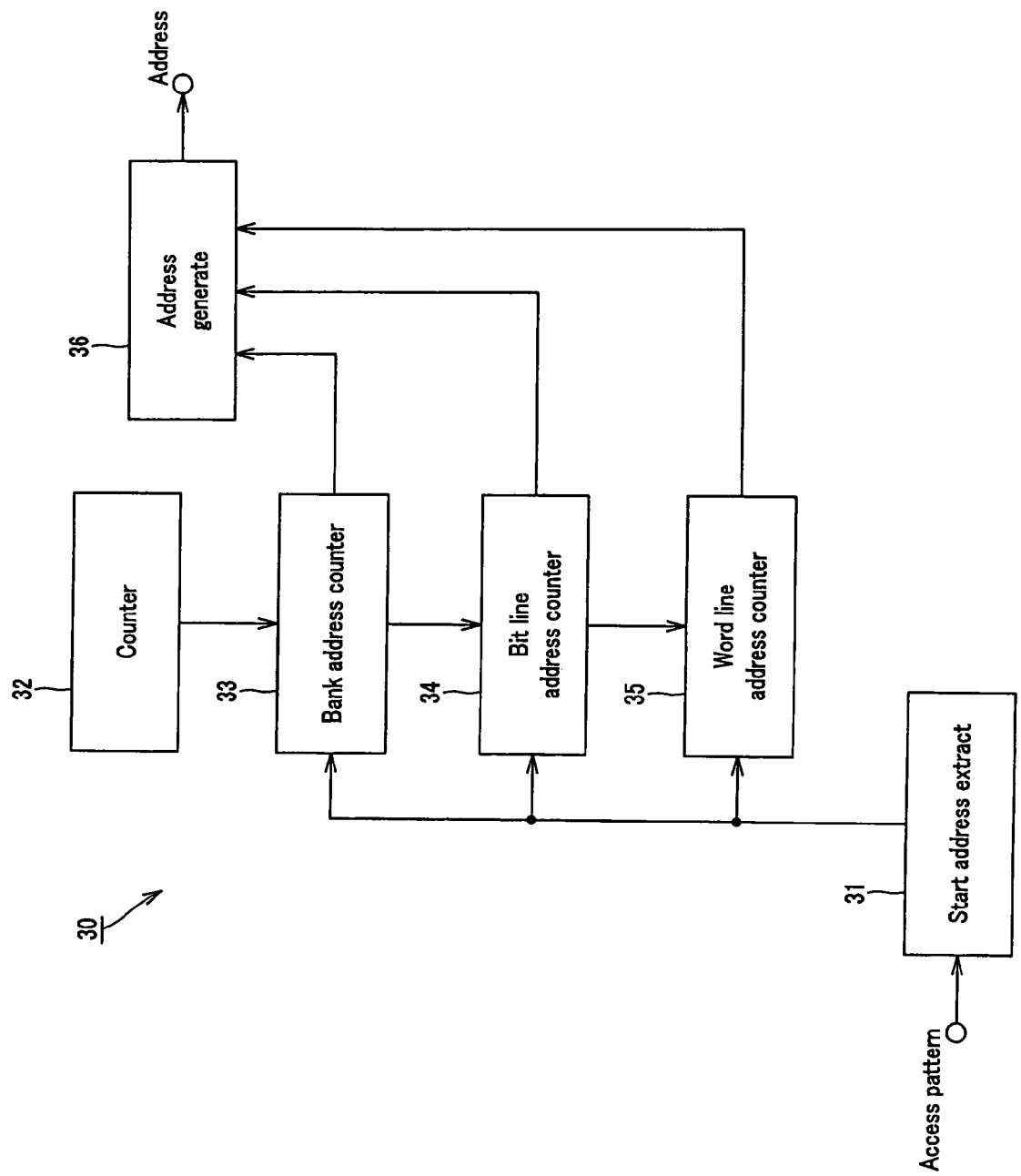
FIG. 13 is a block diagram of a data read controller included in the data storage unit in FIG. 11.

As shown in FIG. 13, the data read controller 30 includes a start address extraction unit 31 to extract a start address from the access pattern, a data read counter 32, a bank address counter 33 which is incremented with an output from the counter 32, a bit line address counter 34 which is incremented with an output from the bank address counter 33, a word line address counter 35 which is incremented with an output from the bit line address counter 34, and an address generator 36 to generate a storage address on the basis of outputs from the address counters 33, 34 and 35. A start address is supplied from the start address extraction unit 31 to the address counters 33, 34 and 35.

Figure 14:
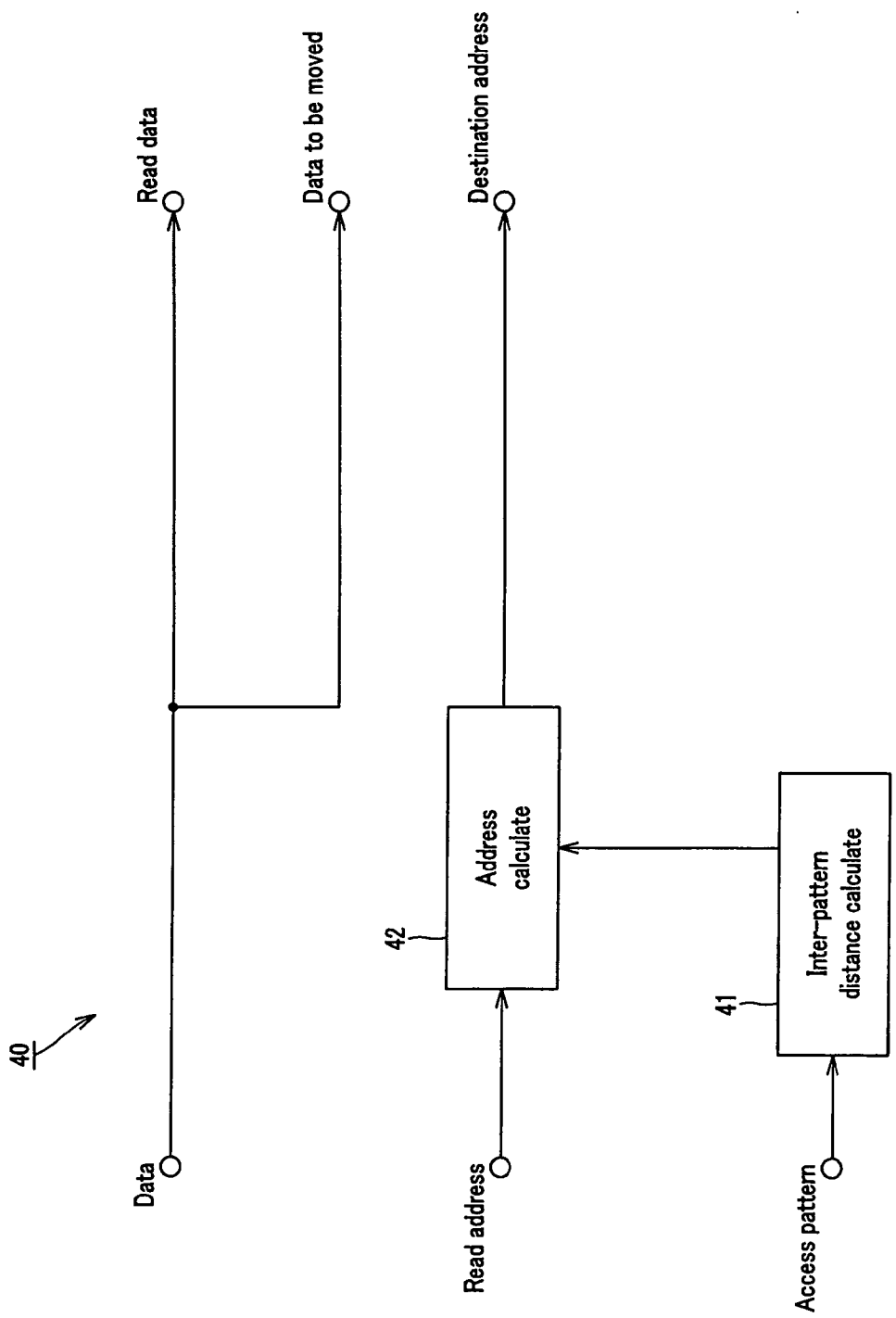
FIG. 14 is also a block diagram of a data move controller in the data storage unit in FIG. 11.

The data move controller 40 is provided to output data read from the memory 10 correspondingly to a read address generated by the data read controller 30 and control the storage of the data as to-be-moved data into the memory 10. As shown in FIG. 14, the data move controller 40 includes an inter-pattern distance calculator 41 to calculate an inter-pattern distance from the access pattern, and a destination address calculator 42 to generate a destination address from a read address generated by the data read controller 30 on the basis of an inter-pattern distance calculated by the inter-pattern distance calculator 41.

In the data storage unit 100 configured as above, a plurality of data on an image can be accessed simultaneously in a specific pattern by dividing the memory into a plurality of banks and locating and re-storing the plurality of data for storage into different banks, respectively.

First, location of the data into each band in the data storage unit 100 thus configured will be described.

Figure 15:
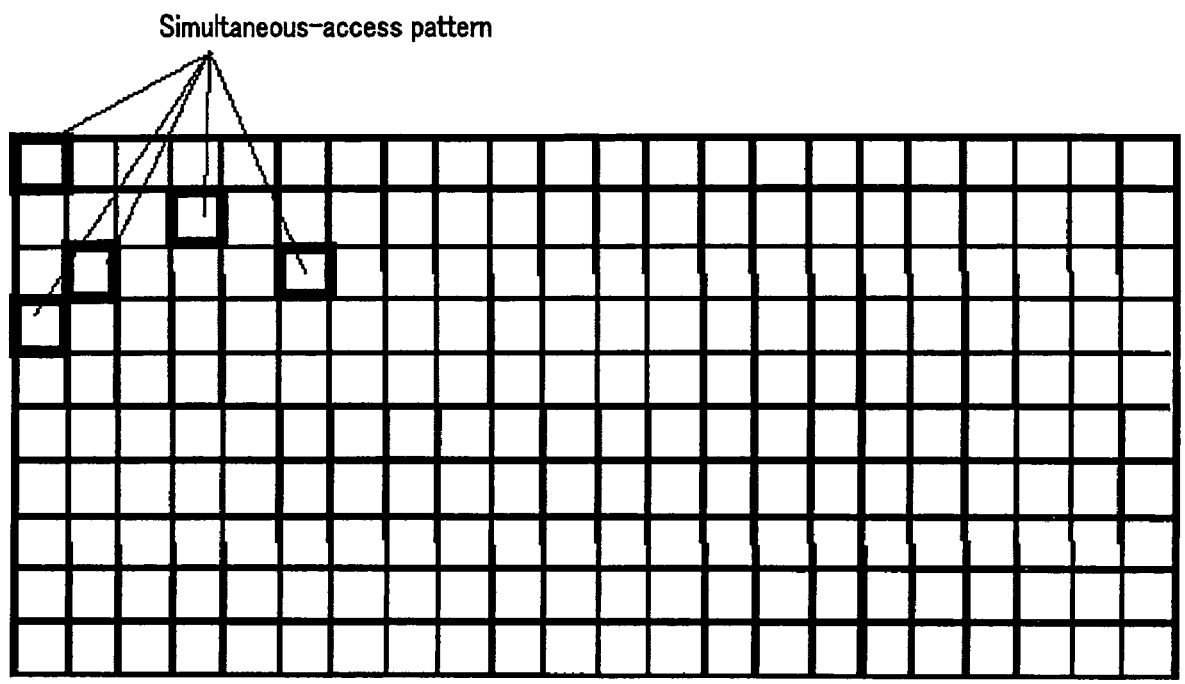
FIG. 15 is a schematic illustration of an example of the set of patterns included in an image and which correspond to a plurality of pixels to be accessed simultaneously.
Figure 16A:
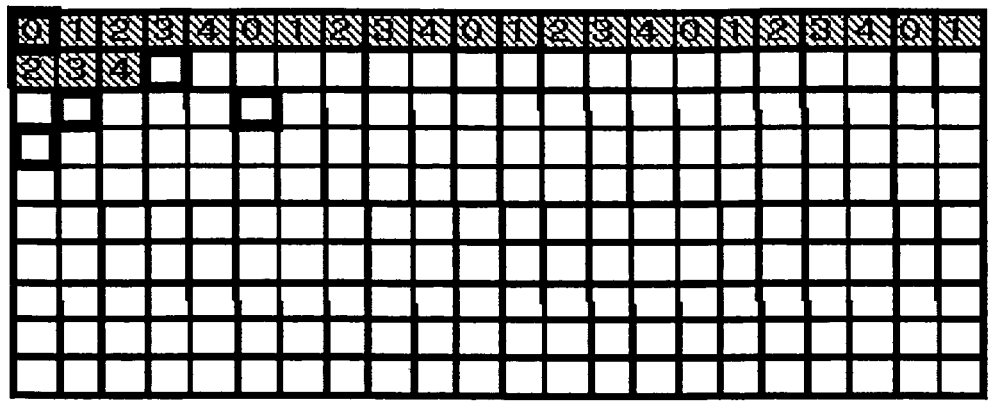
FIGS. 16A to 16F schematically illustrate states of the data storage unit, in which pixels are stored sequentially into banks, respectively, starting at the upper left of an image with bank address being incremented.
Figure 16B:
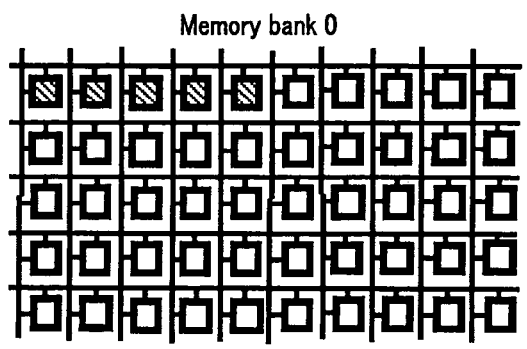
Figure 16C:
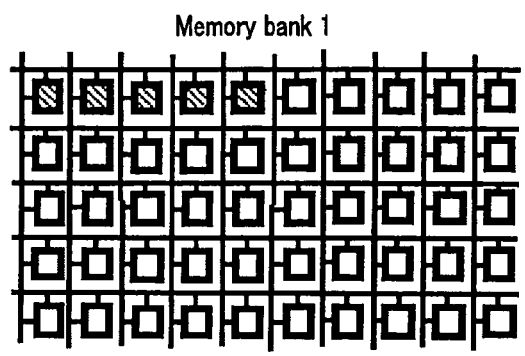
Figure 16D:
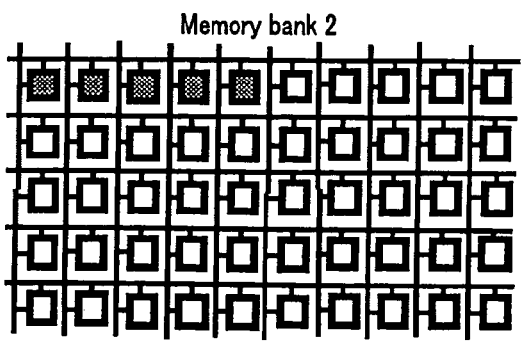
Figure 16E:
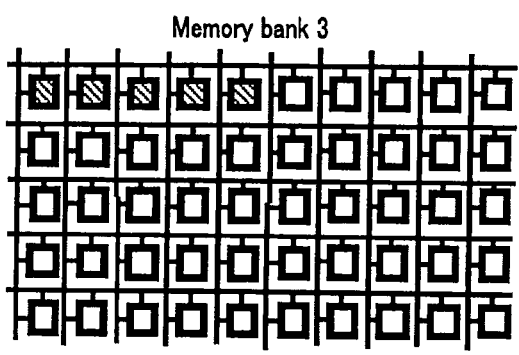
Figure 16F:
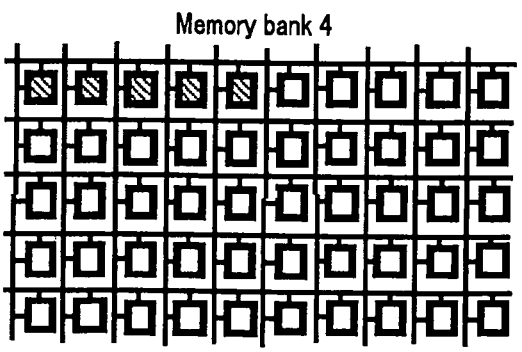
Figure 17A:
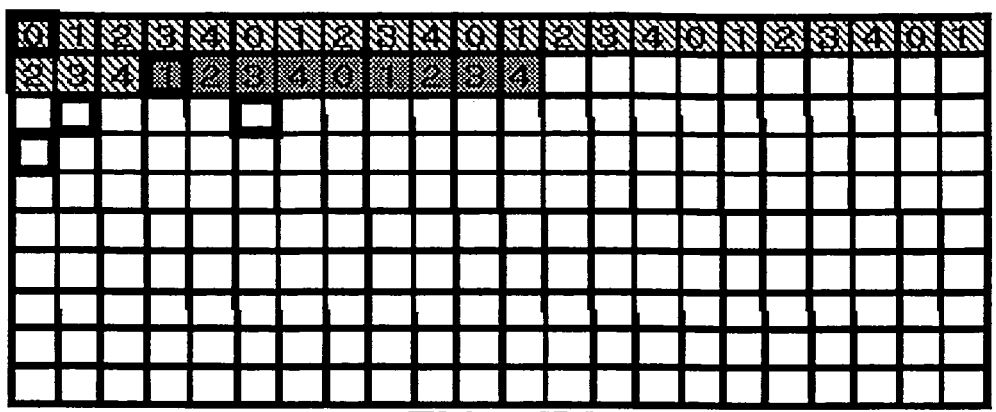
FIGS. 17A to 17F schematically illustrate states of the data storage unit, in which the bank address is incremented at a location to be accessed.
Figure 17B:
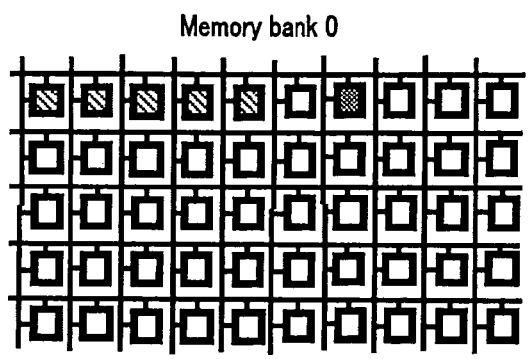
Figure 17C:
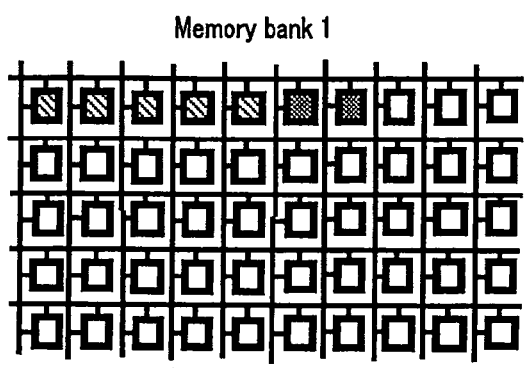
Figure 17D:
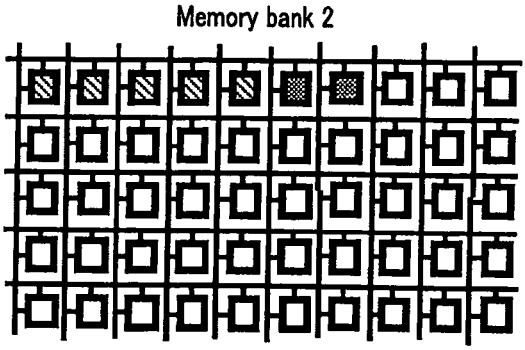
Figure 17E:
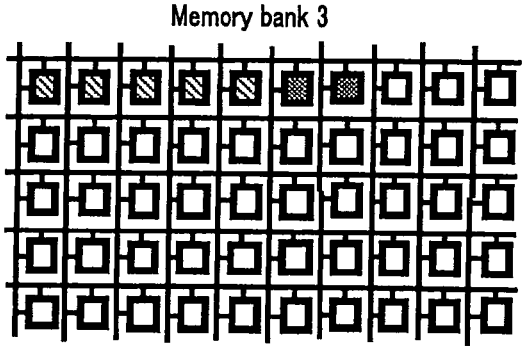
Figure 17F:
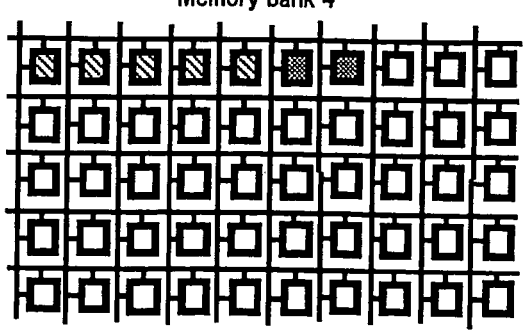
Figure 18A:
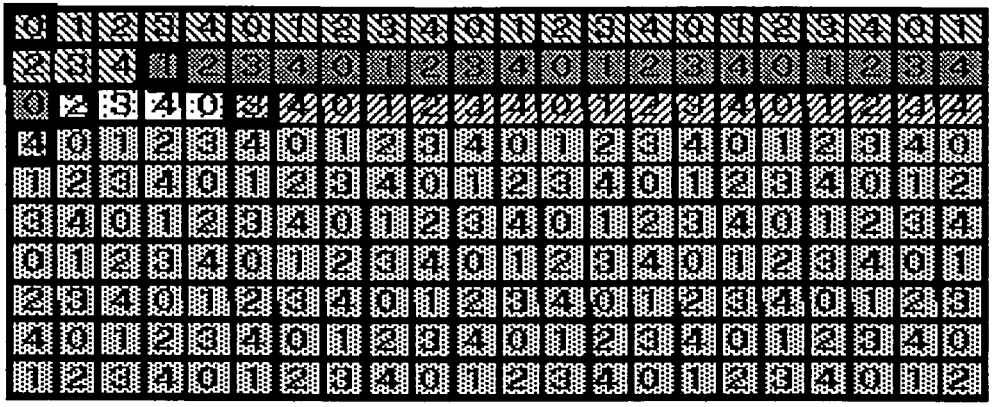
FIGS. 18A to 18F schematically illustrate states of the data storage unit, in which no data exists in a bank skipped due to the bank address incrementation.
Figure 18B:
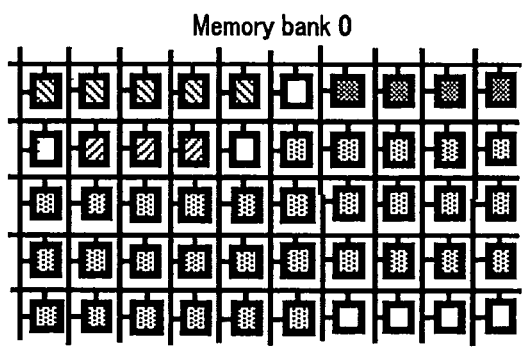
Figure 18C:
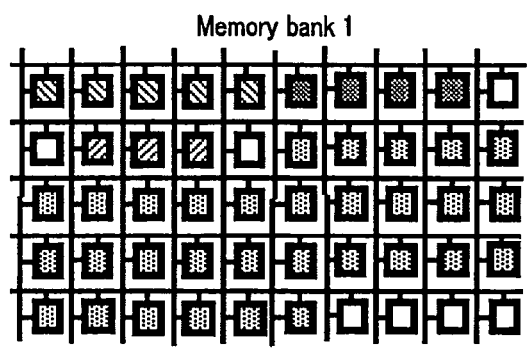
Figure 18D:
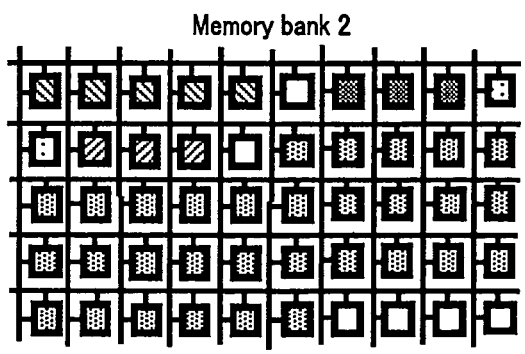
Figure 18E:
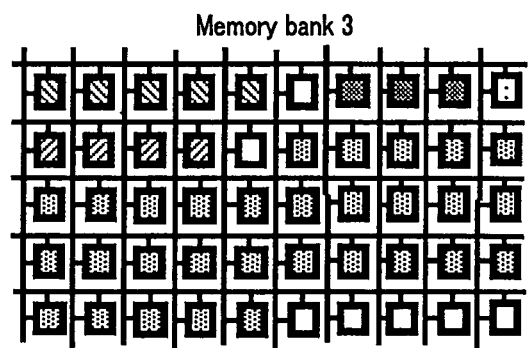
Figure 18F:
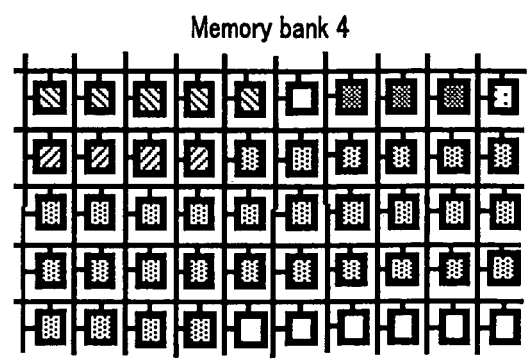

It is assumed here that an image includes patterns corresponding to a plurality of pixels to be accessed simultaneously and raster scan is made of the patterns starting at the upper left, as shown in FIG. 15, for example. The access pattern corresponding to the plurality of pixels to be accessed simultaneously is not limited to the example shown in FIG. 15.

When storing pixels one by one into a bank starting at the upper left of the image, the data storage controller 20 increments the bank address as shown in FIGS. 16A to 16F to select banks one after another, for example, a bank 2 after a bank 1, a bank 3 after the bank 2, ... for storage of one pixel. When a last bank is reached, data are stored into the bank 1 again. It should be noted that each of numerals in FIG. 16A indicates a bank address at which the data are to be stored, namely, a destination bank address.

Note that it is assumed here that the right end of a horizontal line is contiguous to the left end of a next lower horizontal line.

Each of the banks of the above memory 10 has a word line address and a bit line address. Each time data is stored in one bank, the data storage controller 20 will increment the bit line address of that bank. When the end of the bit line address is reached, the data storage controller 20 will increment the word line address.

As shown in FIGS. 17A to 17F, when a location to be accessed is reached, the data storage controller 20 will set the bank address to the value in the offset counter 24.

The offset counter 24 in the data storage controller 20 counts accessed locations. The count in the offset counter 24 indicates in which place of order the accessed location is.

For storage of data into a bank in a location different from other accessed locations, the data storage controller 20 controls the offset counter 24 to set an offset value in the bank address counter 25 for that bank. The data storage controller 20 skips the bank having the offset value thus set for itself in the bank address counter 25, and increments the word line address in the skipped bank taking the latter as having data stored therein.

Storage of data as above into the banks will result in blanks in the banks skipped by setting the offset value in the band address counter 25 for each of the banks, as shown in FIGS. 8A to 8F.

Figure 19:
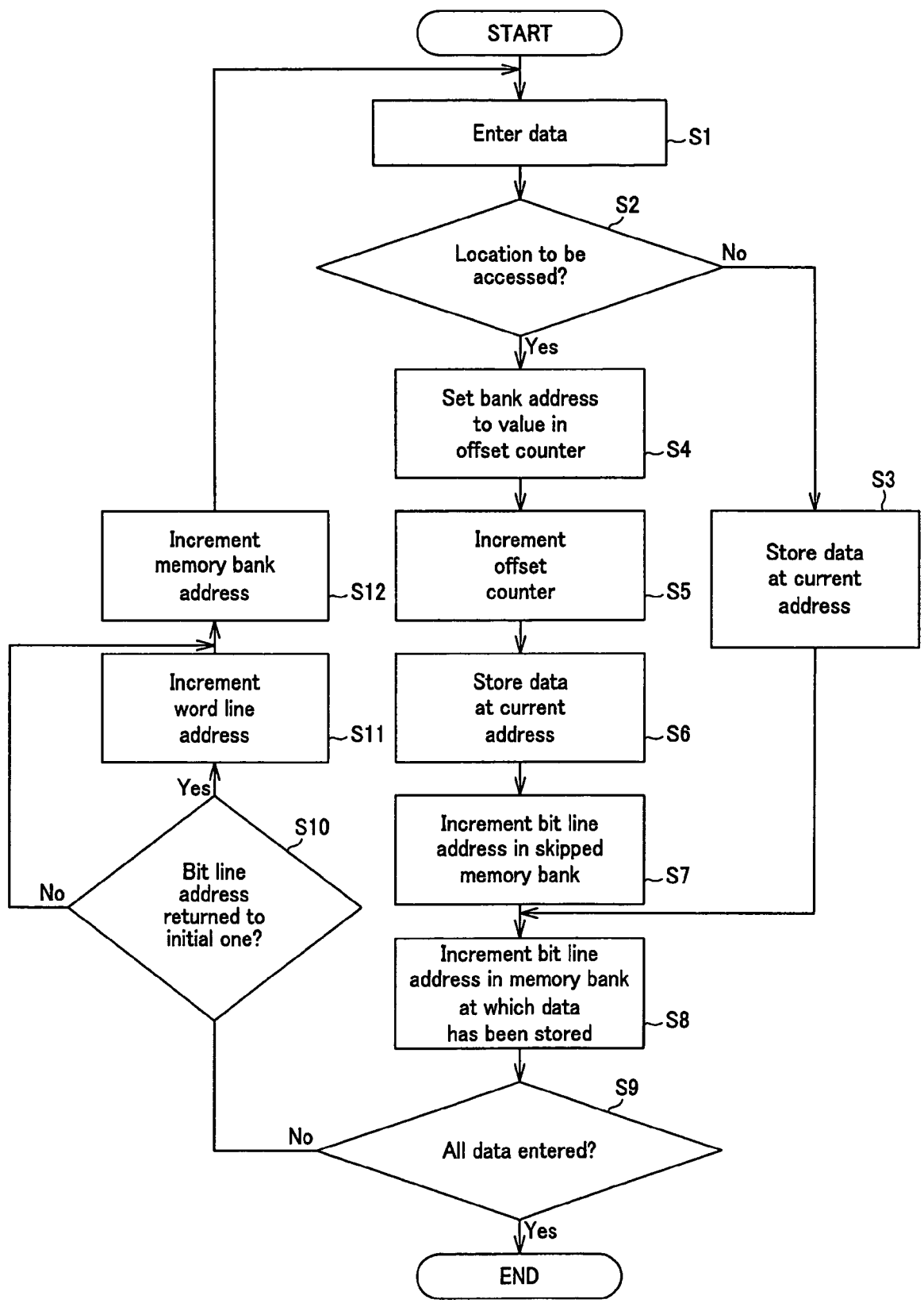
FIG. 19 shows a flow of operations made in storage of data into each bank.
Figure 20A:
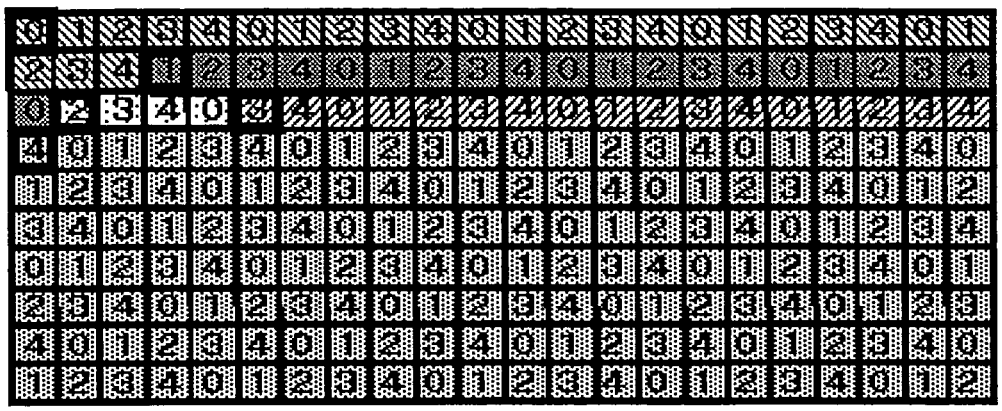
FIGS. 20A to 20F schematically illustrate states of the data storage unit, in which a plurality of simultaneous access is initially done.
Figure 20B:
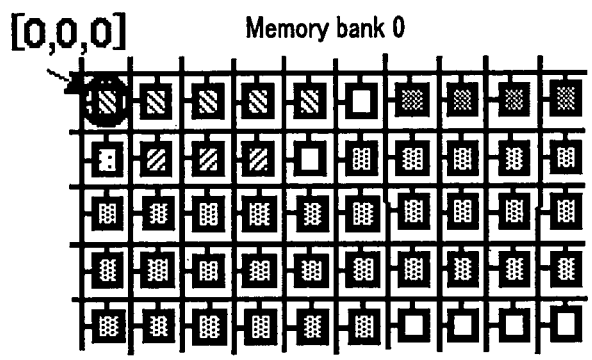
Figure 20C:
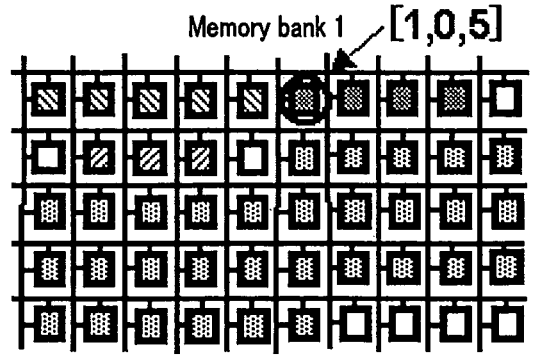
Figure 20D:
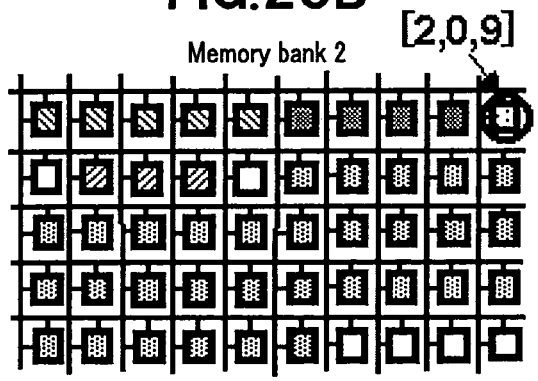
Figure 20E:
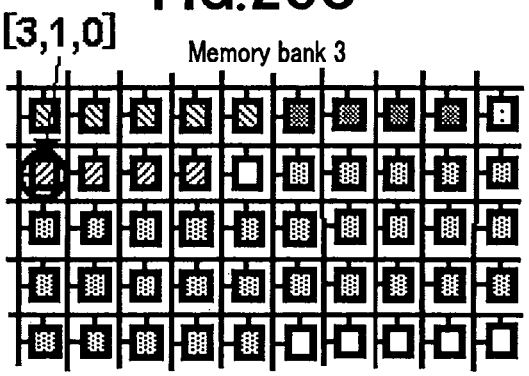
Figure 20F:
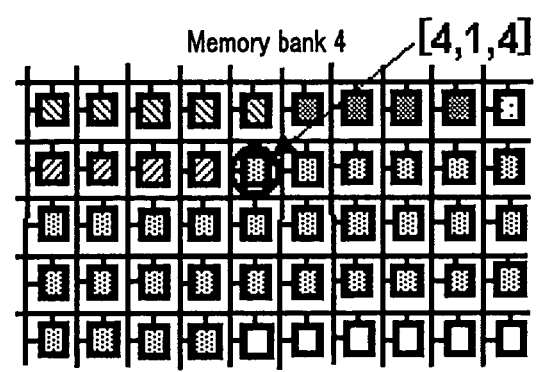
Figure 21A:
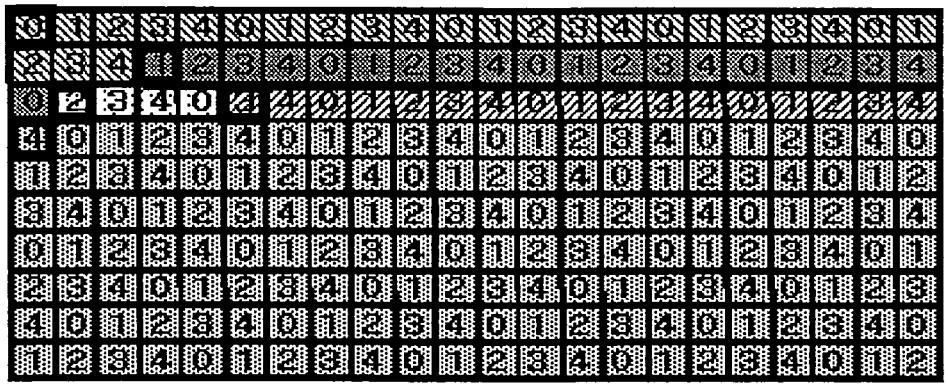
FIGS. 21A to 21F schematically illustrate states of the data storage unit, in which an adjacent pixel is accessed in raster scan.
Figure 21B:
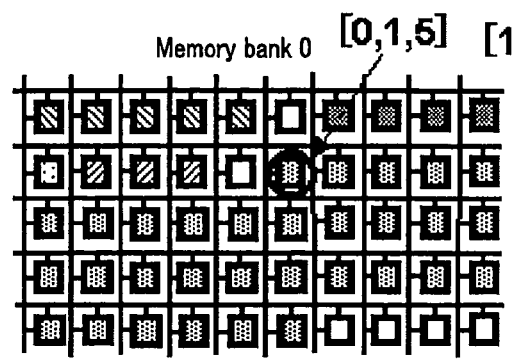
Figure 21C:
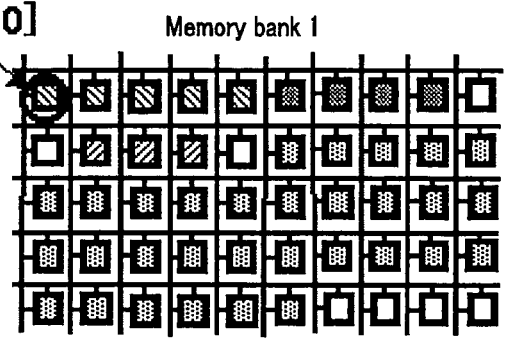
Figure 21D:
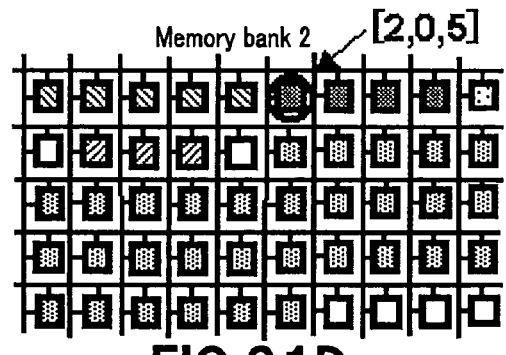
Figure 21E:
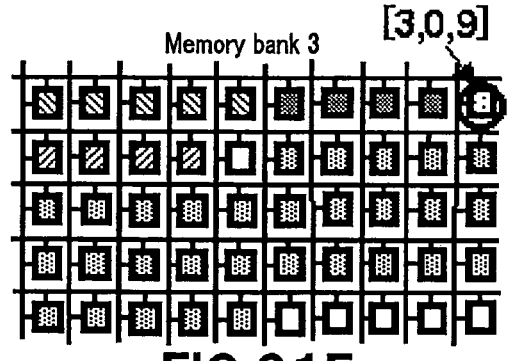
Figure 21F:
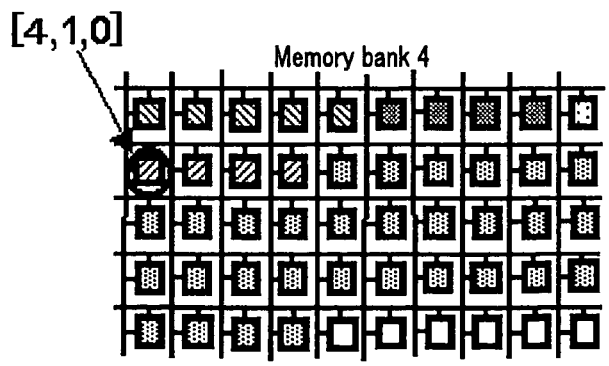

Note here that data are stored into the banks as will be described in the flow diagram in FIG. 19. It should be noted that the banks formed are as many as pixels to be accessed simultaneously.

More particularly, when the data storage unit 100 is supplied with data to be stored (in step S1), the data storage controller 20 will control the coincidence judgment unit 22 to judge whether the destination of the data is an accessible address (in step S2). If the result of judgment is negative (NO), the data storage controller 20 will control the memory 10 to store the data at a current write address (in step S3) and go to a next step S8.

If the result of the judgment in step S2 is affirmative (Yes), namely, in case the data destination is an accessible address, the data storage controller 20 will control the offset counter 24 to set an offset value in the bank address counter 24 (in step S4), increment the offset counter 25 (in step S5) and then store the data at the current write address in the memory 10 (in step S6).

Next, the data storage counter 20 will increment the bit line address in the skipped memory bank (in step S7), and then increment the bit line address in the memory bank where the data is stored (in step S8).

Further, the data storage controller 20 judges whether all data have been stored (in step S9).

If the result of the judgment in step S9 is negative (NO), the data storage controller 20 will judge whether the bit line address has returned to an initial one (in step S10). If the result of this judgment is negative (NO), the data storage controller 20 will go to step S12. If the result of judgment is affirmative (YES), the data storage controller 20 will increment the word line address (in step S11), and further the bank address (in step S12), then return to step S1 where it will repeat the operations in steps S1 to S12 to store all the data until the result of the judgment in step S9 is affirmative (YES). Then, the data storage controller 20 will exit the process of data storage.

Next, the method of access and re-storage of data will be described.

By initially specifying [0, 0, 0], [1, 0, 5], [2, 0, 9], [3, 1, 0] and [4, 1, 4] as addresses (band address, word line address and bit line address) to be accessed simultaneously as shown in FIGS. 20A to 20F, these addresses can be accessed simultaneously since data are stored in different banks in the data storage unit 100.

For access to an adjacent pixel by raster scan, the bank address should be incremented by one as shown in FIGS. 21A to 21F since one pixel is stored in each memory bank. Upon return of the bank address to an initial one, the bit line address is incremented by one. Upon return of the bit line address to an initial one, the word line address is incremented by one.

The offset value having been set in the bank address counter 25 for a location to be accessed is canceled so that pixels can always be accessed. The cancellation of the offset value once set in the bank address counter 25 for a location means re-storage of data at the location where data had to be stored when it is not any location to be accessed, namely, into a memory bank skipped by setting the offset value in the band address counter 25 for that memory bank. Since the bit line address has been incremented taking the memory skipped by setting the offset value in the band address counter 25 for the bank as having data stored therein at the time of data storage, nothing is stored at that address.

Therefore, data can be re-stored at that address.

A destination where data is to be re-stored can be determined from a pixel interval between an address being currently accessed and a spatially preceding address and a total number of banks.

Figure 22:
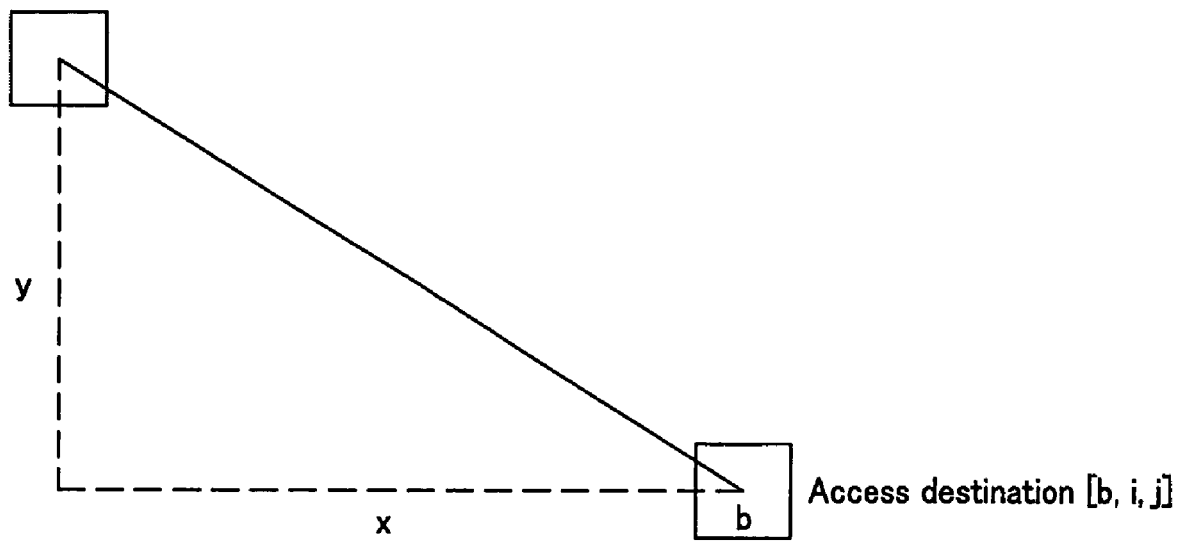
FIG. 22 explains determination of a destination address to be accessed for re-storage of data.
Figure 23A:
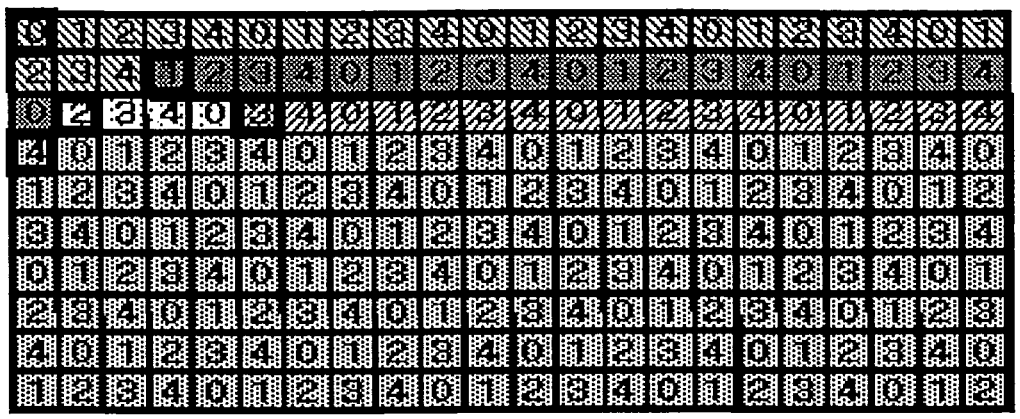
FIGS. 23A to 23F schematically illustrate states of the data storage unit, in which data is re-stored.
Figure 23B:
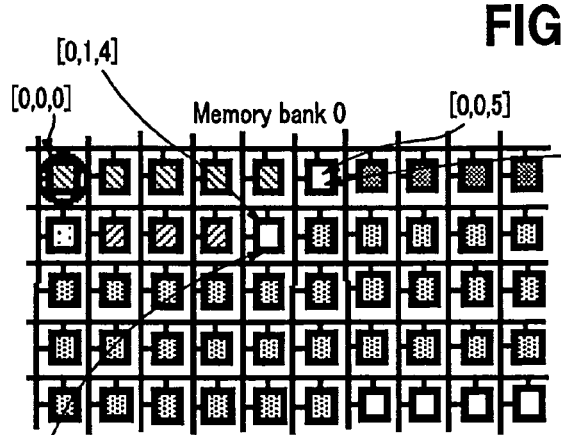
Figure 23C:
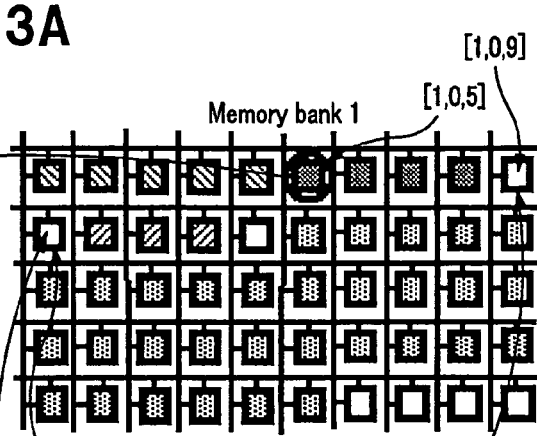
Figure 23D:
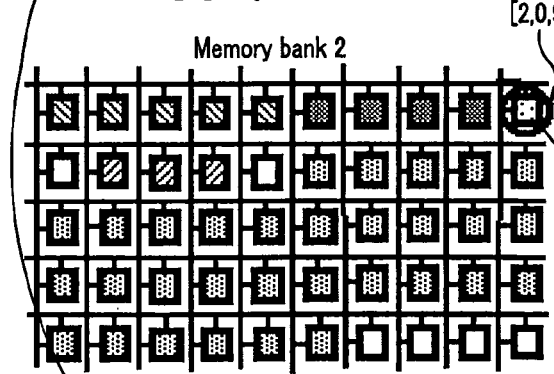
Figure 23E:
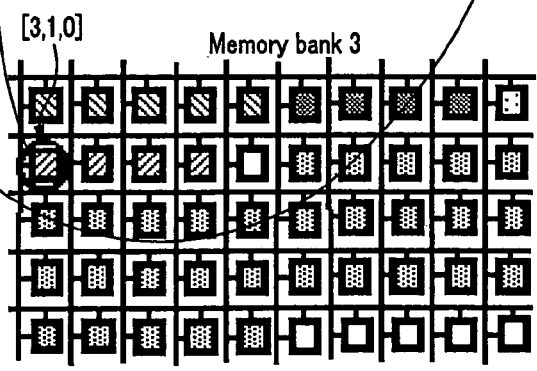
Figure 23F:
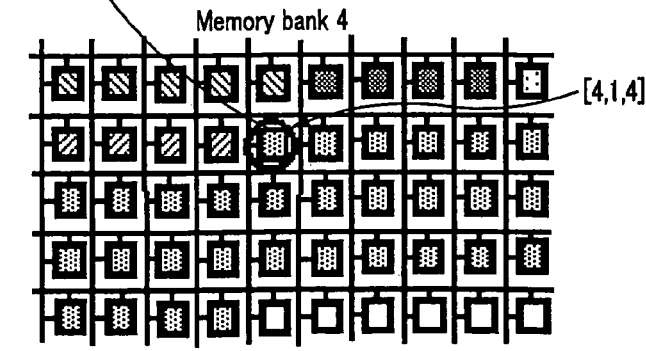

More specifically, when the address being currently accessed is taken as [Bank address b, Word line address i, Bit line address j], the pixel interval from a preceding access destination is d and the number of banks is n as shown in FIG. 22, a destination bank address B is given by the following formula (1):

$$B=(d+b-1)\bmod n \qquad (1)$$

A destination word line address I and destination bit line address J are as follows:

I=i, and J=j

However, since the destination bank address B moves in a direction in which it will be smaller than b, when B−b>0, the destination bit line address J will be J=j−1. Also, when the bit line address has returned to a last one, the destination word line address I will be I=i−1. In other case, the destination word line address I will be I=i.

The data is re-stored by moving data at the address [1, 0, 5] to an address [0, 0, 5], data at the address [2, 0, 9] to an address [1, 0, 9], data at the address [3, 1, 0] to an address [1, 1, 0], data at the address [4, 1, 4] to an address, [0, 1, 4] as shown in FIGS. 23A to 23F.

Figure 24:
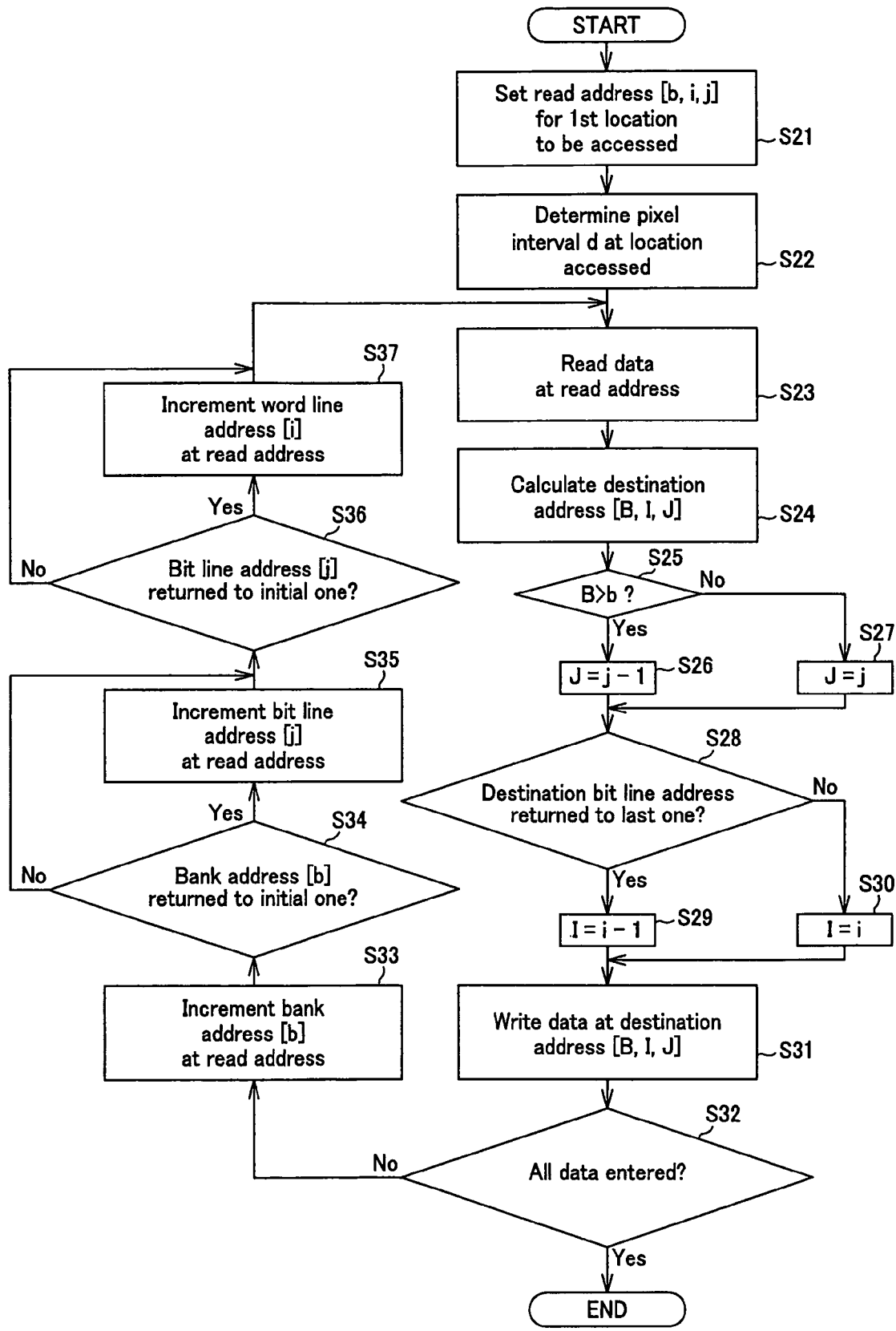
FIG. 24 shows a flow of operations made in access to and re-storage of data.

In the data storage unit 100, data are accessed and re-stored following the procedure shown in the flow diagram in FIG. 24.

The data read controller 30 first sets a read address [b, i, j] for a first location to be accessed (in step S21), and the data move controller 40 controls the inter-pattern distance calculator 41 to determine a pixel interval d at the location to be accessed (in step S22).

Next, the data read controller 30 reads data at the read address [b, i, j] from the memory 10 (in step S23), and the data move controller 40 controls the destination address calculator 42 to calculate a destination address [B, I, J] from the read address [b, i, j] using the above formula (1) (in step S24).

Further, the destination address calculator 42 judges whether the destination bank address B is larger than the read bank address b (in step S25). If the result of judgment is affirmative (YES), the destination bit line address J is set to J=j−1 (in step S26). If the result of the judgment in step S25 is negative (NO), the destination bit line address J is set to J=j (in step S27).

Moreover, the destination address calculator 42 judges whether the destination bit line address J has returned to a last one (in step S28). If the result of judgment is affirmative (YES), the destination word line address I is set to I=i−1 (in step S29). If the result of the judgment in step S28 is negative (NO), the destination word line address I is set to I=i (in step S30).

Then, the data move controller 40 will write the data at the read address [b, i, j] read from the memory 10 at the destination address [B, I, J] in the memory 10 (in step S31).

When the data move controller 40 has moved the data at one location to be accessed in the memory 10 as above, the data read controller 30 will judge whether all pixels have been entered (in step S32).

If the result of the judgment in step S32 is negative (NO), the data read controller 30 will increment a bank address [b] in the read address [b, i, j] (in step S33) to judge whether the bank address [b] has returned to the initial one (in step S34).

If the result of the judgment in step S34 is negative (NO), the data read controller 30 will go to step S36. If the result of the judgment in step S34 is affirmative (YES), the data read controller 30 will increment a bit line address [j] in the read address [b, i, j] (in step S35) and judge whether the bit line address [j] has returned to the initial one (in step S36).

If the result of the judgment in step S36 is negative (NO), the data read controller 30 will return to step S23. If the result of the judgment in step S36 is affirmative (YES), the data read controller 30 will increment a word line address [i] in the bank address [b, i, j] (in step S37), and return to step S23 where it will repeat the operations in steps S23 to S37 to sequentially read data at locations to be accessed, move them in the memory 10 until the result of the judgment in step S32 is affirmative (YES). Then, the data read controller 30 will exit the process of data access and re-storage.

Note that since incrementation of the bank address will enable simultaneous access because of the offset canceling, it is not necessary to keep the address of the re-storage destination stored.

Note that in the data storage unit 100, the data storage controller 20, data read controller 30 and data move controller 40 may be formed from a microprocessor, for example, to control the storage of all data, simultaneous reading of a plurality of data and data re-storage according to a data storage controlling program stored in a program memory (not shown).

Next, the present invention will be described in detail concerning another embodiment thereof.

In this embodiment which will be discussed hereinbelow, a plurality of data can be accessed simultaneously by doubly saving data, which cannot normally be accessed simultaneously because of the memory configuration, at different addresses.

First, the double save of data, which cannot normally be accessed simultaneously, at different addresses will be explained.

Figure 25:
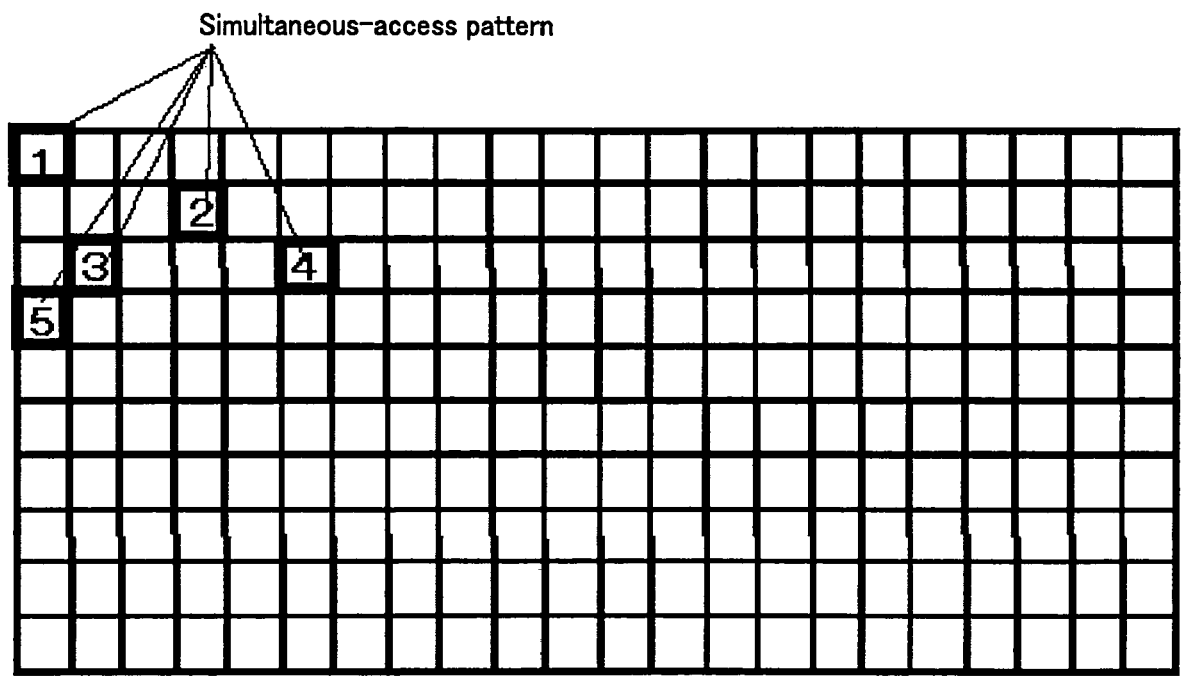
FIG. 25 is a schematic illustration of an example of the set of patterns to be accessed simultaneously.

It is assumed here that patterns corresponding to pixels 1 to 5 which are to be accessed simultaneously are raster-scanned horizontally starting at the upper left as shown in FIG. 25.

As shown in FIGS. 26A to 26F, when data is stored for a vertical line to be stored onto one word line so that the vertical line stored in the same bank will appear periodically, different word lines in the same bank have to be accessed, so that pixels horizontally apart that period from each other will not be accessible simultaneously.

Figure 26A:
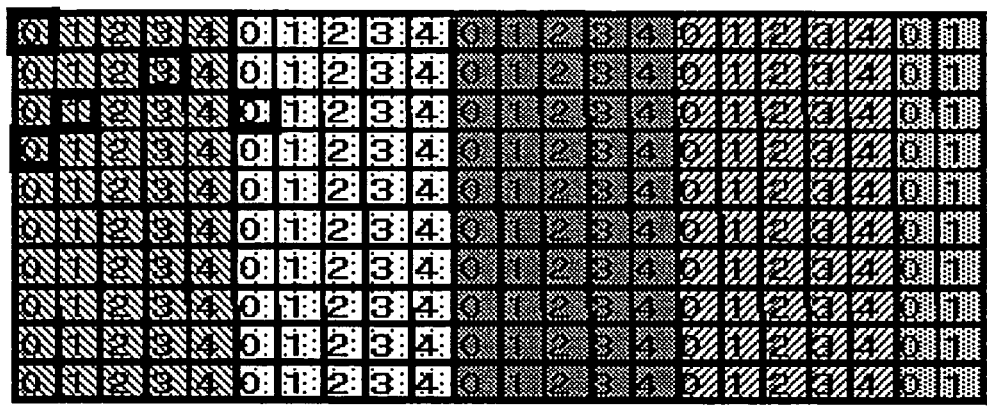
FIGS. 26A to 26F schematically illustrate states of the data storage unit, in which data are stored for a vertical line are stored onto one word line so that the vertical line stored into the same bank will appear periodically.
Figure 26B:
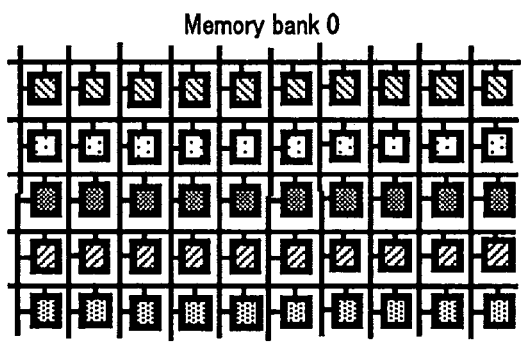
Figure 26C:
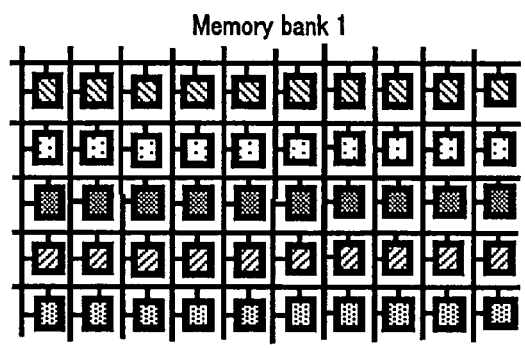
Figure 26D:
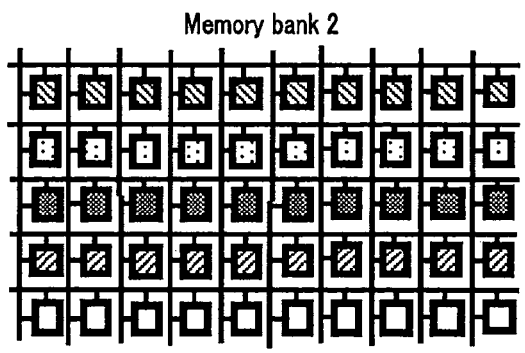
Figure 26E:
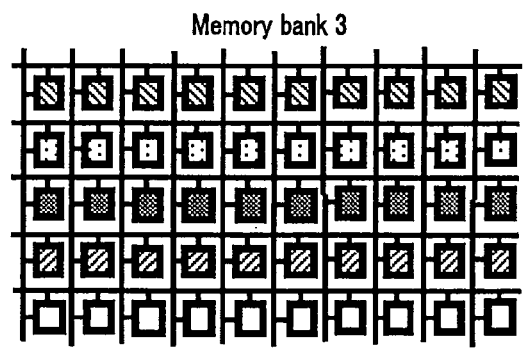
Figure 26F:
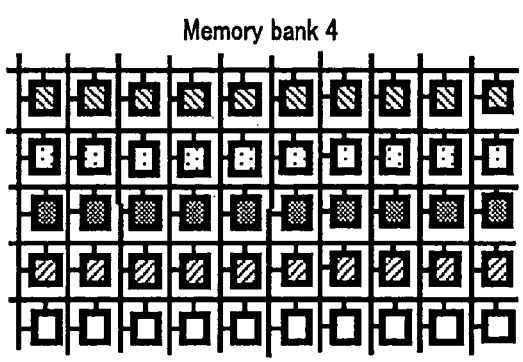

In FIG. 26A, the numerals indicate bank addresses and the thick-line frames indicate patterns to be accessed simultaneously. In this example, the banks count five in number and a vertical line stored in the same bank appears periodically at every five banks.

Figure 27A:
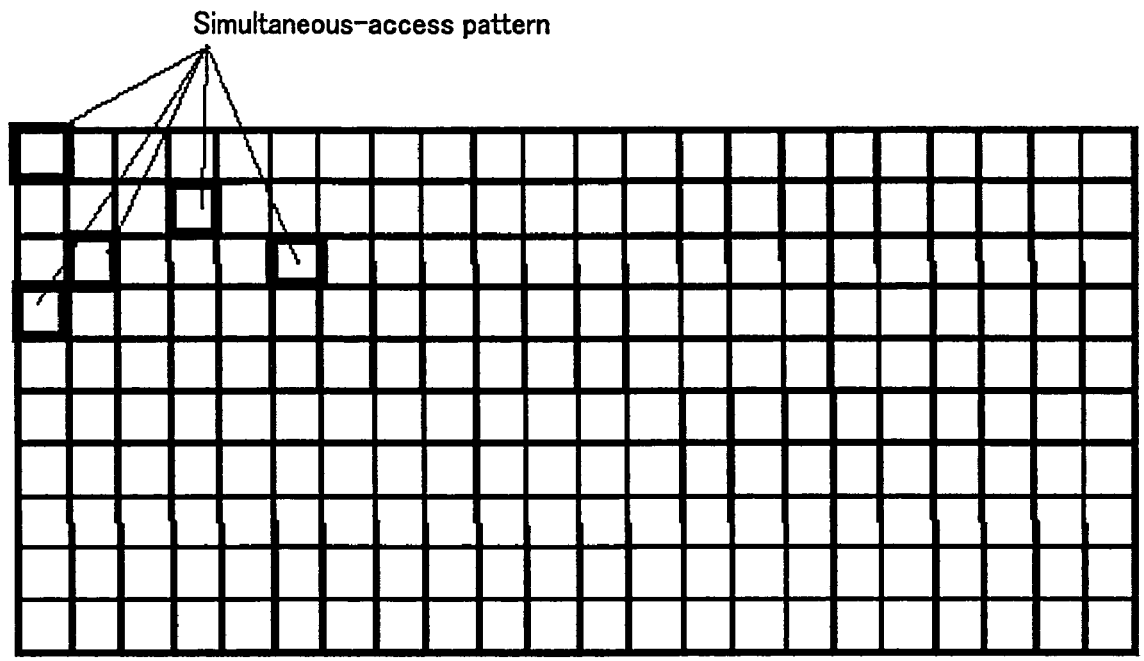
FIGS. 27A and 27B schematically illustrate a horizontal pixel interval at a location to be accessed.
Figure 27B:
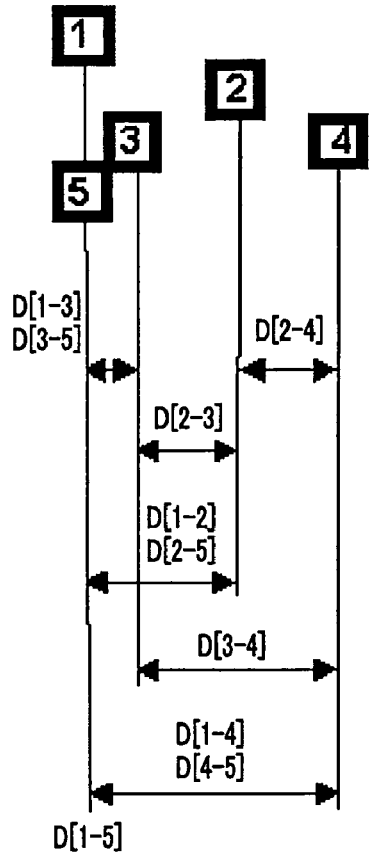
Figure 28A:
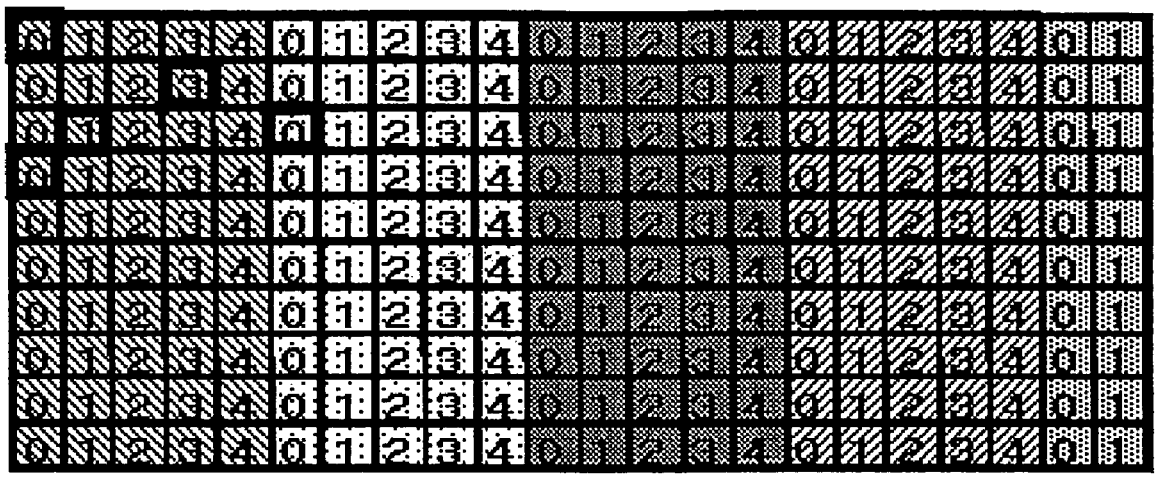
FIGS. 28A and 28B schematically illustrate pixels not simultaneously accessible.
Figure 28B:
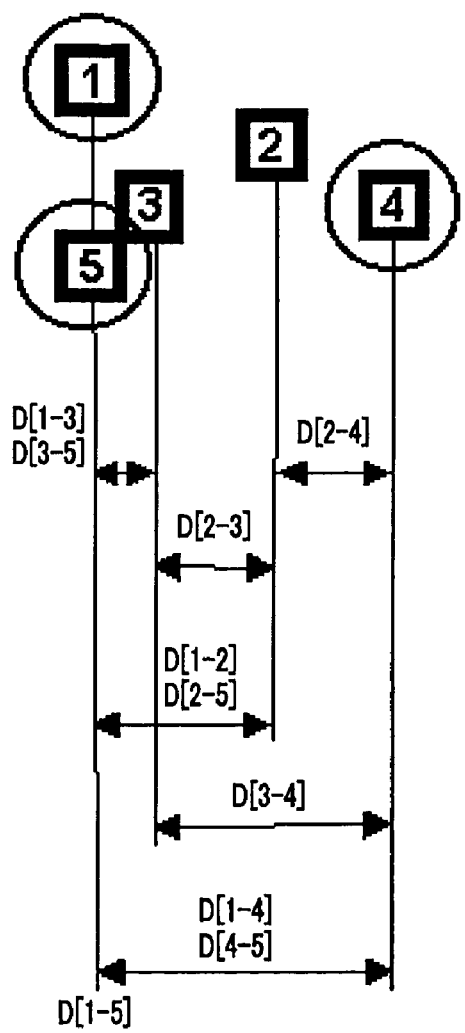

A location to be accessed shifts horizontally as the raster scan proceeds but the pattern itself will not shift. By calculating horizontal inter-pixel interval at a location to be accessed as shown in FIGS. 27A and 27B, it is possible to know, based on the periodicity of a bank into which data is to be stored, which pixels cannot be accessed simultaneously as shown in FIGS. 28A and 28B.

More specifically, the horizontal inter-pixel intervals at locations to be accessed are calculated as follows:

Horizontal interval D [1-2] between pixels 1 and 2: "3"
Horizontal interval D [1-3] between pixels 1 and 3: "1"
Horizontal interval D [1-4] between pixels 1 and 4: "5"

Horizontal interval D [1-5] between pixels 1 and 5: "0"
Horizontal interval D [2-3] between pixels 2 and 3: "2"
Horizontal interval D [2-4] between pixels 2 and 4: "2"
Horizontal interval D [2-5] between pixels 2 and 5: "3"
Horizontal interval D [3-4] between pixels 3 and 4: "4"
Horizontal interval D [3-5] between pixels 3 and 5: "1"
Horizontal interval D [4-5] between pixels 4 and 5: "5"

Since the bank period is "5", it will be known that pixels 1 and 4, and pixels 4 and 5, whose horizontal interval is "5", cannot be accessed simultaneously.

When it is known that any pixels are not accessible simultaneously, accessible pixels are accessed as the raster scan proceeds and saved doubly into other addresses, respectively.

Figure 29A:
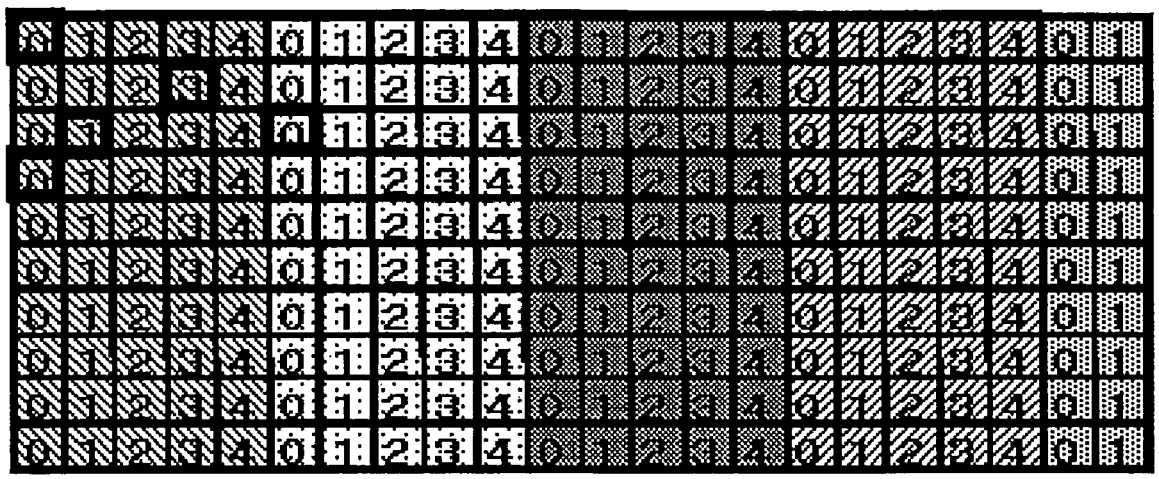
FIGS. 29A and 29B schematically illustrate double save of pixels, determined by calculation of the horizontal pixel interval.
Figure 29B:
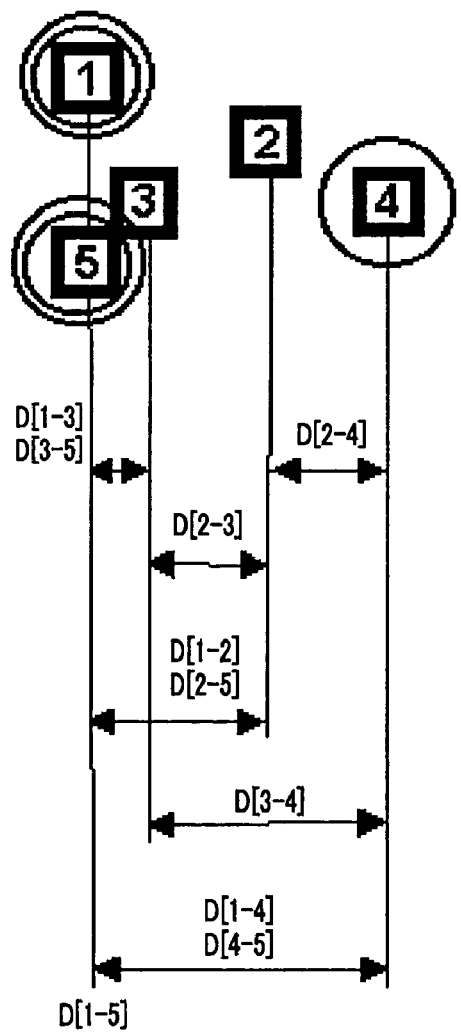
Figure 30A:
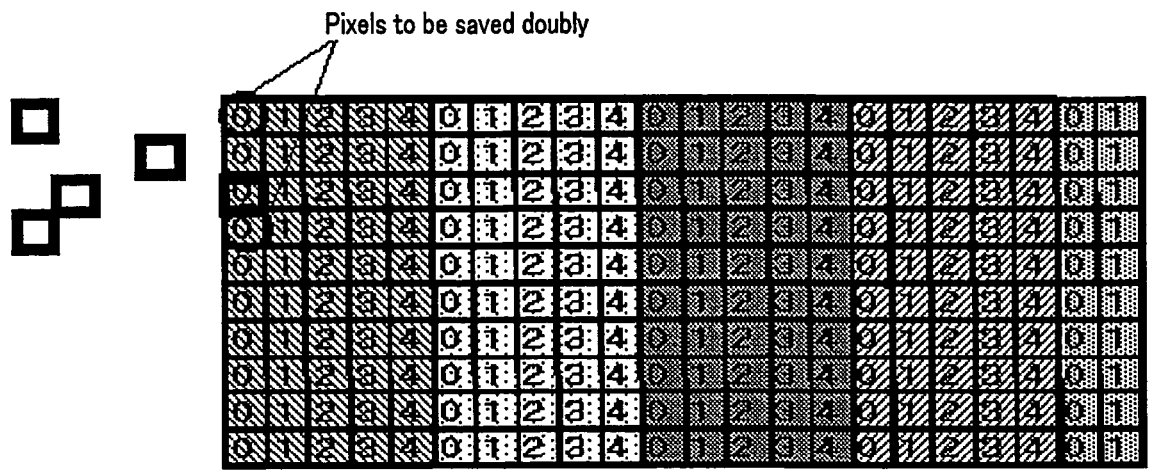
FIGS. 30A to 30F schematically illustrate states of the data storage unit, in which pixels to be staved doubly are read.
Figure 30B:
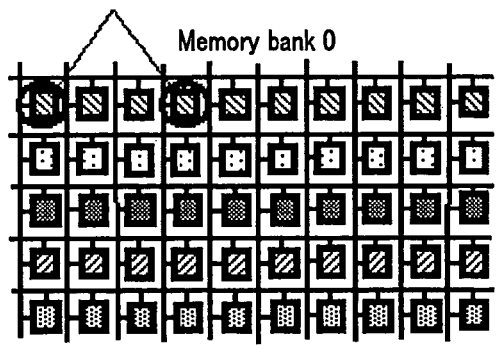
Figure 30C:
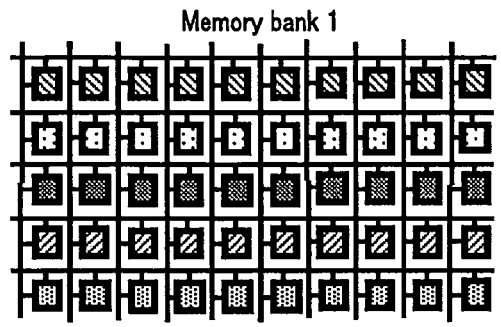
Figure 30D:
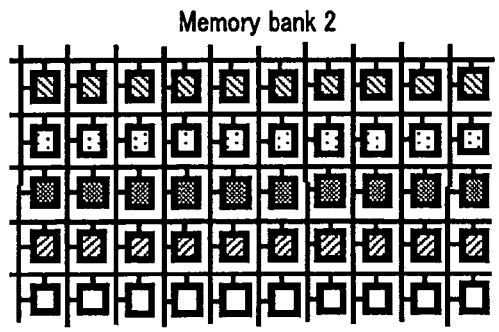
Figure 30E:
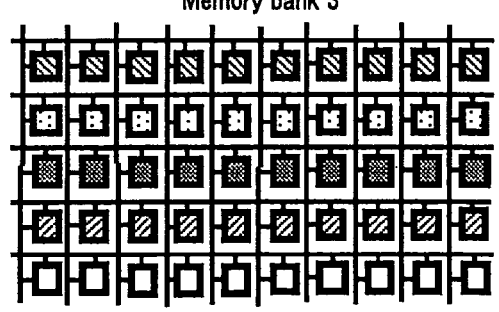
Figure 30F:
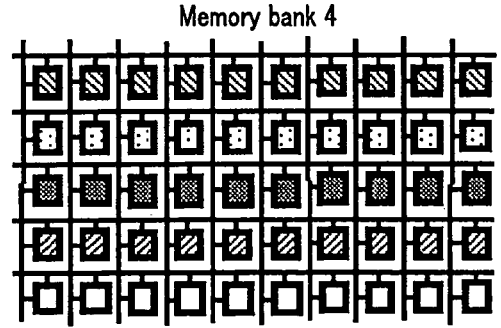
Figure 31A:
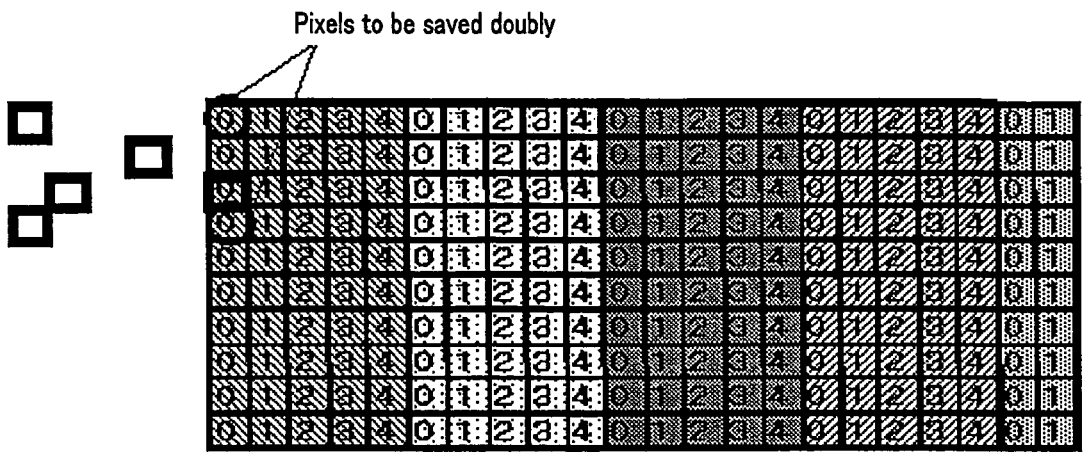
FIGS. 31A to 31F schematically illustrate a basic example of the double save.
Figure 31B:
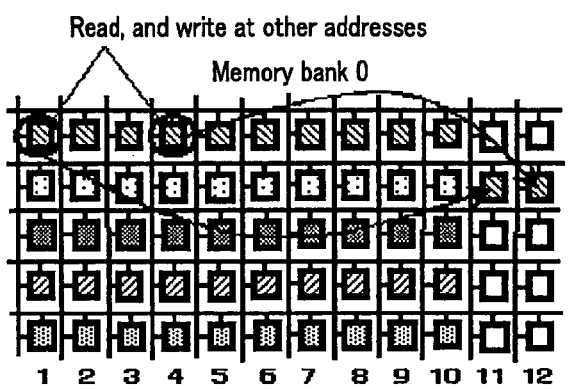
Figure 31C:
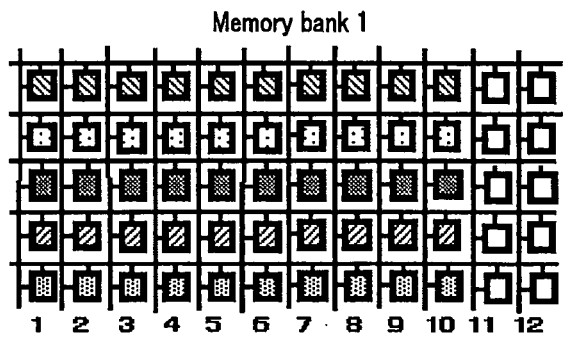
Figure 31D:
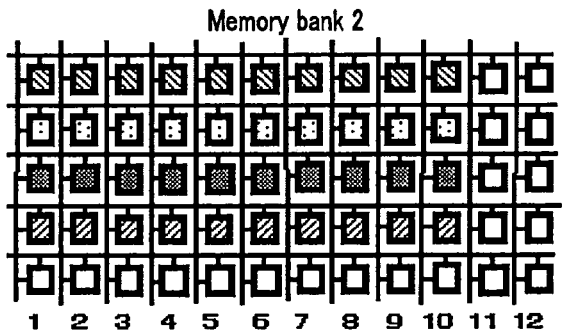
Figure 31E:
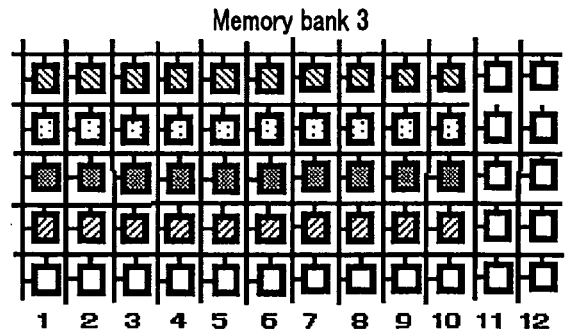
Figure 31F:
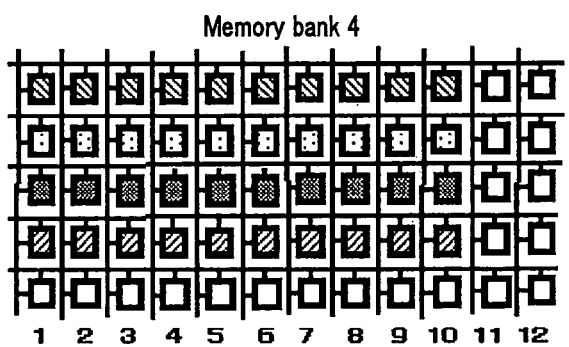
Figure 32A:
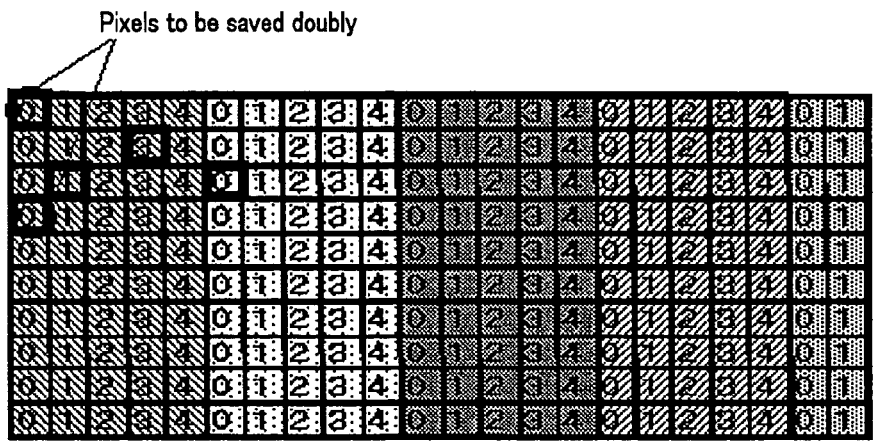
FIGS. 32A to 32F schematically illustrate pixels made simultaneously accessible by the double save.
Figure 32B:
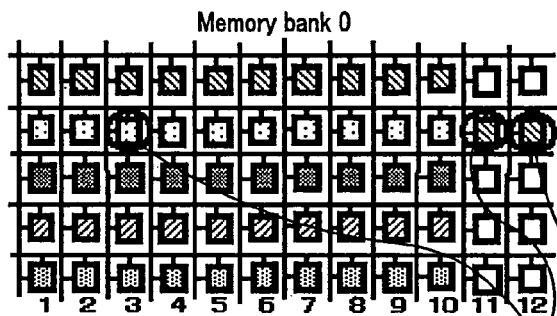
Figure 32C:
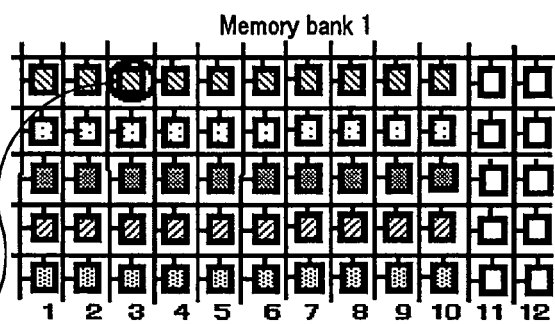
Figure 32D:
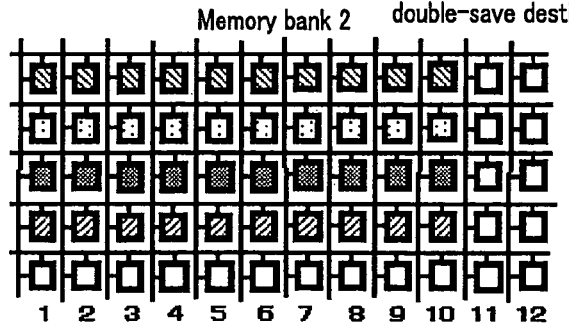
Figure 32E:
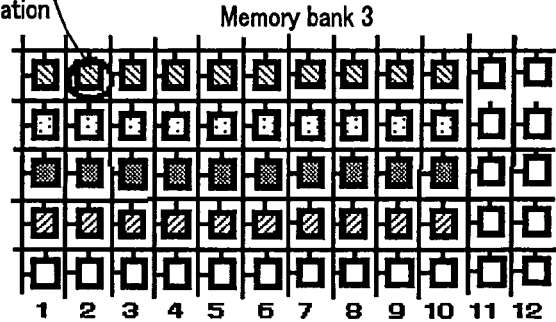
Figure 32F:
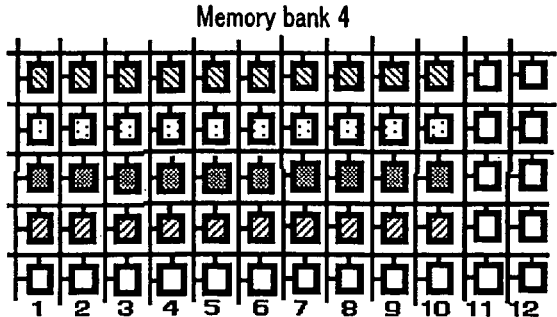
Figure 33A:
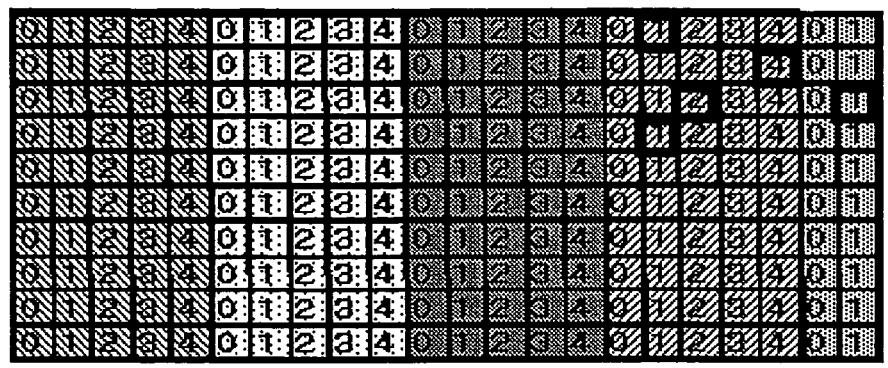
FIGS. 33A to 33F schematically illustrate states of the data storage unit, in which pixels on a horizontal line are saved doubly.
Figure 33B:
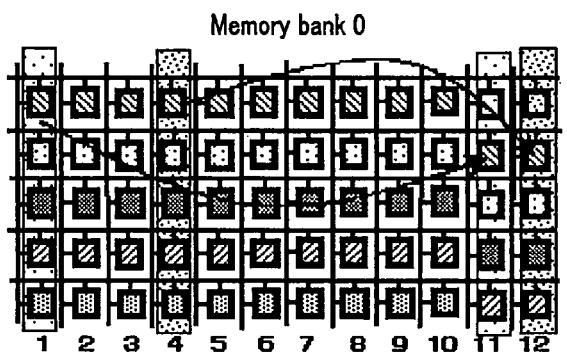
Figure 33C:
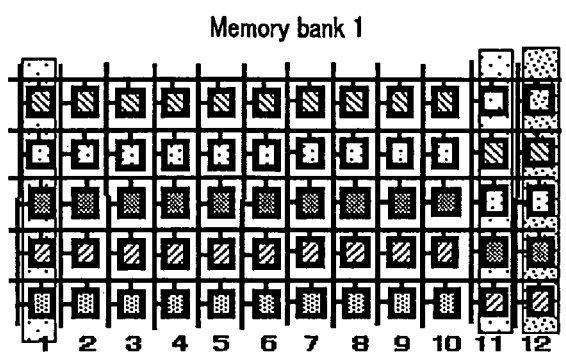
Figure 33D:
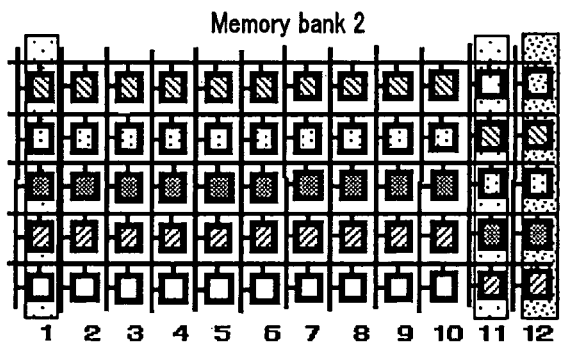
Figure 33E:
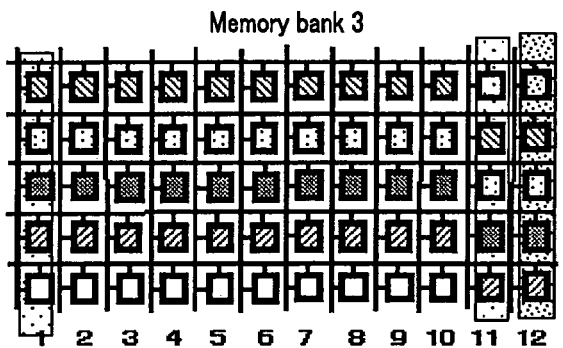
Figure 33F:
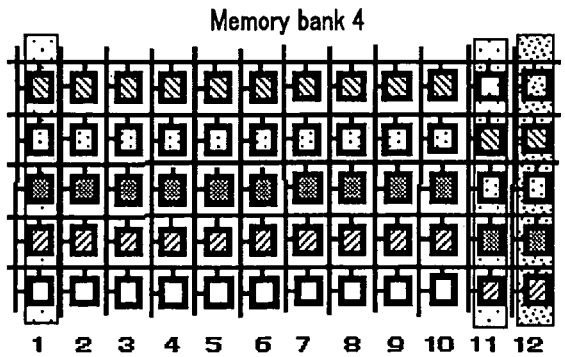

Since it is desired that pixels not simultaneously accessible should be pre-read and written at other addresses, respectively, the pixels 1 and 5 positioned at the left as indicated each with a double circle in FIGS. 29A and 29B should be those not accessible simultaneously.

Thus, pixels to be doubly stored can be pre-read and written at other addresses. That is, when patterns to be accessed simultaneously are positioned as shown in FIGS. 30A to 30F, pixels to be doubly saved can be read and written at other addresses.

Since pixels to be doubly saved may be read and written at other addresses whenever possible, it is not necessary to start the reading at a pixel to the right of a pattern.

When the number of vertical pixels in an image is taken as H, the write address is the (H+1)th word line where a pixel to be written is also to be read.

For double save of N pixels, an area including the (H+1)th to (H+N)th word lines is required.

In case there are ten vertical pixels and two pixels are to be saved doubly as shown in FIGS. 31A to 31F, the pixels will be doubly saved on the eleventh and twelfth addresses on a word line. In an example shown in FIGS. 36A to 36F, pixels at the first and fourth addresses on the first word line in the bank 0 will be doubly saved at the eleventh and twelfth addresses on the second word line in the bank 0.

By doubly saving, at different addresses, pixels, which could noted be accessed simultaneously, in patterns to be accessed simultaneously, these pixels will be accessible simultaneously as shown in FIGS. 32A to 32F since the data at double-save destinations can be accessed. As the raster scan goes horizontally through patterns, pixels on a horizontal line will be doubly saved as shown in FIGS. 33A to 33F by doubly saving pixels, which could not be accessed simultaneously, while making simultaneous access to the pixels.

Figure 34:
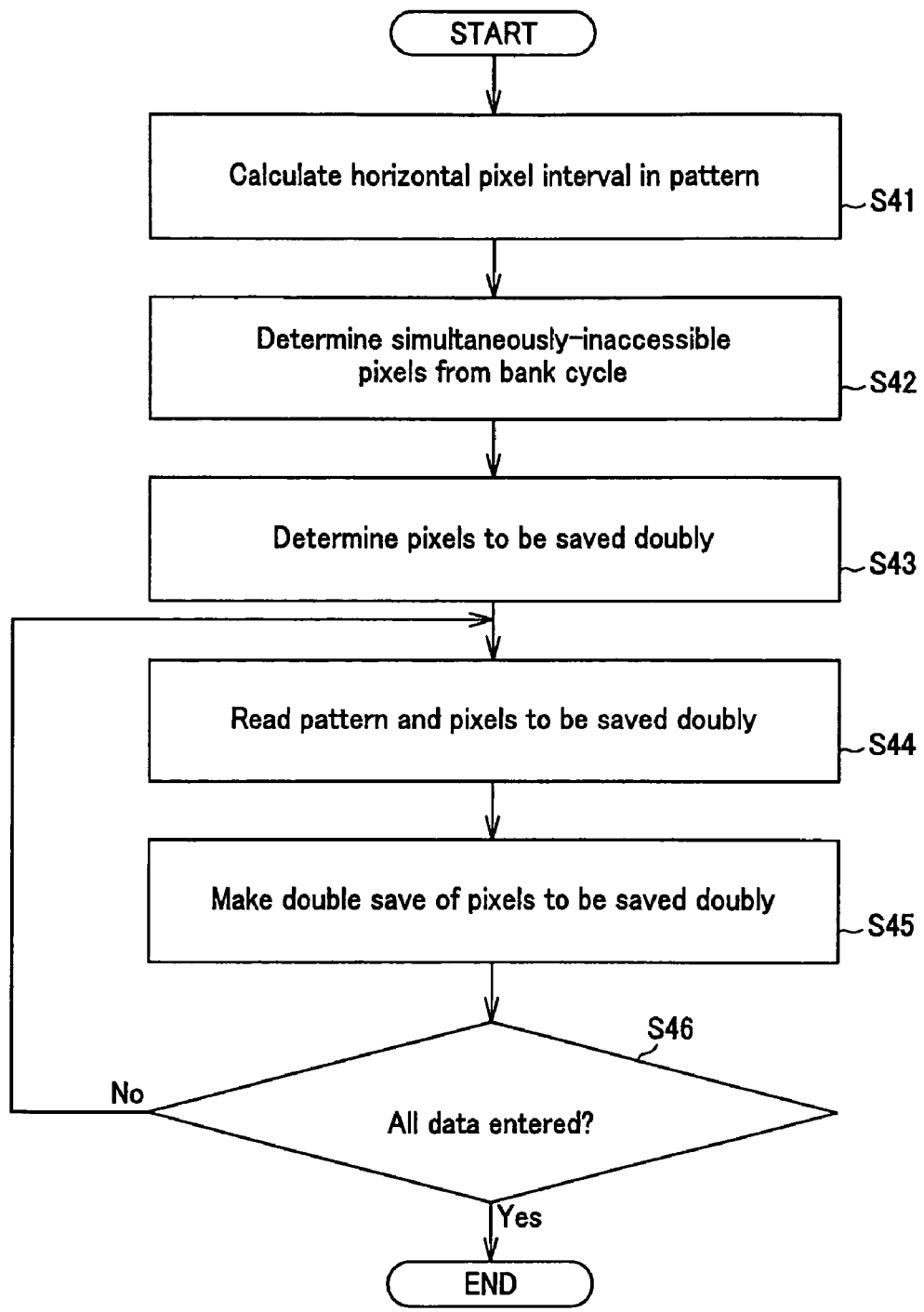
FIG. 34 shows a flow of operations made in double save of the pixels on the horizontal line.
Figure 35A:
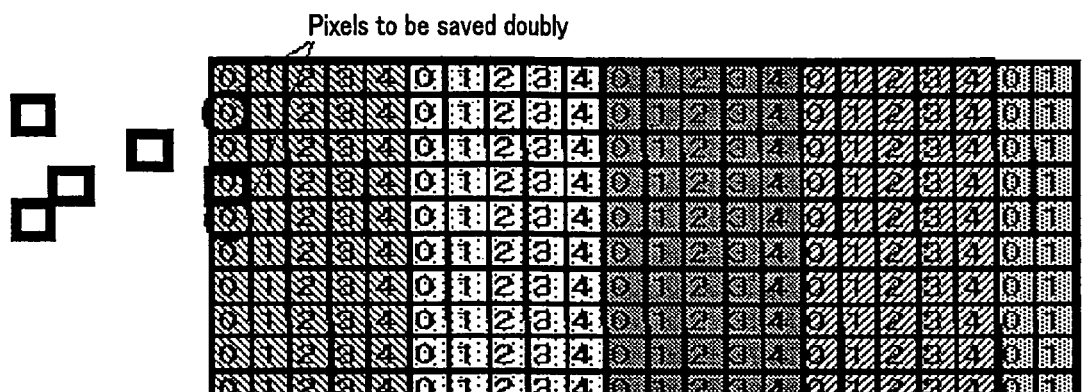
FIGS. 35A to 35F schematically illustrate a managing method in which an area in which pixels are to be saved doubly is fixed.
Figure 35B:
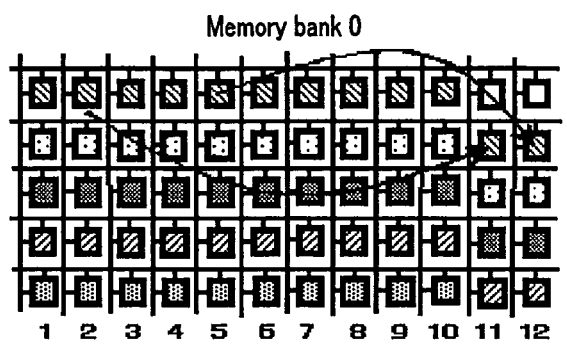
Figure 35C:
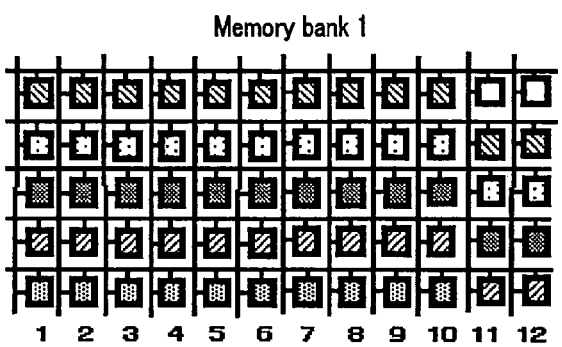
Figure 35D:
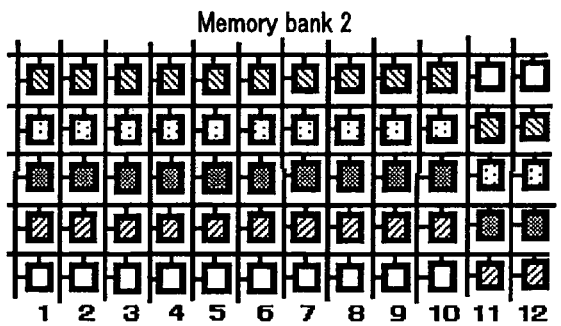
Figure 35E:
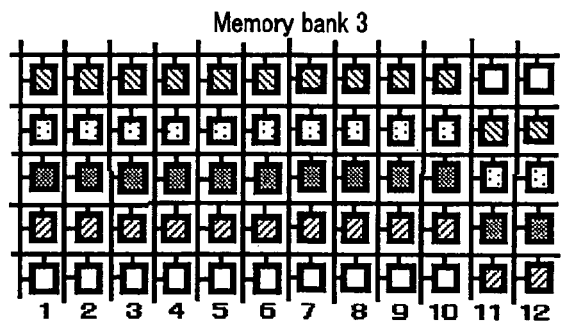
Figure 35F:
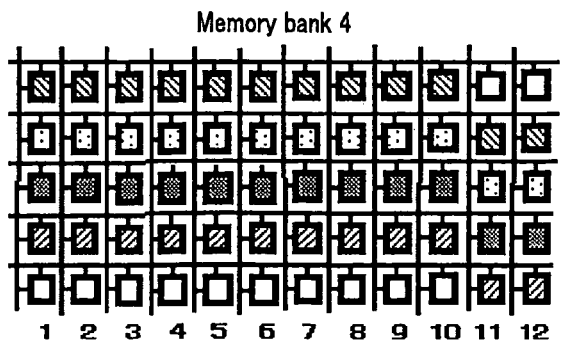
Figure 36A:
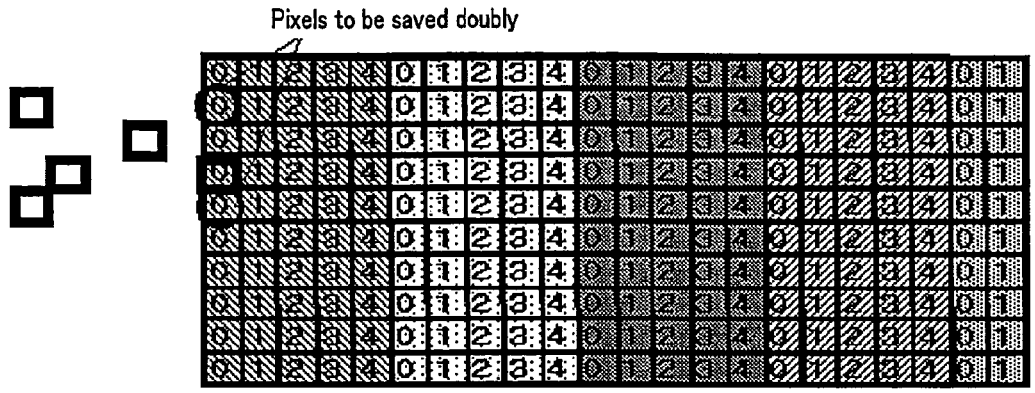
FIGS. 36A to 36F schematically illustrate a managing method in which an area where original data of the doubly-saved data have been is taken as an area for next double save.
Figure 36B:
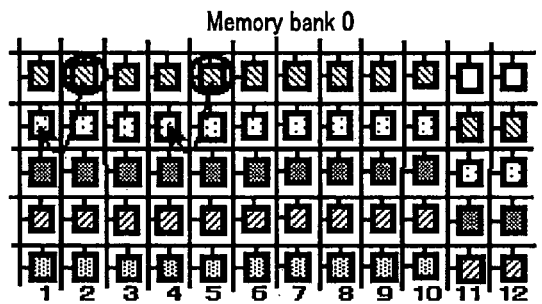
Figure 36C:
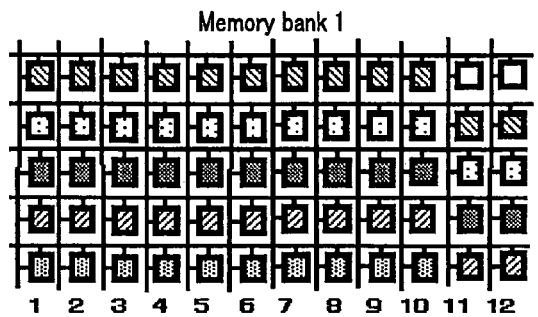
Figure 36D:
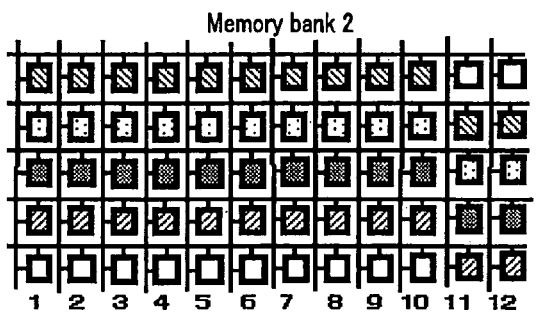
Figure 36E:
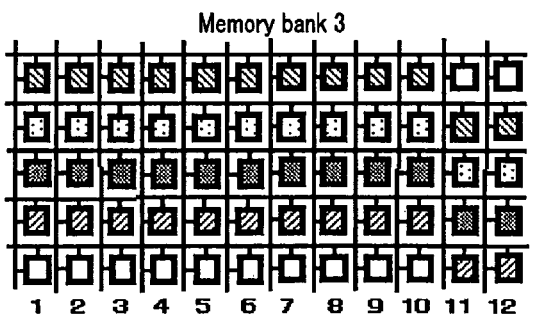
Figure 36F:
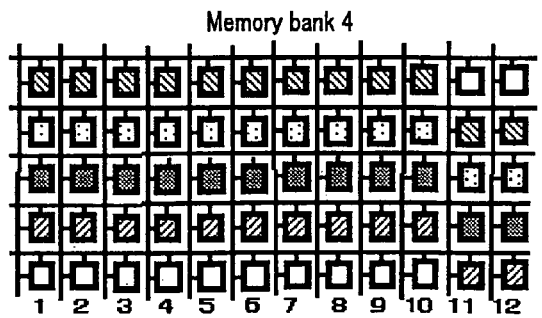
Figure 37A:
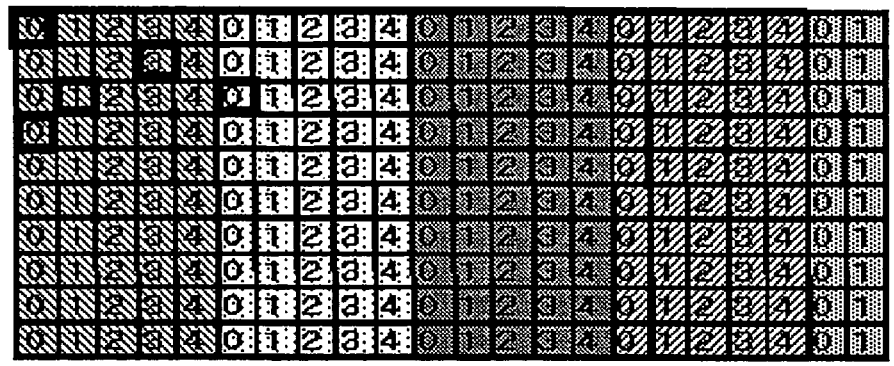
FIGS. 37A to 37F schematically illustrate a state in which data have been returned to an initial word line after accessing doubly-saved data, in order to keep the relation with a position where other data are stored.
Figure 37B:
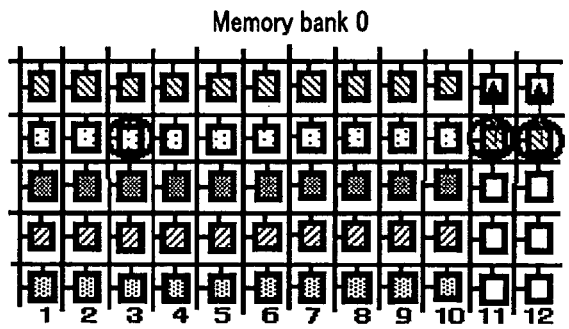
Figure 37C:
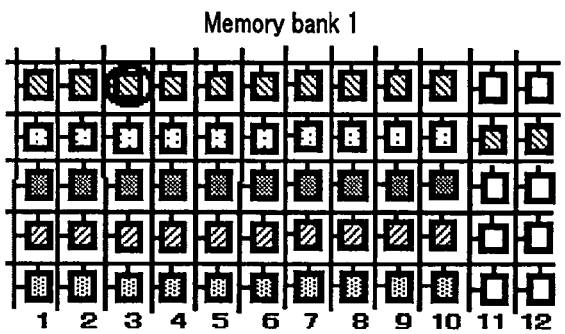
Figure 37D:
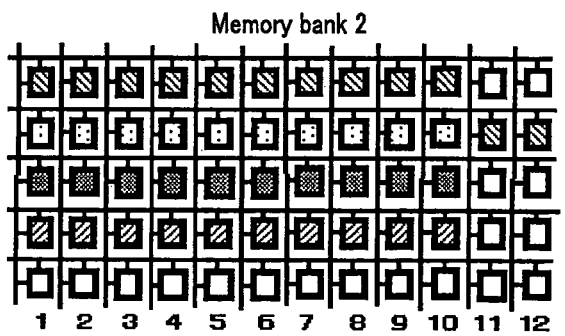
Figure 37E:
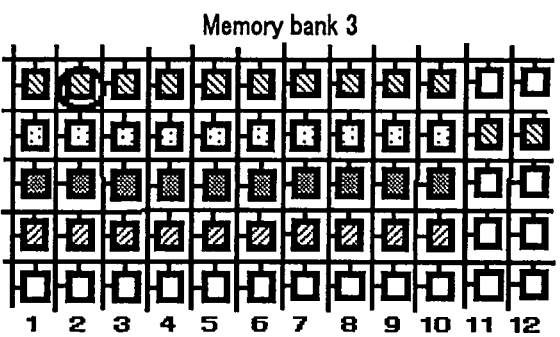
Figure 37F:
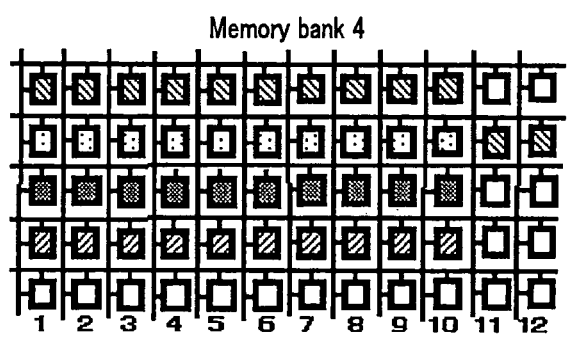

The double save of pixels which could not be accessed simultaneously will be done as will be discussed below with reference to the flow diagram in FIG. 34.

First, a horizontal interval between pixels in a pattern is calculated (in step S41).

Next, pixels, which could not be accessed simultaneously, are determined from the bank period (in step S42).

Then, pixels to be doubly saved are determined (in step S43).

Further, the pattern and pixels to be doubly saved are read (in step S44).

Then, the pixels to be doubly saved are saved doubly (in step S45).

Then it is judged whether all data have been read (in step S46). If the result of judgment is negative (NO), namely, if there remains data yet to be read, the process returns to step S44 where steps S44 to S46 will be repeated until the result of the judgment in step S46 is affirmative (YES). Then, the process is ended.

Next, management of an area where data is doubly saved will be explained. The data saving area is managed in two ways. Namely, the area for double save of data is fixed as shown in FIGS. 35A to 35F, and an area where the original data have been is taken as a next double-save area as shown in FIGS. 36A to 36F.

In case the double-save area is fixed, pixels not simultaneously accessible are always written to that area and read from there. Thus, the double-access area will be accessed frequently. In case the area where the original data of doubly-saved data have been is taken as a next double-save area, the double-save destination is rotated from one to another so that the destinations will be accessed nearly equally. In this case, however, data has to be returned to the original word line as shown in FIGS. 37A to 37F after the doubly-saved data are accessed, in order to keep the relation with the locations where other data are stored.

The bank period for storage of data may be fixed or variable.

In case the bank period is fixed, more pixels cannot be accessed simultaneously depending upon the pattern of them as the case may be. In such a case, more areas are necessary for the double save.

Also, in case the bank period is variable, a period for which least pixels cannot be accessed simultaneously is determined from the horizontal inter-pixel interval in a pixel pattern and data can be stored into banks at every period. Either a fixed period or a variable period may be selected depending upon how many areas are required for the double save or upon an intended application.

Figure 38:
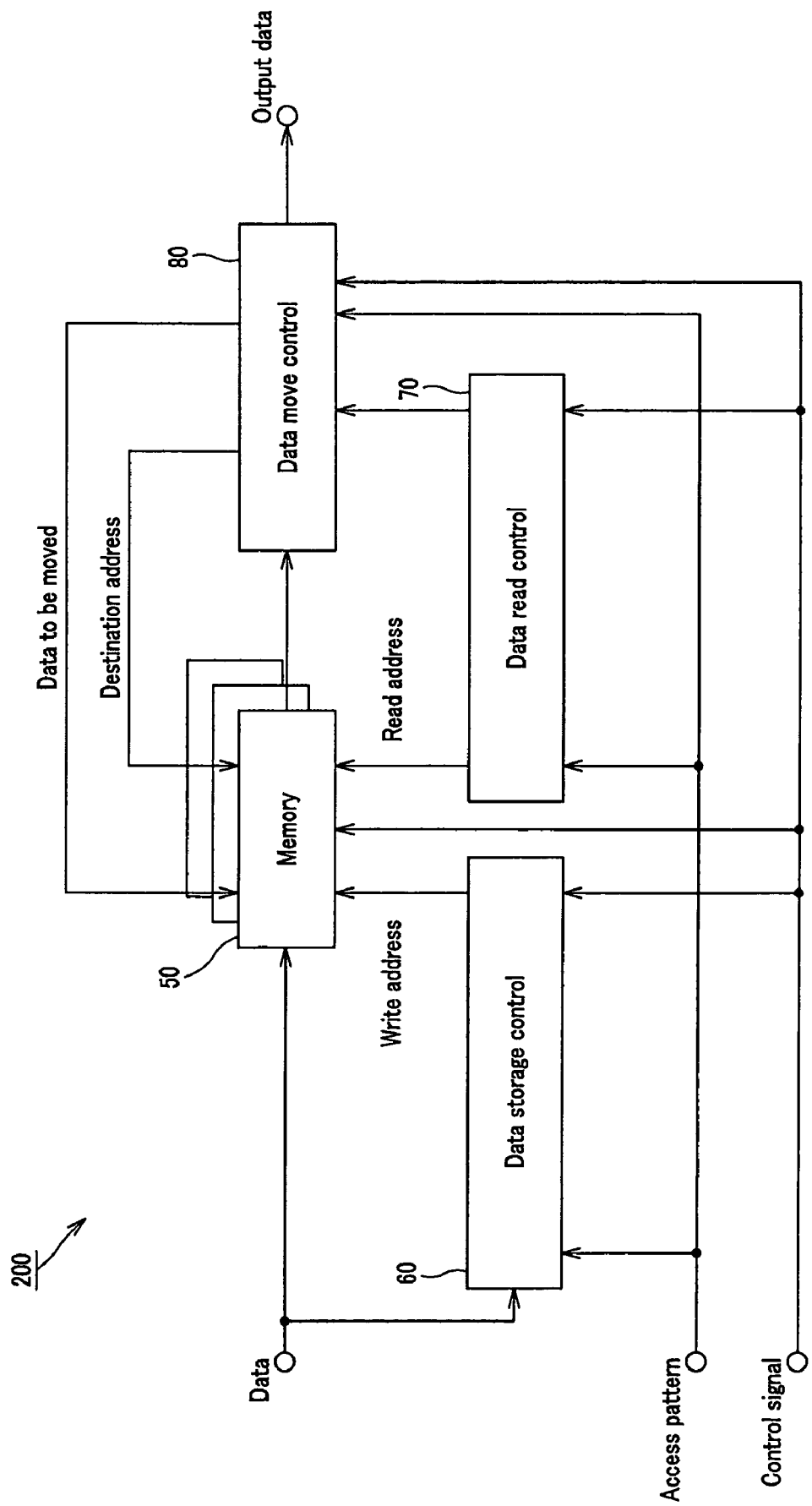
FIG. 38 is a block diagram of another embodiment of the data storage unit according to the present invention.

Next, simultaneous access to a plurality of data is done by a data storage unit 200 configured as shown in FIG. 38 for example.

As shown, the data storage unit 200 includes a memory 50 including a plurality of banks, a data storage controller 60 to write data into the memory 50, a data read controller 70 to read data from the memory 50, and a data move controller 80 to control move of data in the memory 50. Data to be stored will be supplied to the memory 50 and data storage controller 60, and an access pattern representing a plurality of data to simultaneously be read be supplied to the data read controller 70.

Figure 39:
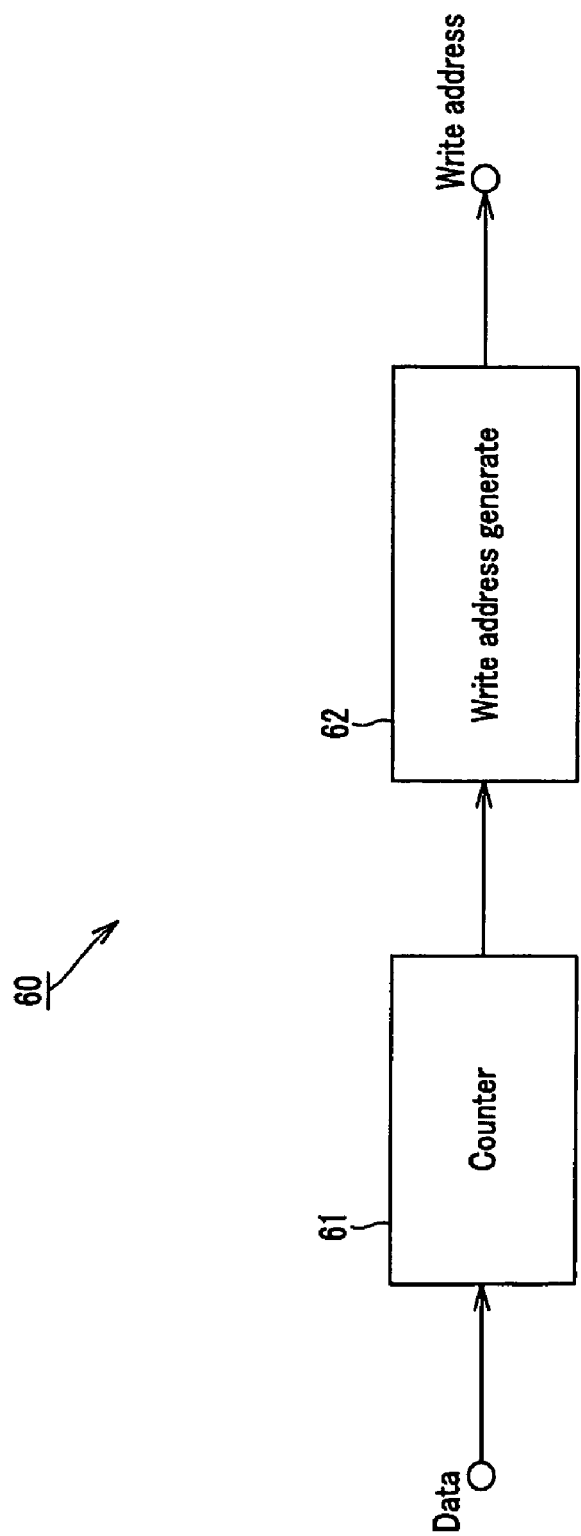
FIG. 39 is also a block diagram of a data storage controller included in the data storage unit in FIG. 38.

As shown in FIG. 39, the data storage controller 60 in the data storage unit 200 includes a counter 61 to count data supplied, and a write address generator 62 to generate write address correspondingly to a count output from the counter 61.

Figure 40:
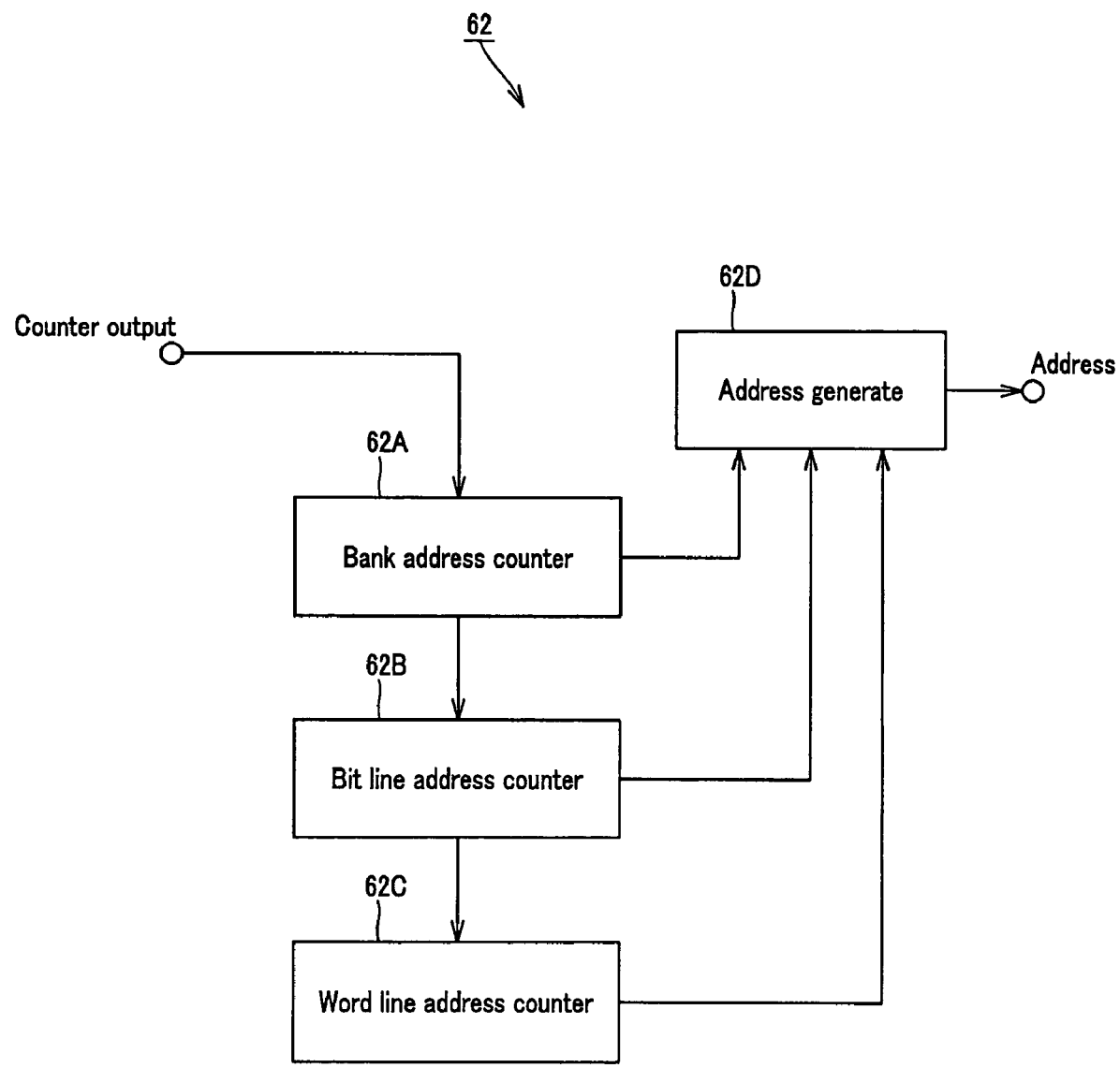
FIG. 40 is a block diagram of a storage address generator included in the data storage unit in FIG. 38.

As shown in FIG. 40, The write address generator 62 includes a bank address counter 62A which is incremented with an output from the counter 61, a word line address counter 62B which is incremented with an output from the bank address counter 62A, a bit line address counter 62C which is incremented with an output from the word line address counter 62B, and an address generator 62D to generate write address on the basis of the outputs from the counters 62A, 62B and 62C.

Figure 41:
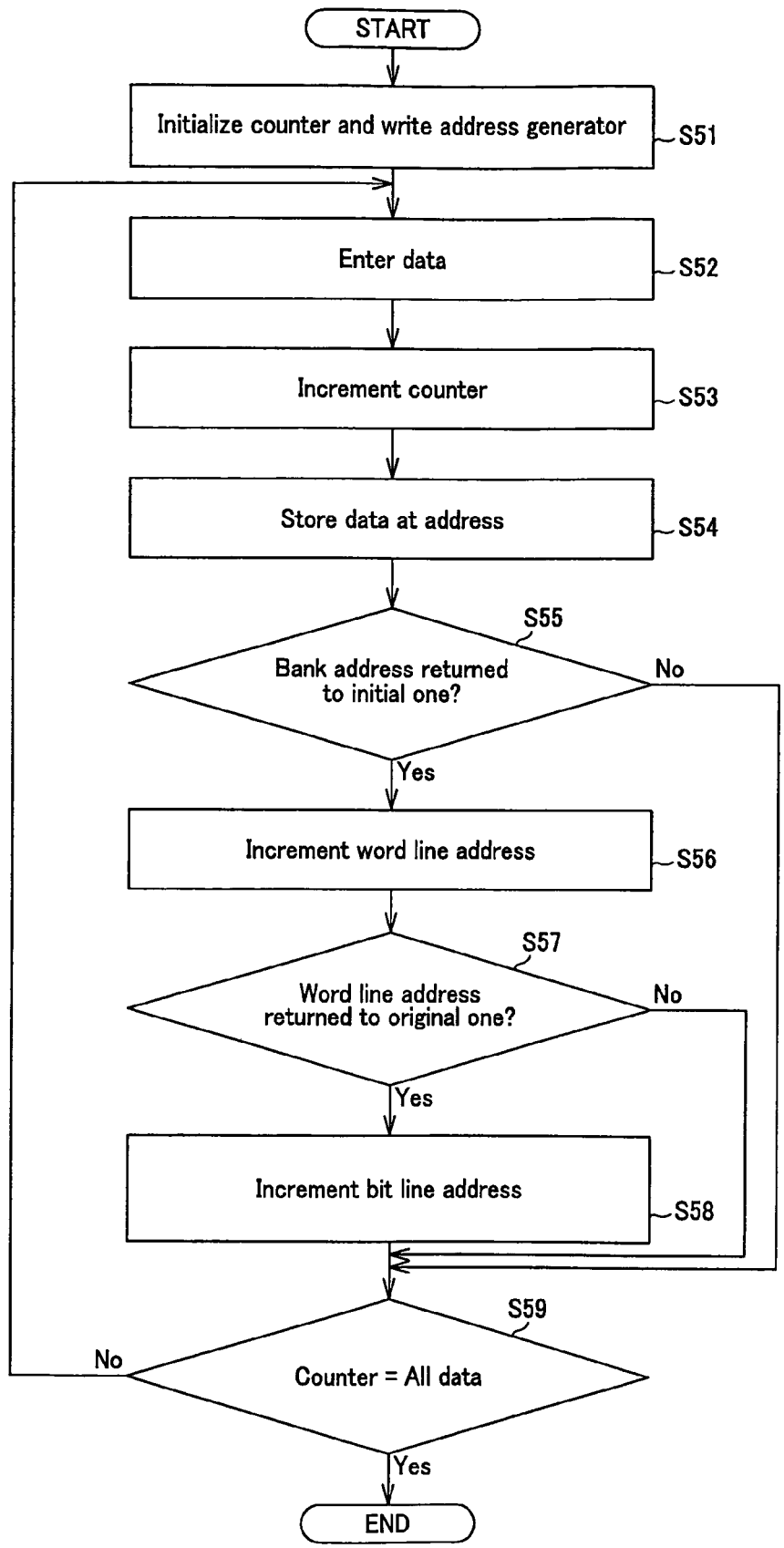
FIG. 41 shows a flow of operations made in a process of data storage in the data storage controller in FIG. 39.

In this data storage unit 200, the data storage controller 60 configured as above stores, following the procedure in the flow diagram in FIG. 41, all data sequentially onto the word lines in the memory banks of the memory 50 with the data being divided among the word lines. Each range of data storage on the word line is limited to a smaller number of data than that of data storable on one word line.

More particularly, when a control signal for storage of data is supplied to the data storage unit 200, the data storage controller 60 is put into operation. First, it will initialize the counter 61 and write address generator 62 (in step S51).

Accepting input data (in step S52), the data storage controller 60 increments the counter 61 (in step S53), and stores data into the memory 50 according to the write address supplied from the write address generator 62 (in step S54).

Then, the data storage controller 60 judges whether a bank address whose period is the number of banks from the band address counter 62A has returned to the original one (in step S55). If the result of the judgment in step S55 is negative (NO), the data storage controller 60 goes to step S59. If the result of the judgment in step S55 is affirmative (YES), that is, if the bank address has returned to the original one, the data storage controller 60 will increment the word line address counter 62B (in step S56).

Then, the data storage controller 60 judges whether the word line address whose period is the number of word lines from the word line counter 62B has returned to the original one (in step S57). If the result of the judgment in step S57 is negative (NO), the data storage controller 60 goes to step S59. If the result of the judgment in step S57 is affirmative (YES), namely, if the word line address has returned to the original one, the data storage controller 60 will increment the bit line address counter 62C (in step S58).

Further in step S59, the data storage controller 60 judges whether the count output from the counter 61 is equal to the total number of data to be stored into the memory 50. If the result of judgment is negative (NO), the data storage controller 60 returns to step S52 where it will repeat steps S52 to S59 to store data into the memory 50. If the result of the judgment in step S59 is affirmative (YES), the data storage controller 60 will exit the data storage process.

Figure 42:
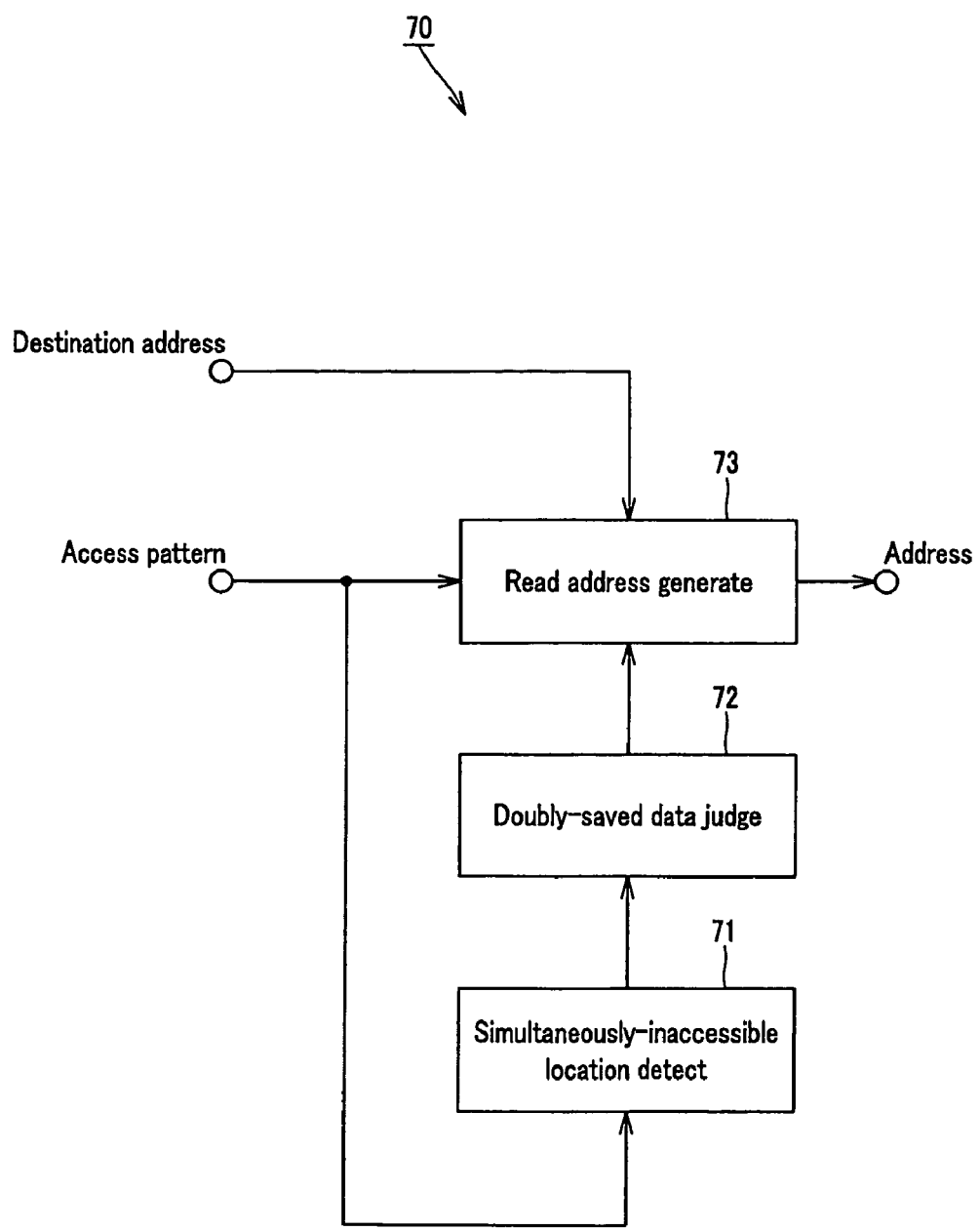
FIG. 42 is also a block diagram of a data read controller included in the data storage unit in FIG. 38.

As shown in FIG. 42, the data read controller 70 in the data storage unit 200 includes a simultaneously-inaccessible location detector 71, doubly-saved data judgment unit 72 and a read address generator 73. The access pattern is supplied to the simultaneously-inaccessible location detector 71 and read address generator 73, which are also supplied with a destination address from the data move controller 80.

Figure 43:
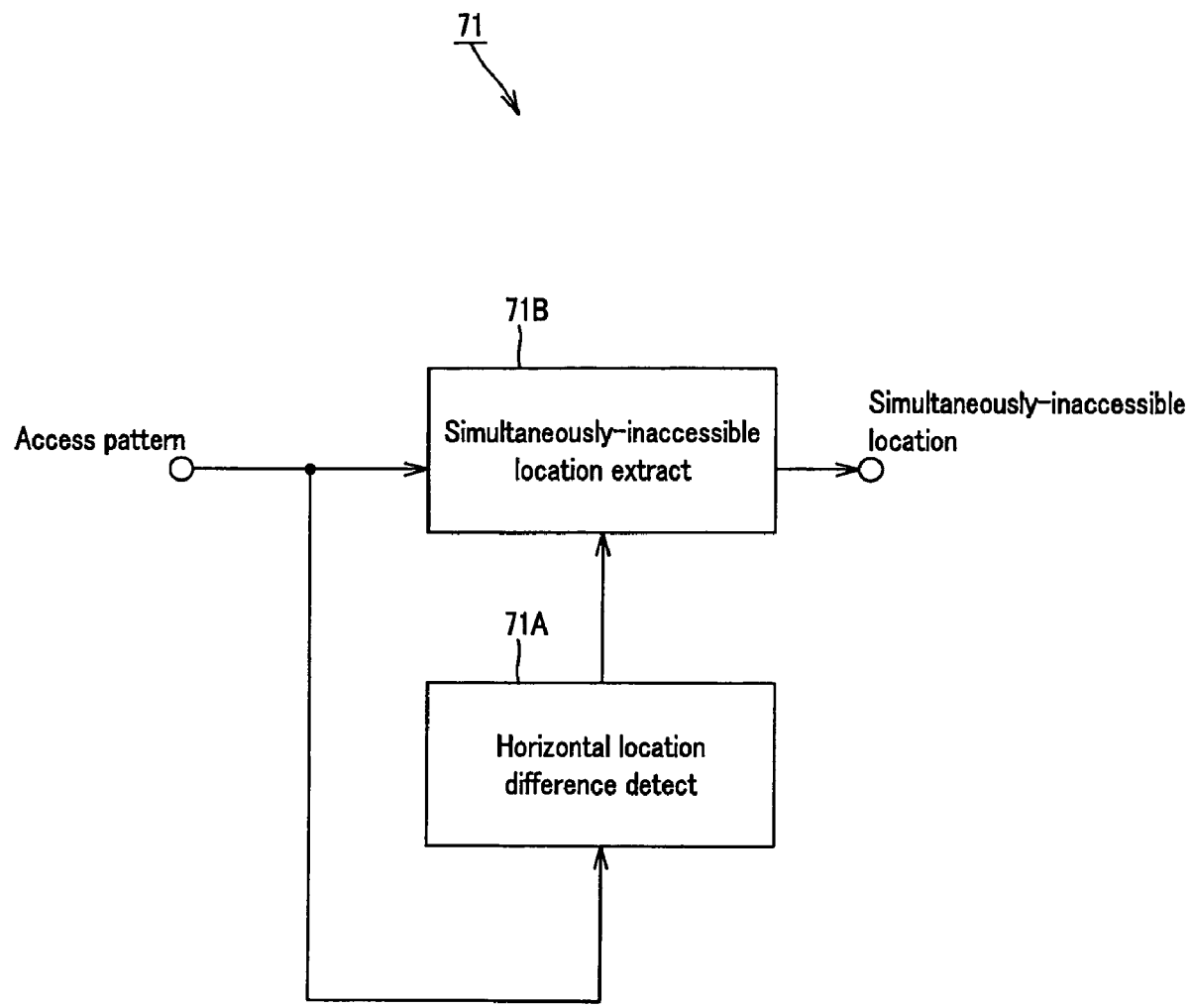
FIG. 43 is a block diagram of a simultaneous-inaccessible location detector included in the data read controller in FIG. 42.

As shown in FIG. 43, the simultaneously-inaccessible location detector 71 includes a horizontal location difference calculator 71A and simultaneously-inaccessible location extraction unit 71B. The simultaneously-inaccessible location detector 71 is configured to control the horizontal location difference calculator 71A to calculate a horizontal location difference from an access pattern, and the simultaneously-inaccessible location extraction unit 71B to extract a simultaneously-inaccessible location in the access pattern on the basis of the horizontal location difference value from the horizontal location difference calculator 71A.

Figure 44:
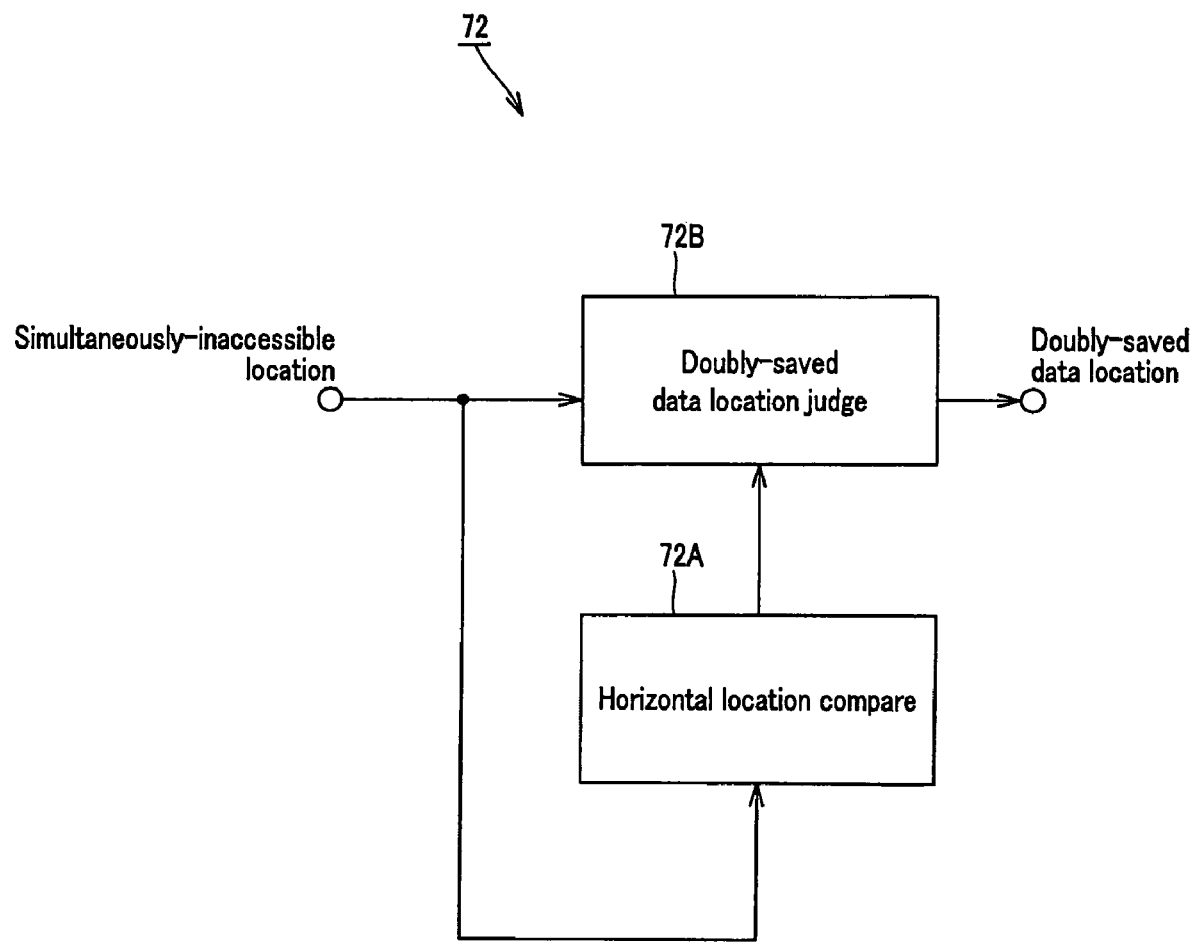
FIG. 44 is also a block diagram of a doubly-saved data judgment unit included in the data read controller in FIG. 42.

As shown in FIG. 44, the doubly-saved data judgment unit 72 includes a horizontal location comparator 72A and doubly-saved data location judgment unit 72B, which are supplied with a simultaneously-inaccessible location detected by the simultaneously-inaccessible location detector 71. The doubly-saved data judgment unit 72 is configured to control the doubly-saved data location judgment unit 72B to take, as a doubly-saved data location, a simultaneously-inaccessible location at the left on the basis of a comparison output from the horizontal location comparator 72A.

Figure 45:
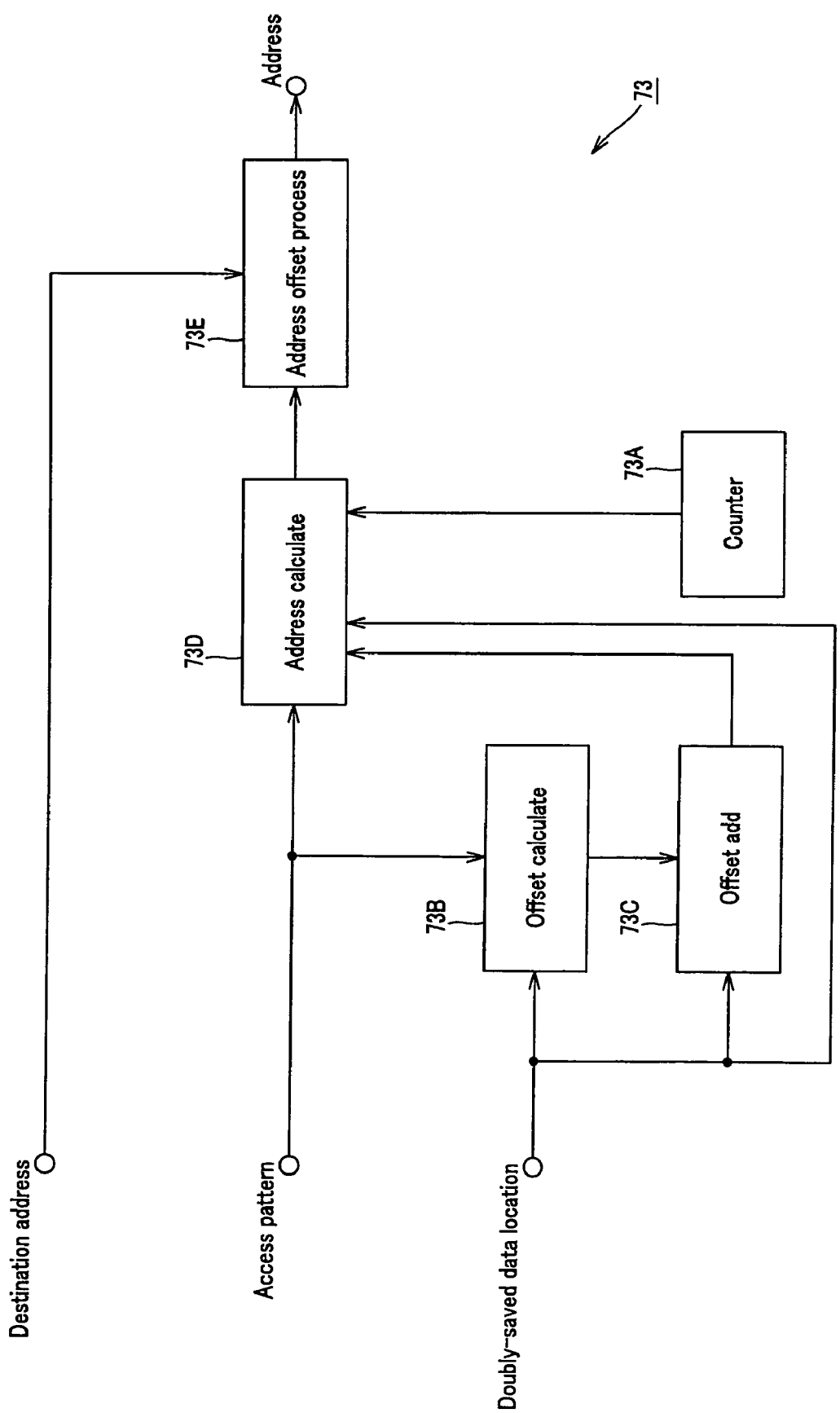
FIG. 45 is a block diagram of a read address generator included in the data read controller in FIG. 42.

As shown in FIG. 45, the read address generator 73 further includes a counter 73A, an offset calculator 73B, offset adder 73C and address calculator 73D, which are supplied with a doubly-saved data location from the doubly-saved data location judgment unit 72, and an address offset processor 73E which is supplied with a destination address from the data move controller 80. With an access pattern being supplied to the offset calculator 73B and address calculator 73D, the read address generator 73 will control the address calculator 73D to output a read address generated from an output from the counter 73A on the basis of the access pattern, doubly-saved data location and an output from the offset adder 73C via the address offset processor 73E.

Figure 46:
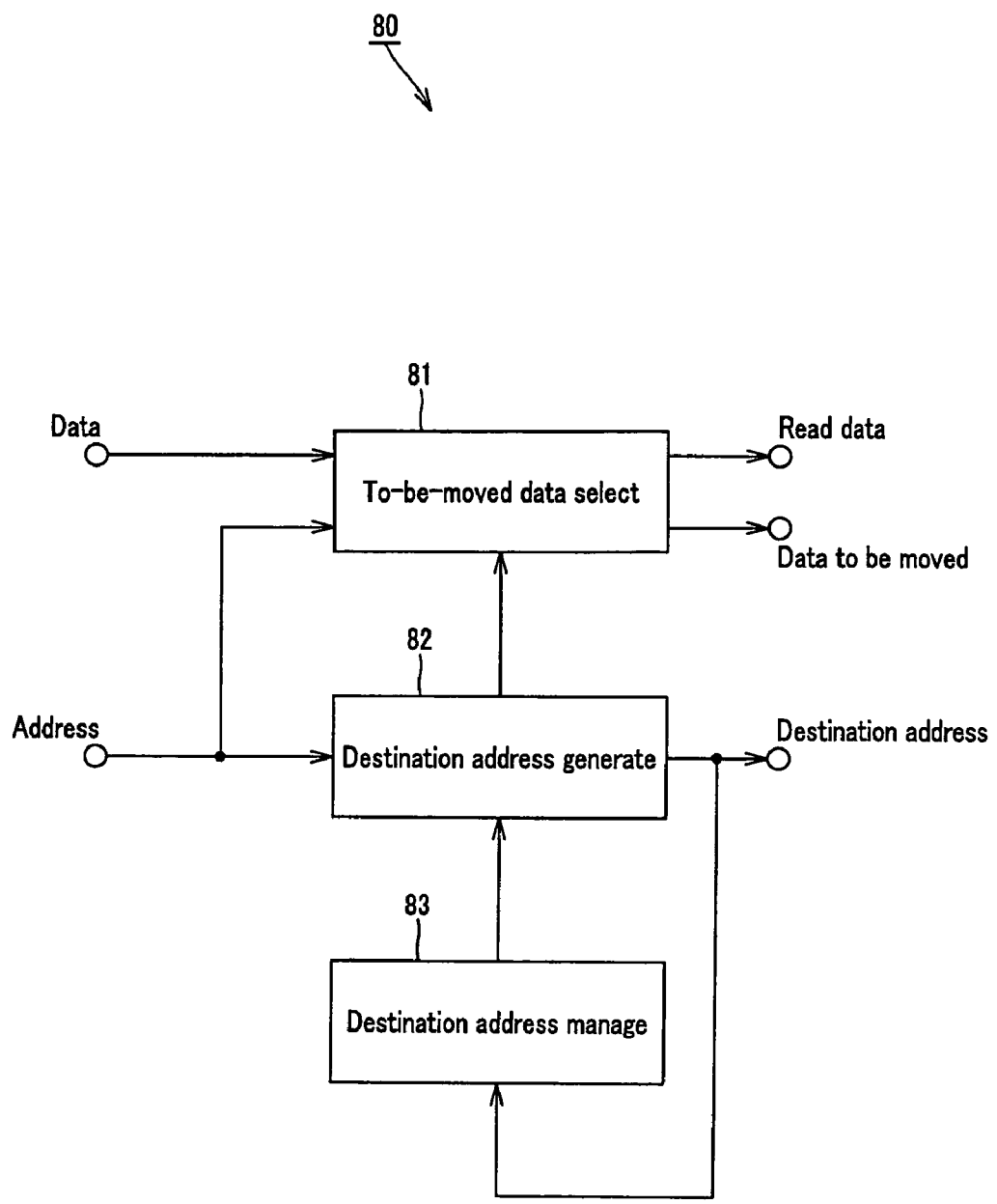
FIG. 46 is also a block diagram of a data move controller included in the data storage unit in FIG. 38.

As shown in FIG. 46, the data move controller 80 in the data storage unit 200 includes a to-be-moved data selector 81, destination address generator 82 and a destination address manager 83. Data read from the memory 50 is supplied to the to-be-moved data selector 81, and address generated by the read address generator 73 is supplied to the to-be-moved data selector 81 and destination address generator 82.

The to-be-moved data selector 81 outputs data read from the memory 50, selects, from the output data, data to doubly be saved as to-be-moved data, and supplies the data to the memory 50.

Also, the destination address generator 82 generates a destination address where the to-be-moved data is to be stored on the basis of a read address generated by the read address generator 73, and supplies the destination address to the memory 50. The destination address generated by the destination address generator 72 is managed by the destination address manager 83 which is supplied with the destination address.

Figure 47:
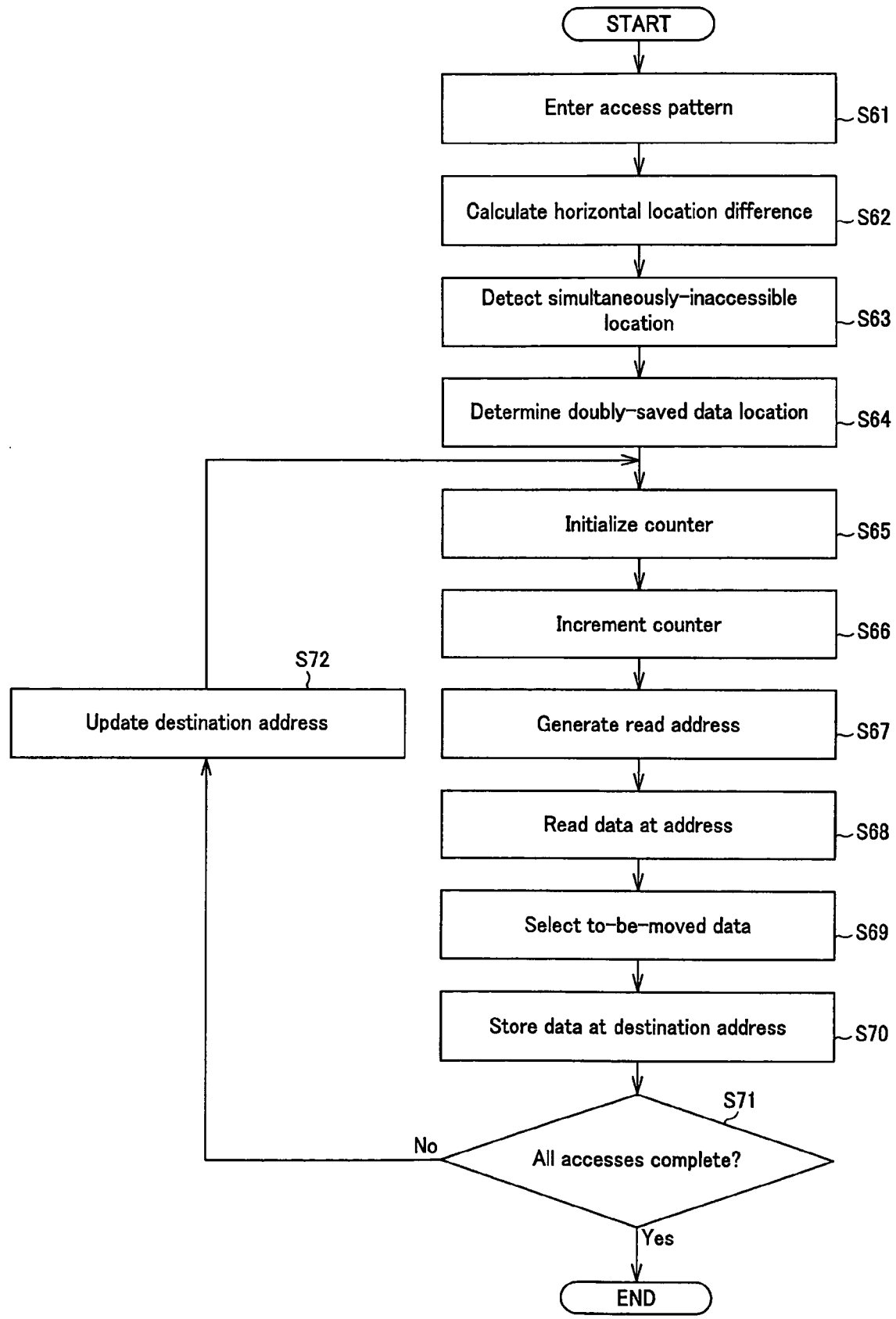
FIG. 47 shows a flow of operations made in data reading and double save effected in the data read controller in FIG. 42 and data move controller in FIG. 46 in the data storage unit.

In the data storage unit 200, the data read controller 70 and data move controller 80, configured as above, read data from the memory 50 and save the data doubly according to the procedure shown in the flow diagram in FIG. 47.

When the data storage unit 200 is supplied with a control signal for data reading, the data read controller 70 and data move controller 80 are put into operation. Upon accept of an access pattern (in step S61), the data read controller 70 controls the simultaneously-inaccessible location detector 71 to calculate a horizontal location difference (in step S62) and detect a simultaneously-inaccessible location (in step S63), and the doubly-saved data judgment unit 72 to determine a doubly-saved data location (in step S64).

Then, the data read controller 70 initializes the counter 73A in the read address generator 73 (in step S65), increments the counter 73A (in step S66), generates a data read address (in step S67) and reads data from the memory 50 according to the data read address (in step S68).

Next, the data move controller 80 selects to-be-moved data (in step S69) and stores the data at a destination address in the memory 50 (in step S70).

Further, the data read controller 70 judges whether all data have been accessed (in step S71). If the result of judgment is negative (NO), the data read controller 70 will update the destination address (in step S72) and return to step S66 where it will repeat steps S66 to S71 until the result of the judgment in step S71 is affirmative (YES). Then, the data read controller 70 will exit the data reading and double storage process.

Note that in the data storage unit 200, the data storage controller 60, data read controller 70 and data move controller 80 may be formed from a microprocessor, for example, and data storage, simultaneous read and double storage may be done according to a data storage controlling program stored in a program memory (not shown).

Further, the present invention will be described in detail concerning still another embodiment thereof.

Figure 48:
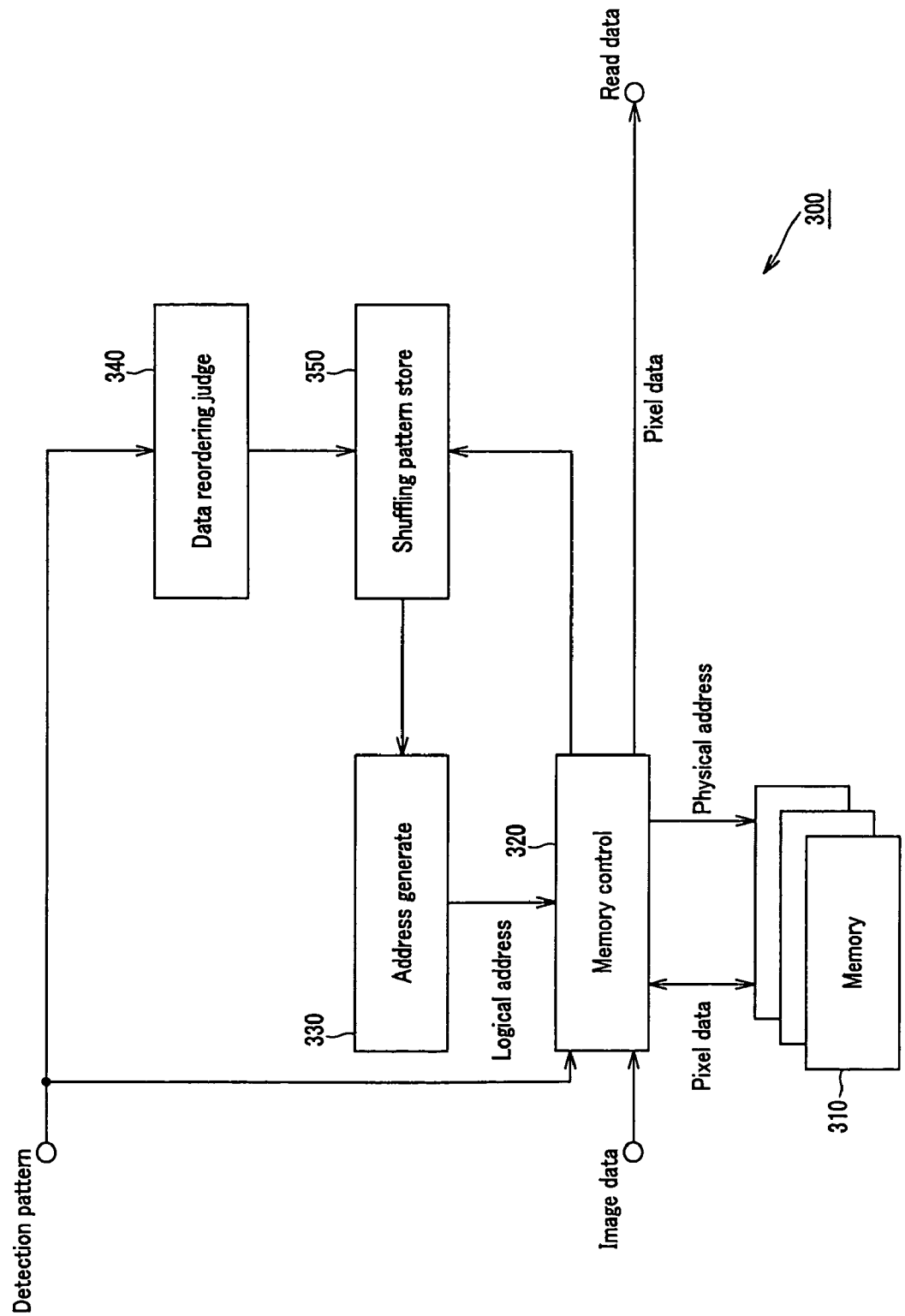
FIG. 48 is a block diagram of still another embodiment of the data storage unit according to the present invention.

This embodiment is applied to a data storage unit 300 as shown in FIG. 48 for example.

The data storage unit 300 includes a semiconductor memory 310 formed from a plurality of banks, a memory controller 320 connected to the semiconductor memory 310 including the plurality of banks, and an address generator 330, reordering judgement unit 340 and shuffling pattern storage unit 350, connected to the memory controller 320.

In this data storage unit 300, image data is supplied to the memory controller 310 and a detection pattern specifying an object data pattern included in the image data is supplied to the memory controller 320 and reordering judgment unit 340.

The address generator 330 generates a logical address corresponding to an address in the image, and supplies it to the memory controller 320.

Also, the reordering judgment unit 340 judges data reordering about the supplied detection pattern, and supplies a reorder rule to the shuffling pattern storage unit 350.

Further, the shuffling pattern storage unit 350 supplies a reordering pattern to the memory controller 310 according to the reorder rule supplied from the reordering judgment unit 320.

The memory controller 320 reorders the image data according to the reordering pattern supplied from the shuffling pattern storage unit 350, writes the reordered image data into the semiconductor memory 310, and converts the logical address supplied from the address generator 330 into a physical address for the semiconductor memory 310 according to the reordering pattern, thereby reading a plurality of data simultaneously from the semiconductor memory 310.

In this data storage unit 300, the memory controller 320 makes it possible to read a plurality of data from the semiconductor memory 310 according to the reordering pattern supplied from the shuffling pattern storage unit 350 by changing the method of data write to the semiconductor memory 310 in advance according to the distribution of the plurality of image data to be read simultaneously from the semiconductor memory 310.

In this data storage unit 300, a plurality of pixel data can be read simultaneously by changing the method of write to the semiconductor memory 310 in advance according to the plurality of pixel data to be read simultaneously from the semiconductor memory 310. The plurality of pixel data can be read simultaneously without dependence upon the position of the reference area.

The method of data storage in this data storage unit 300 will be described herebelow.

For the better understanding, it is assumed here that image data is in one-dimensional array and a plurality of pixel data is read simultaneously from the one-dimensional array. Explanation of the simultaneous read of a plurality of pixel data from one-dimensional array will be followed by explanation of simultaneous read of a plurality of pixel data from two-dimensional array.

FIGS. 49A to 49C and FIGS. 50A to 50C show a method of data storage in which it is assumed that the size of a reference area REF is "4", number of pixel data to be read simultaneously is "2" and number of memory banks is "2".

Figure 49A:
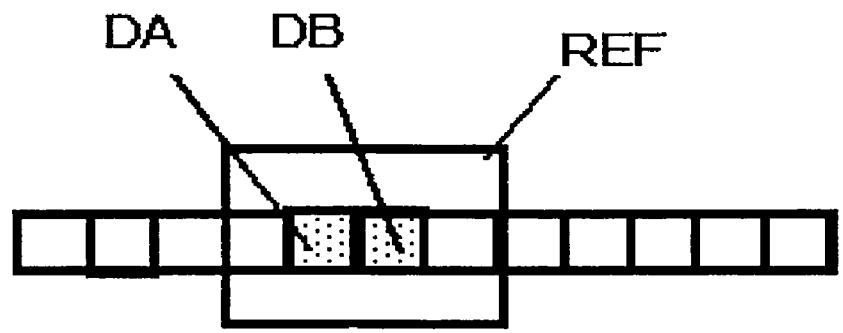
FIGS. 49A to 49C schematically illustrate a method of storing data when the size of reference area is "4", number of pixel data to be read simultaneously is "2" and number of memory banks in the memory is "2" on the assumption that reference data are listed horizontally.
Figure 49B:
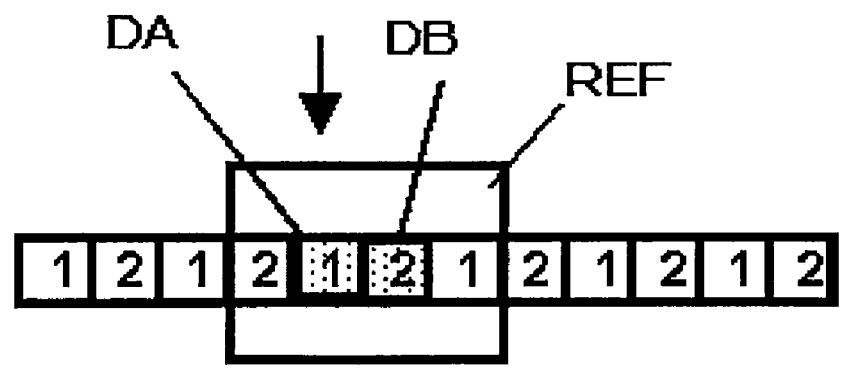
Figure 49C:
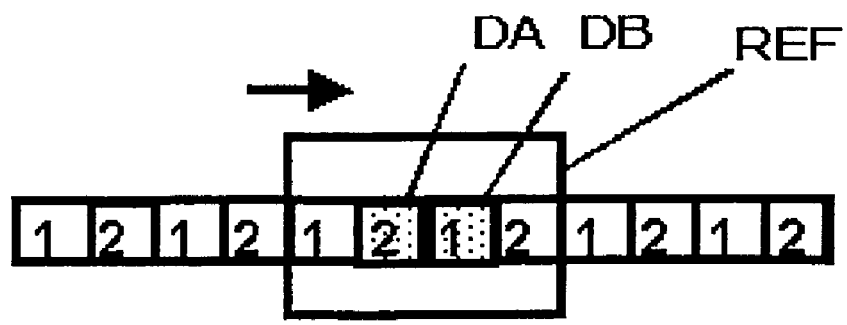

In case two reference data DA and DB are horizontally juxtaposed with each other as shown in FIG. 49A, image data are stored in the order of bank numbers [1] and [2], that is, alternately into each bank, as shown in FIG. 49B. Thus, the two reference data DA and DB will always be stored into different banks, respectively, independently of the position of the reference area REF. So, the two reference data DA and DB can be read simultaneously as shown in FIG. 49C.

Figure 50A:
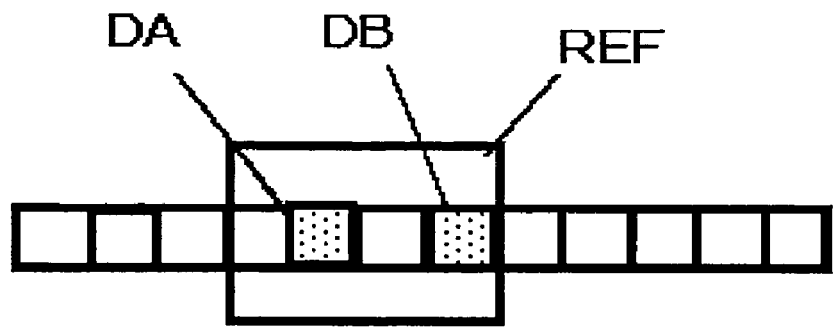
FIGS. 50A to 50C schematically illustrate the method of storing data when the size of reference area is "4", number of pixel data to be read simultaneously is "2" and number of memory banks in the memory is "2" on the assumption that reference data are listed alternately.
Figure 50B:
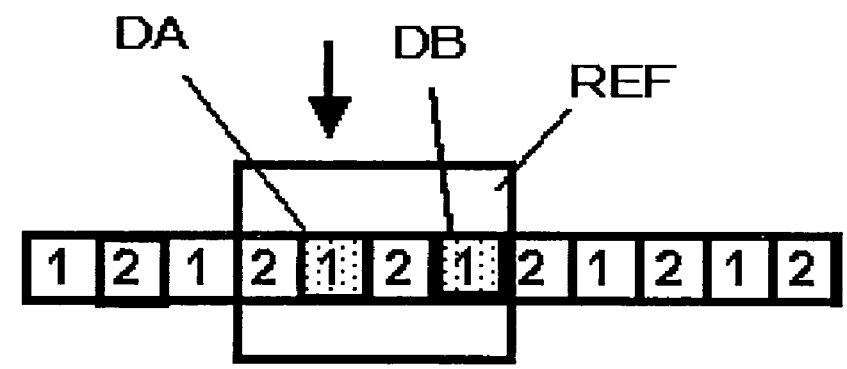
Figure 50C:
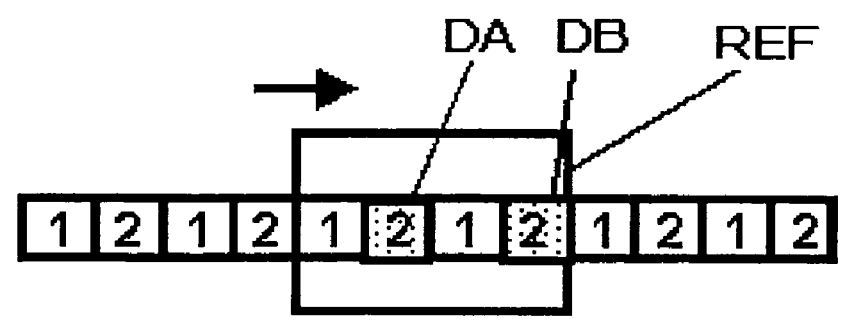

In case two reference data DA and DB are alternately positioned as shown in FIG. 50A, image data are stored in the order of bank numbers [1],[1], [2] and [2], namely, two times alternately into respective banks, as shown in FIG. 50B. Thus, the two reference data DA and DB can be read simultaneously. Even in case the reference area REF is shifted as shown in FIG. 50C, the image data can be read simultaneously as in FIGS. 49A to 49C.

Conventionally, the reading of data as above needs four memory banks, but the present invention enables such reading with only two memory banks.

Figure 51:
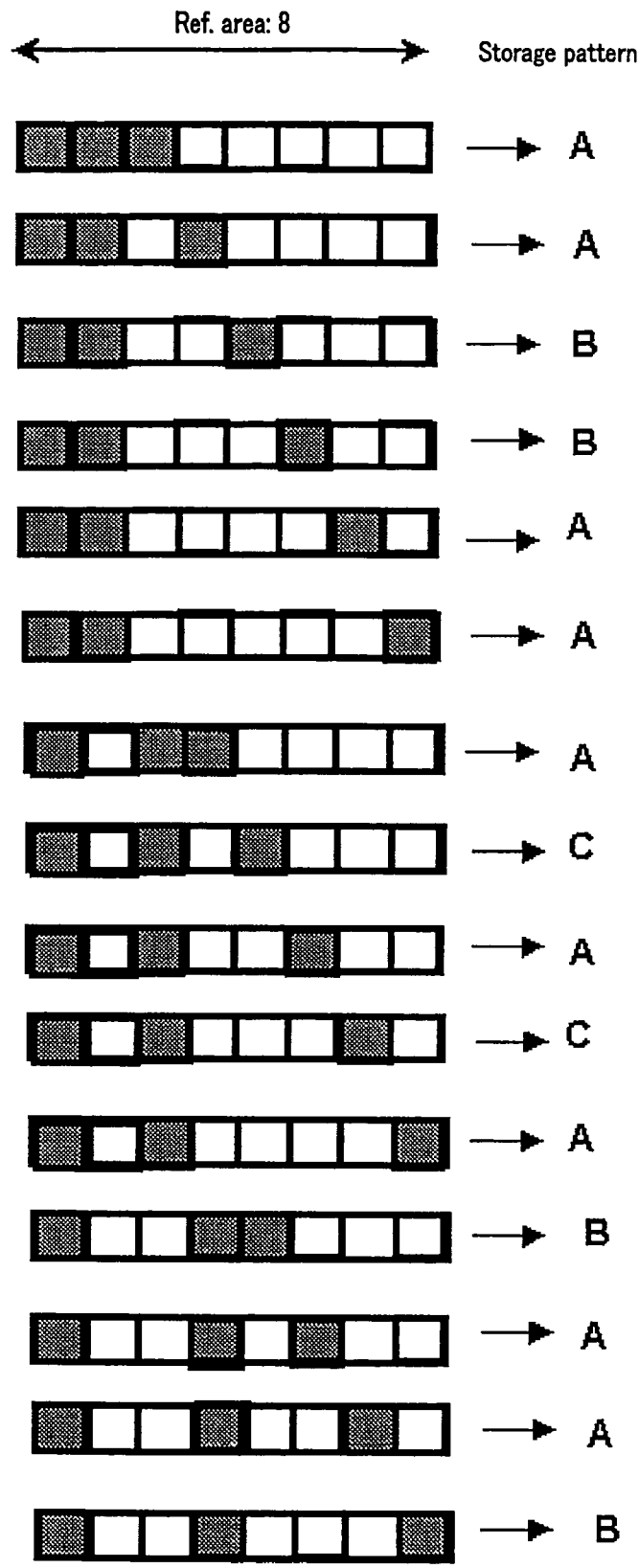
FIG. 51 is a schematic illustration of the method of storing data on the assumption that the size of reference area is "8", number of reference data is "3" and number of memory banks is "4"

Further, FIG. 51 shows a method of data storage in which it is assumed that the size of the reference area REF is "8", number of reference data is "3" and number of memory banks is "4".

In this case, there are available methods of storing appropriate data according to the distribution of the reference data. The methods include three corresponding to storage patterns A, B and C, respectively, as shown in Table 1. Also, even if the reference data are rotated within the reference area REF, the method of data storage will not have to be changed.

TABLE 1

| Storage pattern | Bank number |
| --- | --- |
| A | 12341234 |
| B | 12123434 |
| C | 11223344 |

That is, according to the storage pattern A, image data are stored in banks whose numbers are [1], [2], [3], [4], [1], [2], [3] and [4], respectively, thereby permitting simultaneous read of four reference data.

According to the storage pattern B, image data are stored in banks whose numbers are [1], [2], [1], [2], [3], [4], [3] and [4], respectively, thereby permitting simultaneous read of the four reference data.

According to the storage pattern C, image data are stored in banks whose numbers are [1], [1], [2], [2], [3], [3], [4] and [4], respectively, thereby permitting simultaneous read of the four reference data.

Figure 52:
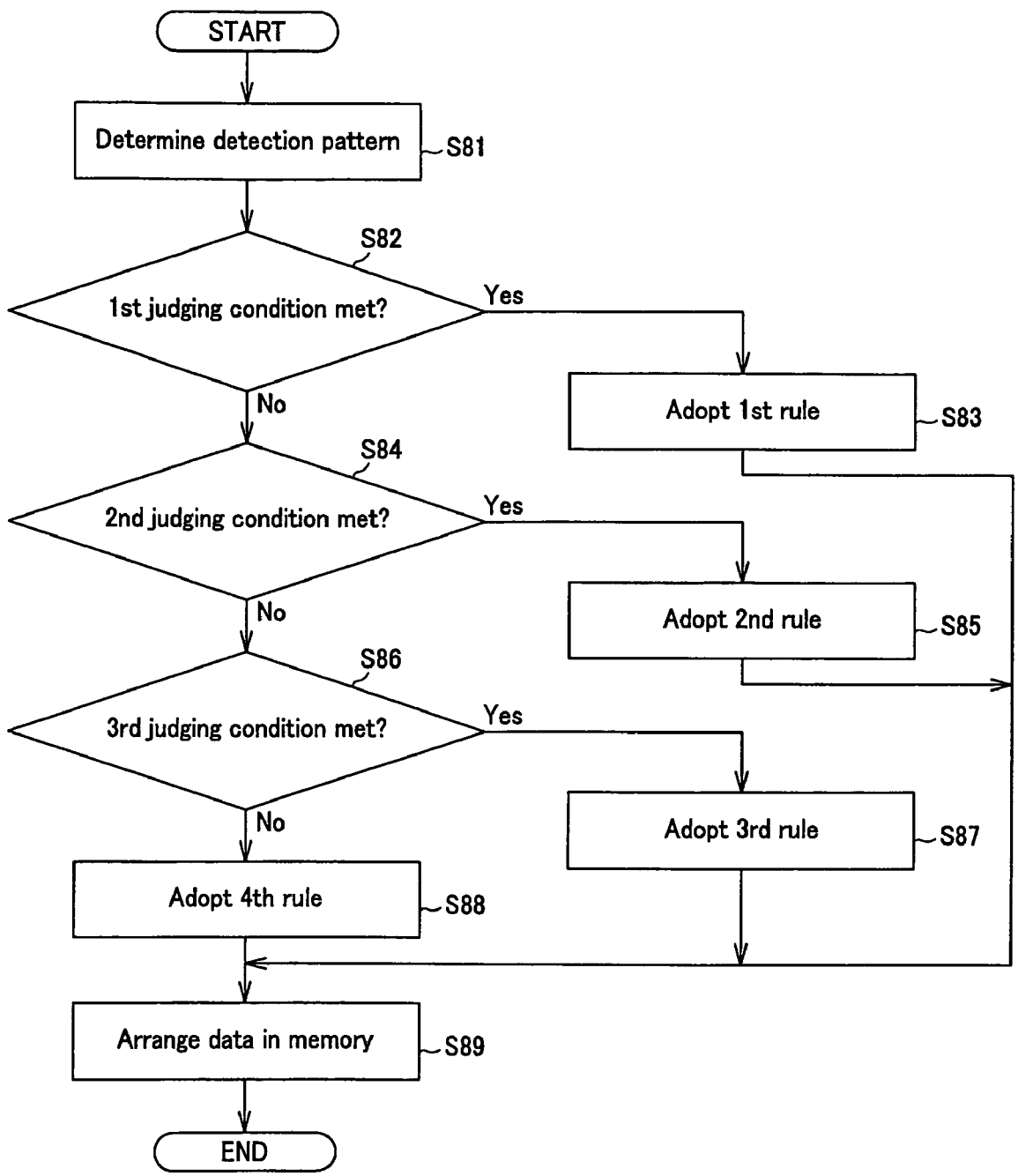
FIG. 52 shows a flow of operations made in storage of image data into the memory in the data storage unit.

Note that in the data storage unit 300, the memory controller 310 may be formed from a microprocessor for example and image data may be stored into the semiconductor memory 310 according to a data storage controlling program stored in a program memory (not shown) as will be described below with reference to the flow diagram in FIG. 52.

That is, the memory controller 320 first determines a detection pattern (in step S81) and judges whether the detection pattern meets the first judging condition (in step S82).

Figure 53:
FIG. 53 is a schematic illustration of judgment under a condition 1 in storage of the image data.
Figure 53:
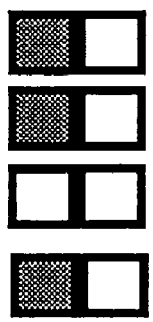
Figure 53:

The judgment under the judging condition 1 in step S82 is effected following the steps 1 to 3 as schematically illustrated in FIG. 53.

Step 1: Distribution of reference data is quartered and divisions are positioned vertically.

Step 2: Reference data in vertical line are measured.

Step 3: It is judged based on the result of measurement whether reference data exists in only one of the reference areas in pair.

If the result of the judgment in step S82 is affirmative (YES), a first storage rule is adopted (in step S83) and image data are stored into the semiconductor memory 310 according to the storage pattern A (in step S89).

If the result of the judgment in step S82 is negative (NO), a next storage rule is adopted for the judgment (in step S84).

Figure 54:
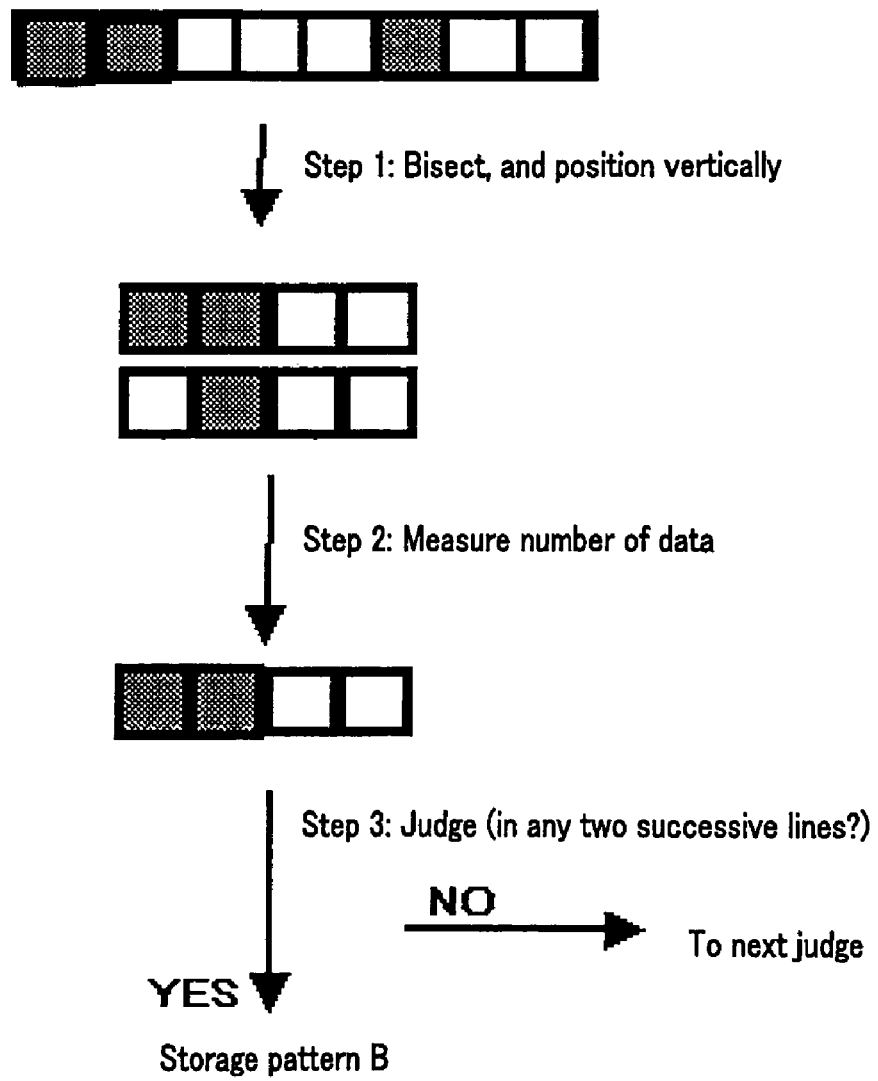
FIG. 54 is a schematic illustration of judgment under a condition 2 in storage of the image data.

The judgment under the judging condition 2 in step S84 is effected following the steps 1 to 3 as schematically illustrated in FIG. 54.

Step 1: Distribution of reference data is bisected and divisions are positioned vertically.

Step 2: Reference data in vertical line are measured.

Step 3: It is judged based on the result of measurement whether reference data exists in only two lines.

If the result of the judgment in step S84 is affirmative (YES), the first storage rule is adopted (in step S85) and image data are stored into the semiconductor memory 310 according to the storage pattern B (in step S89).

If the result of the judgment in step S84 is negative (NO), a next storage rule 3 is adopted for the judgment (in step S86).

Figure 55:
FIG. 55 is a schematic illustration of judgment under a condition 3 in storage of the image data.
Figure 55:
Figure 55:
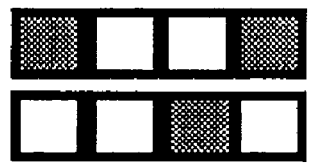
Figure 55:
Figure 55:
Figure 55:

The judgment under the judging condition 2 in step S86 is effected following the steps 1 to 3 as schematically illustrated in FIG. 55.

Step 1: Distribution of reference data is bisected and divisions are positioned vertically.

Step 2: Reference data in vertical line are measured.

Step 3: It is judged based on the result of measurement whether the number of existent reference data is one or less.

If the result of the judgment in step S86 is affirmative (YES), the third storage rule is adopted (in step S87) and data are stored according to the storage pattern C (in step S89).

If the result of the judgment in step S86 is negative (NO), a fourth storage rule is adopted (in step S88) and data are stored according to a storage pattern D (in step S89).

Figure 56:
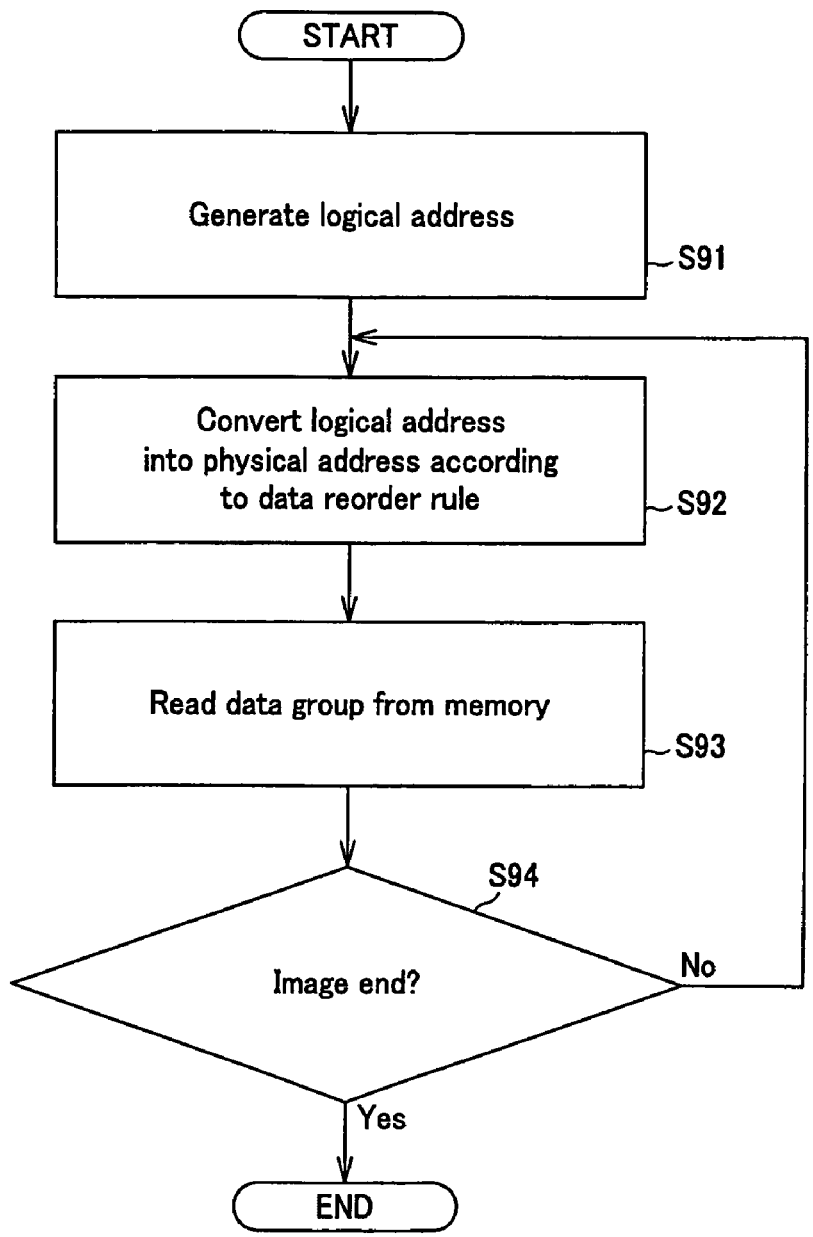
FIG. 56 shows a flow of operations made in reading image data from the memory in the data storage unit.

Image data are read from the semiconductor memory 310 in the data storage unit 300 as will be described below with reference to the flow diagram in FIG. 56.

The address generator 330 generates a logical address (address in an image) (in step S91), and the memory controller 320 converts the logical address into a physical address (address in memory) according to the data reorder rule (in step S92), reads a group of data from the semiconductor memory 310 (in step S93) and judges whether all data down to the end of an image has been read (in step S94). If the result of the judgment in step S94 is negative (NO), namely, if there remains data yet to be read, the memory controller 320 controls the address generator 330 to generate a next logical address (in step S95) and returns to step S91 where it will repeat data reading until the result of the judgment in step S94 is affirmative (YES). Then, the memory controller 320 will exit the data reading process.

The aforementioned judging conditions can be rewritten mathematically as follows. It is assumed here that relative positions of the reference data in the reference area are A1, A2, . . . , A8.

Judging condition 1:
Relative positions of reference data are all even or odd numbers.
The judging condition 1 may be defined as requiring that the remainder (Ai mod 2) of division, by two, of the relative position should all be 0 or 1.

Judging condition 2:
Division, by four, of the relative position of all reference data results in two successive remainders (Ai mod 4). More particularly, the judging condition 2 is such that the remainders should be 0 and 1, 1 and 2, 2 and 3 or 3 and 0.

Judging condition 3:
Remainder (Ai mod m) of division of the relative position of reference data by the number m of banks varies from one to another of all the reference data.

Note that the number of banks may be a half size of the judgment area and the necessary number of memory banks is m=Rx/2 where Rx is the size of the judgment area.

In the foregoing, the method of storing one-dimensionally arrayed data to be read simultaneously has been explained. Next, there will be explained the method of storing two-dimensionally arrayed data to be read simultaneously.

FIGS. 57A to 57C schematically illustrate the method of storing two-dimensionally arrayed data.

Two-dimensionally arrayed image data ID shown in FIG. 57A is divided into vertical stripe-like groups as shown in FIG. 57B, and data groups on one stripe are stored onto one word line in a memory bank as shown in FIG. 57C. By selecting a memory bank for each stripe-like data group according to the distribution of reference data at this time, it is possible to read two-dimensionally arrayed data simultaneously.

A rule under which there is selected a memory bank in which data is to be stored will be explained below with reference to FIGS. 58A to 58C.

Figure 58A:
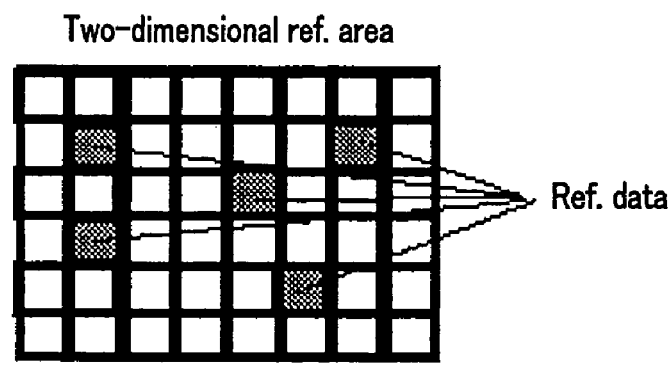
FIGS. 58A to 58C explain together a rule under which destination memory banks are selected for each data storage.
Figure 58B:
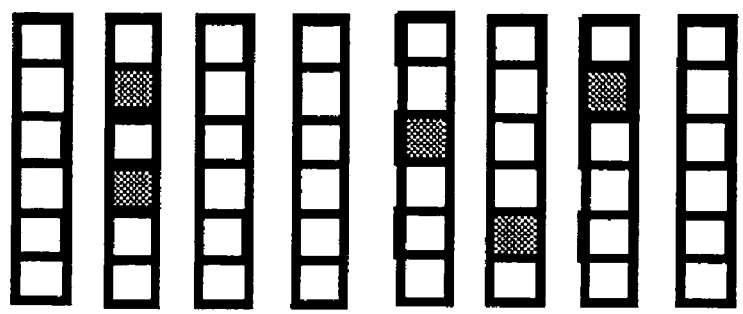
Figure 58C:

FIG. 58A shows a two-dimensional reference area and reference data distribution in the reference area by way of example. It is assumed as in FIG. 57 that the reference data is divided into vertical stripes as shown in FIG. 58B. The stripe is vertically compressed as shown in FIG. 58C. If even one reference data exists in the stripe, a flag is set, which means that the data can be stored as in the method of storing one-dimensionally arrayed data.

That is, the rule under which there is selected a memory bank in which data is to be stored is the same as that having been described as to the one-dimensionally arrayed data. Such selection of a memory bank will permit a desired data read even in case the reference area shifts vertically.

Next, common examples of the judging conditions will be explained.

On the assumption that the size of the reference area is Rx, number of memory banks is m and number of reference data is n, the target is m=Rx/2 and the size of the reference area and storage patterns on that assumption will be as shown in Table 2. The number p of available storage patterns is p=log 2Rx (antilogarithm of Rx whose base is 2).

TABLE 2

| Size of ref. area | No. of memory banks | Judging con-dition | Storage pattern | No. of stripes |
|---|---|---|---|---|
| 2 | 1 | 1 | A::00 . . . | 1 |
| 4 | 2 | 1 | A::0011 . . . | 2 |
|  |  | 2 | B: 0101 . . . |  |
| 8 | 4 | 1 | A: 00112233 . . . | 3 |
|  |  | 2 | B: 01012323 . . . |  |
|  |  | 3 | C: 01230123 . . . |  |
| 16 | 8 | 1 | A: 0011223344556677 . . . | 4 |
|  |  | 2 | B: 0101232345456767 . . . |  |
|  |  | 3 | C::0123012345674567 . . . |  |
|  |  | 4 | D: 0123456701234567 . . . |  |
| 32 | 16 | 1 | A: 00112233445566778899aabbccddeeff . . . | 5 |
|  |  | 2 | B: 0101232345456767 89ab89ababcdefcdef . . . |  |
|  |  | 3 | C: 012301234567456789ab89adcdefcdef . . . |  |
|  |  | 4 | D: 0122456701234567 89abcdef89abcdef . . . |  |
|  |  | 5 | E: 0123456789abcdef0123456789abcdef . . . |  |

Therefore, the judging conditions will be as follows:

Judging condition 1:
Relative positions of reference data should be all even or odd numbers (alternatively, remainder (Ai mod 2) of division, by two, of the relative position is all 0 or 1).

Judging condition 2:
Division, by four, of the relative position of all reference data should result in two successive remainders (Ai mod 4). More particularly, the remainders are 0 and 1, 1 and 2, 2 and 3 or 3 and 0.

Judging condition 3:
Division, by eight, of the relative positions of all reference data should result in three successive remainders (Ai mod 8).

Judging condition p:
The similar operation should continuously be done until the divisor is n/2, and division of the relative position of "reference data" by the number m of banks should result in a remainder (Ai mod m) which varies from one to another of all the reference data.

Under a judging condition that the number of data read simultaneously when storing all data into a memory consisting of a plurality of banks should be n and division, by 2x (x is a positive integer) smaller than n/2, of the relative position of data to be read simultaneously should result in successive (x−1) remainders, a storage pattern is determined and the data to be read simultaneously are stored into different banks by changing the sequence of storage into each bank of the memory in a storage pattern corresponding to the distribution of the data to be read simultaneously, thereby permitting to simultaneously read a plurality of desired data.

For this method of data storage, it can be mathematically proved that the maximum number n' of reference data of which simultaneous reading is enabled by reordering the data is n'=log 2m. When n' is smaller than log 2m, a data reorder rule is available for whatever pattern and also a method of data storage permitting simultaneous data reading is also available. When n' exceeds log 2m, there is available a method of data storage permitting simultaneous data reading, which depends upon the distribution of the reference data. However, such a method is not always available.

In the foregoing, the present invention has been illustrated and described concerning the detection of a character or pattern from image data. Apparently, the similar concept is applicable to any other field. For example, the present invention is also applicable to detection of a motion vector. Namely, the present invention can be applied to selection of an optimum one of candidate vectors for each of pixels. Also, the data handled in the present invention is not limited to image data but may be audio data.

The present application contains subject matters related to the Japanese Patent Application No. 2004-000571 and No. 2004-000572, both filed in Japanese Patent Office on Jan. 5, 2004 and Japanese Patent Application No. 2004-073407, filed in Japanese Patent Office on Mar. 15, 2004, the entire contents of which are incorporated by reference herein.

What we claim is:

1. A data storage apparatus comprising:
a memory including a plurality of addressable memory banks;
a data storage control unit sequentially storing input data among the memory banks;
an input for an access pattern representing a pattern of stored data to be read simultaneously from said memory;
a judging means judging whether the input data are to be stored at memory locations corresponding to the access pattern; and
a memory controlling means storing said input data in different memory banks at the locations corresponding to the access pattern, said memory controlling means incrementing the memory bank address to skip a memory bank for said input data when it is judged that said input data are to be stored at the locations corresponding to the access pattern and will be read simultaneously, said memory controlling means storing said input data at the locations in the memory bank whose bank address is incremented and that correspond to said access pattern, said memory controlling means including relocating means that (a) reads the data from said memory simultaneously from a plurality of first addresses represented by the access pattern, (b) restores, by incrementing the bank address, said read data at second addresses where the read data have not been stored, and (c) re-stores said read data at said second addresses, wherein the data is pixel data and wherein the memory controlling means includes relocating means relocating data stored in a previous storage location to a destination storage location,
a storage location has an address B,I,J represented by a bank address b, a word line address i, and a bit line address j in which
B=(d+b−1) mod n
I=i
J=j
where d is a pixel interval from a previous storage location to a destination storage location for given pixel data and n is the number of memory banks; and
the memory controlling means re-stores the data at each storage location in each memory bank to a respective destination storage location represented by a destination address B,I,J, where B is the destination bank address, I is the destination word line address, and J is the destination bit line address, in which the destination bit line address J is J=j−1 when B−b>0 and the destination word line I is I=i−1 when the bit line address sequences to a final bit line address and the destination word line address I is I=i when the bit line address is not the final bit line address.

2. A data storage controller which stores data in a memory of the type including a plurality of addressable memory banks in which input data elements are stored sequentially among the memory banks and from which a plurality of data elements are read simultaneously based on an access pattern representing a pattern of stored data, the apparatus comprising:
a judging means judging whether the input data elements are to be stored at memory locations corresponding to the access pattern; and
a memory controlling means storing said input data elements in different memory banks at the locations corresponding to the access pattern, said memory controlling means incrementing the memory bank address to skip a memory bank for said input data elements when it is judged that said input data elements are to be stored at the locations corresponding to the access pattern and will be read simultaneously, said memory controlling means storing said input data elements at the locations in the memory bank whose bank address is incremented and that correspond to said access pattern, and said memory controlling means including relocating means that (a) reads the data from said memory simultaneously from a plurality of first addresses represented by the access pattern, (b) restores, by incrementing the bank address, said read data at second addresses where the read data have not been stored, and (c) re-stores said read data at said second addresses, wherein the data is pixel data and wherein the memory controlling means includes relocating means relocating data stored in a previous storage location to a destination storage location, a storage location has an address B,I,J represented by a bank address b, a word line address i, and a bit line address j in which B=(d+b−1) mod n I=i J=j where d is a pixel interval from a previous storage location to a destination storage location for given pixel data and n is the number of memory banks; and the memory controlling means re-stores the data at each storage location in each memory bank to a respective destination storage location represented by a destination address B,I,J, where B is the destination bank address, I is the destination word line address, and J is the destination bit line address, in which the destination bit line address J is J=j−1 when B−b>0 and the destination word line I is I=i−1 when the bit line address sequences to a final bit line address and the destination word line address I is I=i when the bit line address is not the final bit line address.

3. A data storage controlling method in which data are stored in a memory of the type including a plurality of addressable memory banks in which input data are stored sequentially among the memory banks and from which a plurality of data are read simultaneously based on an access pattern representing a pattern of stored data, the method comprising the steps of:

judging whether the input data are to be stored at memory locations corresponding to the access pattern;

storing said input data in different memory banks at the locations corresponding to the access pattern by incrementing the memory bank address to skip a memory bank for said input data when it is judged that said input data are to be stored at the locations corresponding to the access pattern and will be read simultaneously, and storing said input data at the locations in the memory bank whose bank address is incremented and that correspond to said access pattern;

reading the data from said memory simultaneously from a plurality of first addresses represented by the access pattern;

restoring, by incrementing the bank address, said read data at second addresses where the read data have not been stored; and re-storing said read data at said second addresses, wherein the data is pixel data and wherein the storing step includes relocating data stored in a previous storage location to a destination storage location, a storage location has an address B,I,J represented by a bank address b, a word line address i, and a bit Line address j in which B=(d+b−1) mod n I=i J=j where d is a pixel interval from a previous storage location to a destination storage location for given pixel data and n is the number of memory banks; and the read data is restored at each storage location in each memory bank to a respective destination storage location represented by a destination address B,I,J, where B is the destination bank address, I is the destination word line address, and J is the destination bit line address, in which the destination bit line address J is J=j−1 when B=b>0 and the destination word line I is I=i−1 when the bit line address sequences to a final bit line address and the destination word line address I is I=i when the bit line address is not the final bit line address.

4. A computer-readable medium encoded with a program executable by a computer to store data in a memory of the type including a plurality of addressable memory banks in which input data are stored sequentially among the memory banks and from which a plurality of data are read simultaneously based on an access pattern representing a pattern of stored data, the program comprising the steps of:

judging whether the input data are to be stored at memory locations corresponding to the access pattern;

storing said input data in different memory banks at the locations corresponding to the access pattern by incrementing the memory bank address to skip a memory bank for said input data when it is judged that said input data are to be stored at the locations corresponding to the access pattern and will be read simultaneously, and storing said input data at the locations in the memory bank whose bank address is incremented and that correspond to said access pattern;

reading the data from said memory simultaneously from a plurality of first addresses represented by the access pattern;

restoring, by incrementing the bank address, said read data at second addresses where the read data have not been stored; and re-storing said read data at said second addresses, wherein the data is pixel data and wherein the storing step includes relocating data stored in a previous storage location to a destination storage location, a storage location has an address B,I,J represented by a bank address b, a word line address i, and a bit line address j in which B=(d+b−1) mod n I=i J=j where d is a pixel interval from a previous storage location to a destination storage location for given pixel data and n is the number of memory banks; and the read data is restored at each storage location in each memory bank to a respective destination storage location represented by a destination address B,I,J, where B is the destination bank address, I is the destination word line address, and J is the destination bit line address, in which the destination bit line address J is J=j−1 when B−b>0 and the destination word line I is I=i−1 when the bit line address sequences to a final bit line address and the destination word line address I is I=i when the bit line address is not the final bit line address.

5. A data storage apparatus comprising:

a memory including a plurality of addressable memory banks;

a data storage control unit sequentially storing input data among the memory banks;

an input for an access pattern representing a pattern of stored data to be read simultaneously from said memory;

a judging unit judges whether the input data are to be stored at memory locations corresponding to the access pattern; and a memory controlling unit stores said input data in different memory banks at the locations corresponding to the access pattern, said memory controlling unit incrementing the memory bank address to skip a memory bank for said input data when it is judged that said input data are to be stored at the locations corresponding to the access pattern and will be read simultaneously from addressable locations that do not support simultaneous reading, said memory controlling unit stores said input data at the locations in the memory bank whose bank address is incremented and that correspond to said access pattern said memory controlling unit including a relocating unit that (a) reads the data from said memory simultaneously from a plurality of first addresses represented by the access pattern, (b) restores, by incrementing the bank address, said read data at second addresses where the read data have not been stored, and (c) re-stores said read data at said second addresses, wherein the data is pixel data and wherein the memory controlling means includes relocating means relocating data stored in a previous storage location to a destination storage location, a storage location has an address B,I,J represented by a bank address b, a word line address i, and a bit line address j in which B=(d+b−1) mod n
I=i
J=j where d is a pixel interval from a previous storage location to a destination storage location for given pixel data and n is the number of memory banks; and the memory controlling means re-stores the data at each storage location in each memory bank to a respective destination storage location represented by a destination address B,I,J, where B is the destination bank address, I is the destination word line address, and J is the destination bit line address, in which the destination bit line address J is J=j−1 when B−b>0 and the destination word line I is I=i−1 when the bit line address sequences to a final bit line address and the destination word line address I is I=i when the bit line address is not the final bit line address.

* * * * *